United States Patent [19]

Todokoro et al.

[11] Patent Number: 5,594,245
[45] Date of Patent: Jan. 14, 1997

[54] SCANNING ELECTRON MICROSCOPE AND METHOD FOR DIMENSION MEASURING BY USING THE SAME

[75] Inventors: Hideo Todokoro, Tokyo; Kenji Takamoto, Ome; Tadashi Otaka, Katsuta; Fumio Mizuno, Tokorozawa; Satoru Yamada, Ome; Sadao Terakado, Katsuta; Katsuhiro Kuroda, Hachioji; Ken Ninomiya, Higashimatsuyama; Tokuo Kure, Tokyo, all of Japan

[73] Assignee: Hitachi, Ltd., Tokyo, Japan

[21] Appl. No.: 386,766

[22] Filed: Feb. 10, 1995

Related U.S. Application Data

[63] Continuation-in-part of Ser. No. 160,336, Dec. 2, 1993, Pat. No. 5,412,210, which is a continuation-in-part of Ser. No. 39,705, Mar. 29, 1993, abandoned, which is a continuation-in-part of Ser. No. 773,729, Oct. 9, 1991, abandoned.

[30] Foreign Application Priority Data

Oct. 12, 1990 [JP] Japan ................................ 2-272258
Apr. 10, 1992 [JP] Japan ................................ 4-089189
Dec. 2, 1992 [JP] Japan ................................ 4-323128

[51] Int. Cl.⁶ .......................................... H01J 37/26
[52] U.S. Cl. ............................... 250/310; 250/307
[58] Field of Search ............................. 250/310, 307

[56] References Cited

U.S. PATENT DOCUMENTS

| | | | |
|---|---|---|---|
| Re. 27,005 | 12/1970 | Wingfield et al. | 250/307 |
| 3,614,311 | 10/1971 | Fujiyasu et al. | 250/310 |
| 3,714,424 | 1/1973 | Weber | 250/399 |
| 4,426,577 | 1/1984 | Koike et al. | 250/310 |
| 4,658,137 | 4/1987 | Garth et al. | 250/310 |
| 4,733,074 | 3/1988 | Kato et al. | 250/310 |
| 5,001,350 | 3/1991 | Ohi et al. | 250/440.11 |
| 5,412,210 | 5/1995 | Todokoro et al. | 250/310 |

FOREIGN PATENT DOCUMENTS

| | | |
|---|---|---|
| 62-97246 | 5/1987 | Japan. |
| 6448470 | 2/1989 | Japan. |
| 2050689 | 1/1981 | United Kingdom. |

OTHER PUBLICATIONS

"Basis and Application of an SEM", *Japanese Society of Electron Microscopy*, Dec. 1, 1983.

Katz et al, "Range–Energy Relations for Electrons and the Determination of Beta–Ray End–Point Energies by Absorption", *Reviews of Modern Physics*, vol. 24, No. 1, Jan. 1952, pp. 28–44.

*Primary Examiner*—Jack I. Berman
*Attorney, Agent, or Firm*—Fay, Sharpe, Beall, Fagan, Minnich & McKee

[57] ABSTRACT

An electron beam, which can transmit through part of a specimen and can reach a portion that is not exposed to the electron beam, is irradiated, and a scanning image is obtained on the basis of a signal secondarily generated from a portion irradiated with the electron beam. Dimension-measuring start and end points are set on the scanning image and a dimension therebetween is measured. A three-dimensional model is assumed, the three-dimensional model is modified so as to match the scanning image, and dimension measurement is carried out on the basis of a modified three-dimensional model.

20 Claims, 47 Drawing Sheets

ENERGY OF SCANNING ELECTRON BEAM

FIG. 6

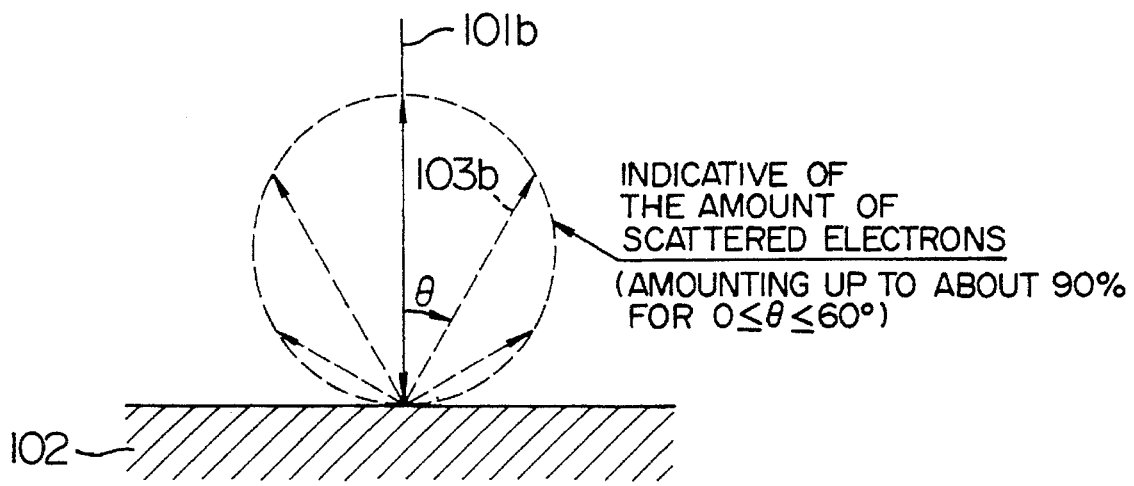

INDICATIVE OF THE AMOUNT OF SCATTERED ELECTRONS (AMOUNTING UP TO ABOUT 90% FOR $0 \leq \theta \leq 60°$)

FIG. 7

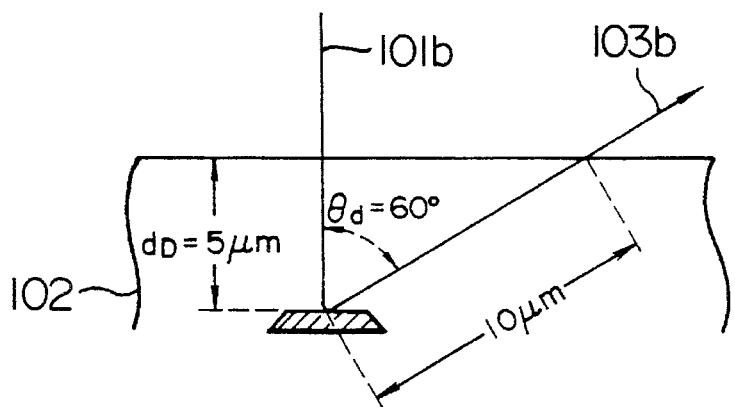

$d_D$ : AVERAGE DEPTH AT WHICH A DEVICE STRUCTURE IS FORMED IN A SEMICONDUCTOR DEVICE $\theta_d$ : THE RANGE OF SCATTERING ANGLE OF SCATTERED ELECTRONS CONTRIBUTING TO IMAGE SIGNAL THE RANGE OF SCANNING ELECTRON BEAM 1b NECESSARY TO ALLOW SCATTERED ELECTRONS 3b TO ESCAPE FROM SPECIMEN 2
= 5 μm + 10 μm = 15 μm 102a : SPECIMEN OF DIFFERENT MATERIAL 102b : SPECIMEN OF DIFFERENT MATERIAL 102c : DEPOSITED FOREIGN MATTER D, E : SHADOWED PORTIONS WHICH CANNOT BE OBSERVED WITH THE CONVENTIONAL SCANNING ELECTRON MICROSCOPE CAN BE OBSERVED AS SPECIMEN IMAGES FIG. 29
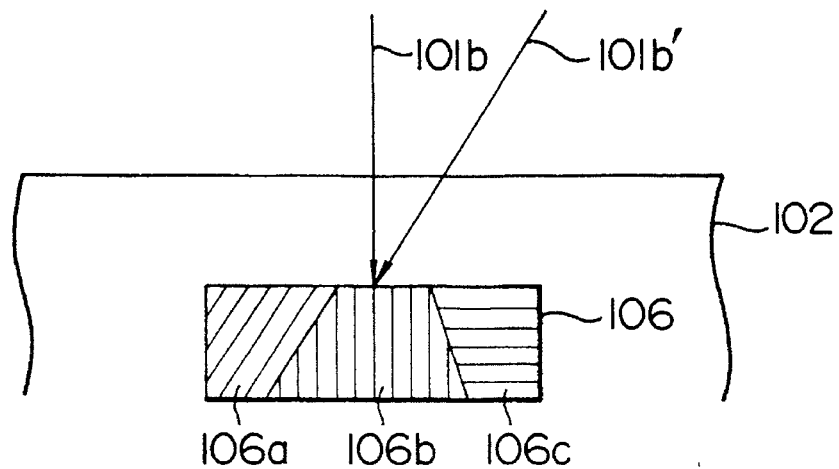
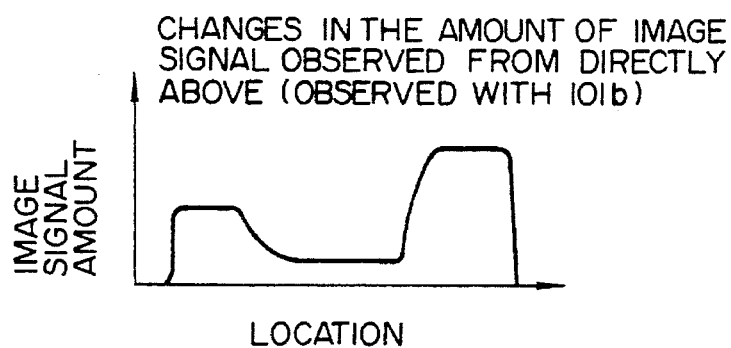
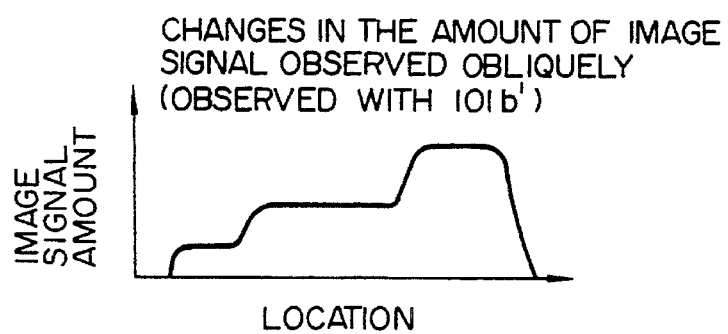

SPECIMEN IMAGE OBTAINED WITH THE PRIOR ART

SPECIMEN IMAGE OBTAINED WITH THE PRESENT INVENTION

SPECIMEN IMAGE OBTAINED WITH THE PRIOR ART

SPECIMEN IMAGE OBTAINED WITH THE PRESENT INVENTION

F I G. 45A
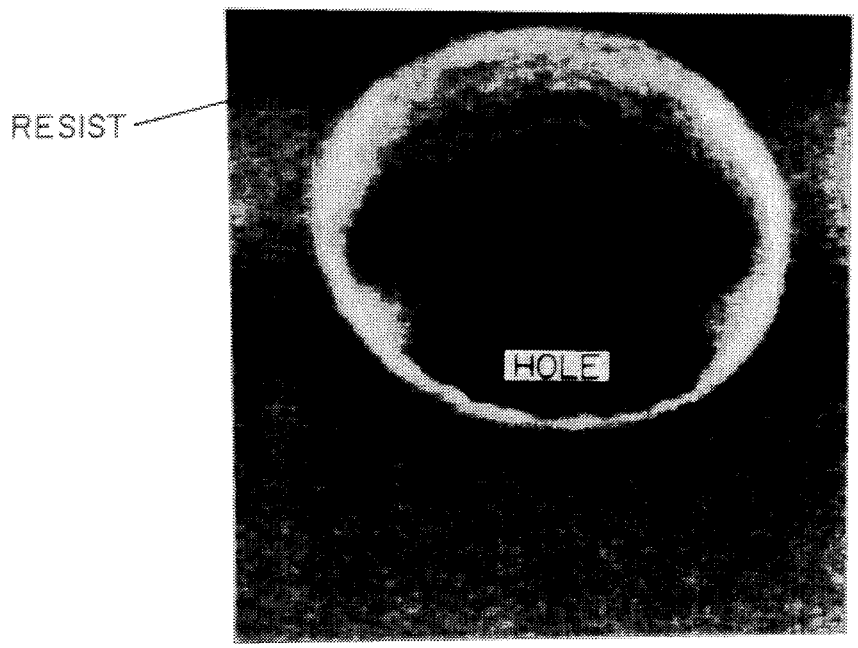
F I G. 45B
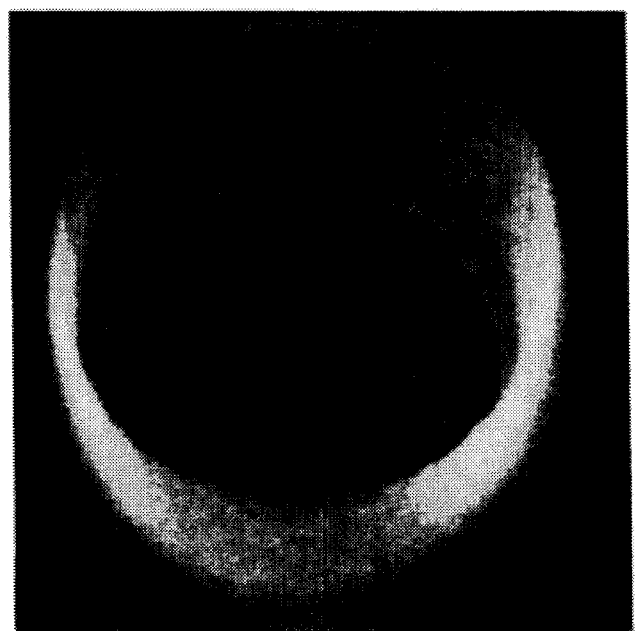

SPECIMEN IMAGE OBTAINED WITH THE PRIOR ART

UPPER-LAYER WIRING

SPECIMEN IMAGE OBTAINED WITH THE PRESENT INVENTION

UNDERSURFACE WIRING

A: UNDERSURFACE WIRING

F I G. 48
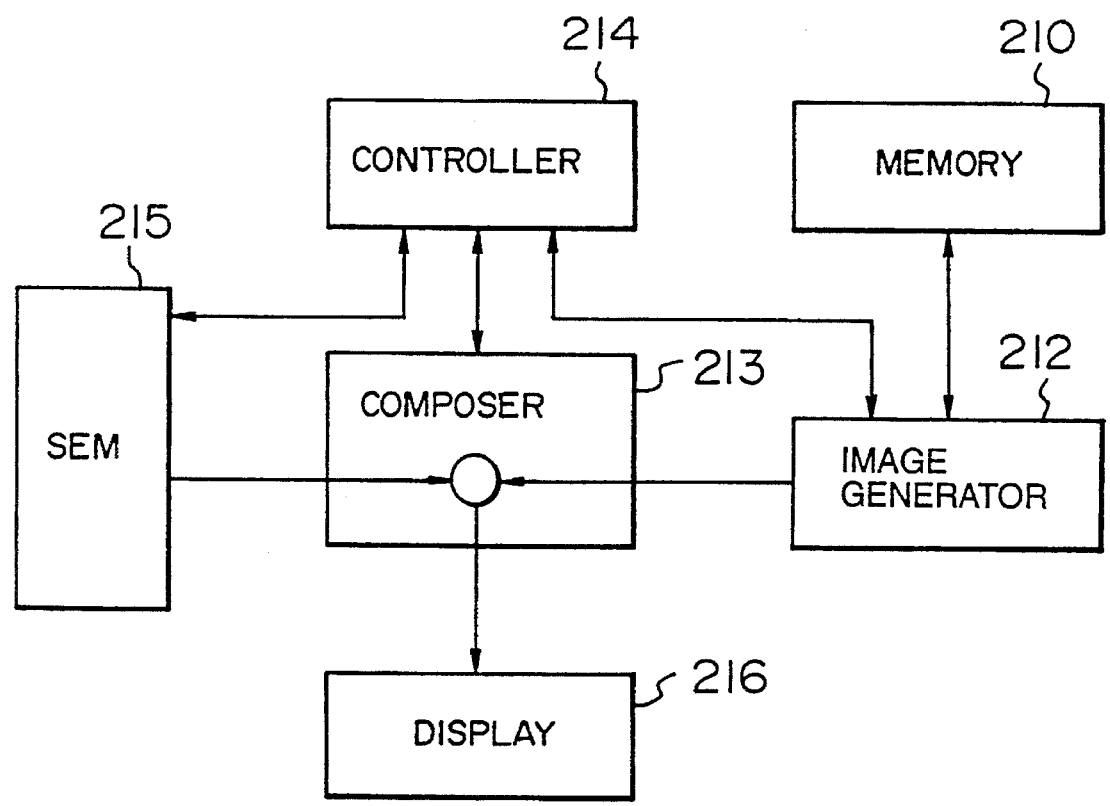

0.5 μm    T = 15°

F I G. 59A
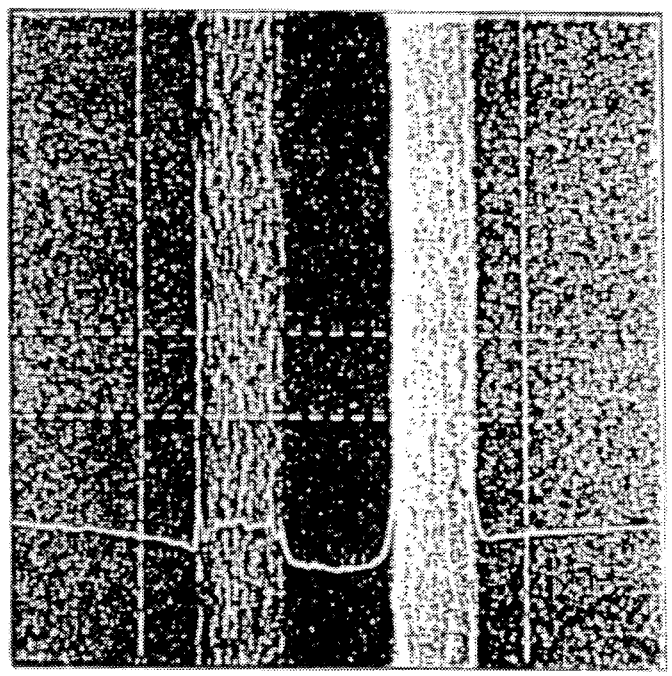

SCANNING ELECTRON MICROSCOPE AND METHOD FOR DIMENSION MEASURING BY USING THE SAME

This application is a continuation-in-part of application Ser. No. 08/160,336, filed Dec. 2, 1993, now U.S. Pat. No. 5,412,210 which is a continuation-in-part of application Ser. No. 08/039,705, filed Mar. 29, 1993, now abandoned, which is a continuation-in-part of Ser. No. 07/773,729, filed Oct. 9, 1991, now abandoned.

BACKGROUND OF THE INVENTION

The present invention relates to an apparatus and a method of observing surface configurations by using an electron beam, and especially provides an apparatus and a method by which observation of either configurations of the bottom of a deep hole or residues therein, used frequently in semiconductor processes, can be permitted.

The scanning electron microscope, in which an electron beam is scanned on a specimen and secondary electrons generated from the specimen are detected, has been utilized widely in the fields of biology and engineering. Especially, in the semiconductor industry, high-integration formation has advanced and as a result, inspection based on optical microscopes has become impossible, and the utilization of the scanning electron microscope has been promoted. In a scanning electron microscope used for semiconductors, it is conventional to use an electron beam of low energy of 1 keV or less in order to avoid charging on insulators.

In the semiconductor industry, the scanning electron microscope is utilized for not only inspection of appearance of completed semiconductors but also inspection in mid-course of the manufacturing process. For example, it is used for inspection of appearance, inspection of dimension and inspection of through-holes in mid-course of the process.

As a result of the advancement of high-integration formation of semiconductor devices, it has become impossible for the method using the conventional scanning electron microscope to inspect openings of through-holes.

Referring to FIG. 2, problems encountered in observing a deep hole with the conventional scanning electron microscope will be described. FIG. 2 shows a case where a primary electron beam 1 of low energy irradiates a flat portion and a hole 3 of a specimen. Thanks to the absence of any obstacles, almost all of the number of secondary electrons 2 generated at the flat portion can be detected. Similarly, reflection electrons concurrently discharged can also be detected. In the case of irradiation of the hole 3, however, generated secondary electrons 2 impinge on the side wall of the hole 3 and consequently cannot escape from the hole 3 to the outside. The energy of reflection electrons is higher than that of secondary electrons but is not so high that the reflection electrons can penetrate through the side wall, and the reflection electrons are thus blocked by the side wall.

The present invention is further concerned with a method for displaying a scanning image of a specimen and an apparatus therefor. Examples of such specimens are devices and parts as represented by a semiconductor device, a photomask substrate inclusive of a multi-layer structure mask such as a phase shift mask, a display device such as a liquid crystal device or a CCD, a wiring board, a memory medium such as an optical disc, metal or polymer materials, cellular tissues and other living bodies.

Additionally, both intermediate products and finished goods are considered specimens for the purposes of the invention. The present invention handles these objects and is effective for use in observation, inspection, measurement and analysis of them or in monitoring techniques during treatment of specimens.

By way of example, in the field of observation of a fine structure of a specimen, of a scanning microscope using an electron beam having an energy level of several hundreds of eV to several tens of keV, and a transmission-type electron microscope using an electron beam of several tens of keV to several MeV, have been used for imaging a specimen and displaying the image on a specimen image display apparatus. Specimen image display techniques using the above electron microscope techniques are described in the literature; see, for example, "Fundamentals and Applications of Scanning Electron Microscope", originally edited and twice published by Kyohritsu Shuppan Kabushiki-Kaisha, May 25, 1985.

Disadvantageously, however, the conventional techniques described above have encountered difficulties in performing high-resolution or non-destructive observation of a surface structure having large unevenness or precipitous unevenness, and of an internal structure of a specimen.

SUMMARY OF THE INVENTION

FIG. 3 shows results of calculating the relationship between the aspect ratio (depth/opening diameter) of a hole and the ratio of signals escaping from the hole. A signal at the surface (aspect ratio=0) corresponds to 1. This calculation demonstrates that observation of holes of an aspect ratio exceeding 2 is impossible with the conventional scanning electron microscope.

In the present invention, in order to solve the aforementioned problems, a primary electron beam is used which has such high energy as to allow reflection electrons generated at the bottom of a hole to penetrate through the side wall of the hole.

Referring to FIG. 1, the principle of observation of deep holes by using a primary electron beam of high energy will be described.

A case where a primary electron beam 4 of high energy irradiates a surface portion resembles a case where the surface portion is irradiated with low energy. However, in the case of irradiation on the interior of a hole, the circumstances differ greatly. Secondary electrons 2 are absorbed by the side wall but reflection electrons 6 penetrate through the side wall to escape from the surface. When the reflection electrons 6 pass through the surface, they generate secondary electrons 5. Since the secondary electrons 5 and reflection electrons 6 have more information about the bottom of the hole 3, an image of the interior of the hole can be obtained by detecting these electrons.

Thus, one of the aspects of the present invention resides in that the primary electron beam has sufficiently high energy to allow reflection electrons to penetrate through the side wall, thereby permitting observation of the bottom of high-aspect-ratio holes, which observation has hitherto been impossible. The primary electron beam penetrates an insulating layer ($\leq 2$ μm thickness) of a semiconductor device when it has energy sufficient for the reflection electrons to penetrate through the side wall. This results in allowing electrons in the insulating layer to move, i.e. the layer becomes conductive so that the layer is not subject to charging. Further, when the primary electron beam has an energy level as defined by the present invention, the beam itself does not cause the insulating layer of the semiconductor device to become charged.

Another object of the invention is to provide a scanned specimen image displaying technique capable of performing non-destructive observation of an internal structure of a specimen, and of a specific structure of a defect, foreign material or the like.

Still another object of the invention is to provide a scanned specimen image displaying technique capable of performing high-resolution observation of a surface structure having large unevenness or precipitous unevenness, and an internal structure of a specimen.

Still another object of the invention is to provide a scanned specimen image displaying technique capable of obtaining three-dimensional information and tomographic information about surface and internal structures of a specimen.

Still another object of the invention is to provide a scanned specimen image displaying technique capable of performing high-resolution observation of an electrically non-conductive specimen.

Still another object of the invention is to provide a specimen whose surface and internal structures can be observed more effectively under the irradiation of a high-energy particle beam.

The above and other objects and novel features of the invention will become apparent from the description contained in the present specification and from the accompanying drawings.

Typical forms of the invention to be disclosed in the present application will be outlined briefly as below.

More particularly, in the present invention, a scanning particle beam is irradiated to a specimen to act on the specimen so as to produce primary information such as back-scattered particles, X-rays and photons, and the primary information also interacts with the specimen to produce secondary information, such as secondary electrons and photons, which is used as a main signal for formation of an image.

In a particular embodiment, an electron beam having an energy level of 50 keV or more is used as the scanning particle beam, and secondary electrons or electromagnetic waves resulting from interaction of reflection electrons, generated under the irradiation of the electron beam, with the specimen are detected as the secondary information to construct a scanned specimen image.

In another embodiment, at least one of tomographic and three-dimensional images is formed on the basis of a plurality of specimen images observed with two or more particle beams which are different from each other in at least one of incident energy and angle.

When a part standing for a target or object to be observed, that is, a test part, is inside a specimen, a scanning particle beam must have an energy which satisfies the following requirements: the scanning particle beam must be able to transmit or penetrate through the specimen to reach the test part, and the scanning particle beam must interact with the test part to generate primary information such as back-scattered particles. The primary information itself must have sufficient energy to also interact with the specimen so as to generate secondary information such as secondary electrons.

The energy required for the scanning particle beam, that is, the primary beam, is determined by taking into consideration the degree of back scattering and forward scattering of a part of the specimen present on a path of the beam (i.e., a part overlying the test part). The degree of scattering depends on well known parameters (density, thickness and the like of that part).

In back scattering, it is preferable that the test part have a large contrast to its surroundings, and especially to the beam passage part overlying the test part. In order to establish contrast in back scattering between the two parts, they are made to be different from each other in density and/or crystalline structure. As an alternative, contrast can also be set up between them by featuring, for example, by roughening the surface of the test part irradiated with the primary beam.

The test part observation method can be applied to a measurement process for a semiconductor device including at least one of the following steps:

a first step is for reading identification information of a specimen and setting corresponding working command, working conditions and working data on the basis of the read identification information;

a second step is for automatically prosecuting designated location, designated time and a designated operation for a designated specimen on the basis of designated working command, working conditions and working data;

a third step is for displaying a plurality of images such as a specimen image and a three-dimensional configuration simultaneously;

a fourth step is for performing transfer and input/output of information, such as working command, working conditions, working data, detected image data and measured data, on line between the apparatus and external units;

a fifth step is for performing alignment and/or positioning between a particle beam and the specimen;

a sixth step is for measuring the size and/or position coordinates of a pattern formed at least on the specimen surface or inside the specimen;

a seventh step is for automatically measuring one or more patterns inside the designated specimen;

an eighth step is for performing retrieval between a measured value of one or more patterns inside the designated specimen and a preset desirable standard value to decide whether the pattern is acceptable or unacceptable, and for processing the specimen on the basis of the result of the decision in accordance with a preset procedure;

a ninth step is for measuring the kind, number and size of a specimen structure such as a particle or a domain which exists on the specimen surface and/or inside the specimen;

a tenth step is for determining the results of the statistical treatment of measured values in step 7 and displaying, storing or delivering the results as necessary;

an eleventh step is for changing the irradiation direction and/or the irradiation angle of the particle beam relative to the specimen;

a twelfth step is for performing at least one of display, storage and delivery of three-dimensional information on the basis of a plurality of specimen images which are observed at two or more designated irradiation angles;

a thirteenth step is for performing at least one of the change of irradiation energy of the particle beam, particle adjustment such as focusing needed upon the change of irradiation energy and insuring of the same field of view upon the change of irradiation energy;

a fourteenth step is for constructing a tomographic image and/or a three-dimensional image on the basis of a plurality of specimen images observed with two or more particle beams having at least one of designated incident energy level and incident angle and performing at least one of display, storage and delivery of the tomographic image and/or three-dimensional image;

a fifteenth step is for applying at least one of a single or a plurality of voltages, currents and electrical signals to the specimen;

a sixteenth step is for performing, for the designated specimen, at least one of the operations of applying a predetermined voltage and/or current and/or electrical signal, fetching a specimen image of a designated area at a designated time point, comparing a specimen image of the designated area fetched presently with a specimen image of the designated area fetched previously to detect a change, fetching lapse data of a designated parameter of the specimen at a designated time point, and performing display and/or storage and/or delivery of the image data and/or lapse data;

a seventeenth step is for setting a desired temperature of the specimen;

an eighteenth step is for performing, for the designated specimen, at least one of the operations of heating the specimen to a predetermined temperature, fetching a specimen image of a designated area at a designated time point, comparing a specimen image of the designated area fetched presently with a specimen image of the designated area fetched previously to detect a change, fetching lapse data of a designated parameter of the specimen at a designated time point, and performing display and/or storage and/or delivery of the image data and/or lapse data;

a nineteenth step is for performing, for the designated specimen, at least one of the operations of fetching a specimen image of a designated area and comparing it with a previously designated storage image, extracting a difference between the specimen image and the storage image, detecting position coordinates of a differing part inside the specimen, and performing display and/or storage and/or delivery of an image of the differing part and position coordinate data;

a twentieth step is for performing, for the designated specimen, etching and/or film deposition at a designated single part or a plurality of designated parts inside the specimen;

a twenty-first step is for analyzing, for the designated specimen, analyzing a designated single part or a plurality of designated 1° parts inside the specimen; and a twenty-second step is for annealing the specimen after it is observed under the irradiation of the particle beam.

The present invention described thus far has been achieved on the basis of the following novel knowledge acquired by the present inventors.

The present inventors have found that phenomena as below take place in observation of such a specimen as a semiconductor device conducted using, as a particle beam, a high-energy scanning electron beam of 50 keV or more:

(1) Non-destructive observation of the internal structure of a specimen can be permitted.

Generally, a transmission-type electron microscope is used to observe, for example, the internal structure of a specimen. For observation with the transmission-type electron microscope, the specimen must take the form of a thin film, and there results destructive observation of the specimen.

(2) High-resolution observation of an electrically non-conductive specimen can be ensured without impairing freshness of the specimen.

A scanning electron microscope is used to carry out, for example, high-resolution observation of a specimen configuration. In the case of observation of the electrically non-conductive material with the scanning electron microscope, for the sake of preventing degradation of image quality due to charge up, a method is adopted wherein gold or carbon is vapor-deposited on the specimen surface to permit surface leakage of accumulated charge, or a low-energy electron beam of about 1 keV is used to increase the secondary electron emission amount so as to decrease the charge-up amount.

The vapor-deposition of a conductive film leads to destructive observation which impairs the original physical property of the specimen, and the observation with the low-energy electron beam suffers from low resolution.

As a result of analysis of these phenomena, it has been found that the internal structure can be observed by the present invention in accordance with the mechanism described below with reference to FIG. 4.

Generally, in a scanning electron microscope, a scanning electron beam 101a with an energy ranging from about several hundreds of eV to 30 keV is irradiated to a specimen 102 and, as a result of interaction of the electron beam 101a with the specimen 102, primary information (reflection electrons 103a, secondary electrons 105a and an electromagnetic wave 104a representative of X-rays and photons) is generated, of which the secondary electrons 105a are mainly used as an image signal to display a specimen image. Of course, X-rays, photons, absorbed electrons or transmitted electrons may be used as an image signal.

On the other hand, in the case of a high-energy scanning electron beam 101b of the present invention, the electron beam can intrude into the specimen 102 to reach a part thereof at a large depth owing to the high energy on the beam, and is then scattered by an internal structure 106 to produce scattered (reflection) electrons 103b, which escape from the specimen 102. When leaving the specimen 102, the scattered electrons 103b also interact with the specimen 102 to produce secondary information such as an electromagnetic wave 104b and secondary electrons 105b.

When evaluating secondary electrons from the viewpoint of an image signal, the secondary electrons 105b representative of the secondary information are richer than the secondary electrons 105a representative of the primary information. Accordingly, a specimen image based on a secondary electron signal can permit observation corresponding to the amount of scattered electrons 103b which in turn cause secondary electrons 105b; that is, observation of the internal structure 106.

FIG. 5 shows a model of the relationship between the scanning electron beam energy and the secondary electron discharge amount.

Generally, secondary electrons 105b representative of the primary information have a peak emission amount at an energy level around several hundreds of eV, and, in the energy level range exceeding that level, the emission amount decreases as the energy increases.

On the other hand, secondary electrons 105b representative of the secondary information will not be discharged before the beam energy exceeds a threshold value $E_b$. When the energy exceeds Eb, secondary electrons 105b begin to discharge and the emission amount increases gradually as the energy increases.

To explain, when the energy of electron beam 101b is low, electrons 103b back scattered at the test part 106 fail to have energy sufficient to reach the surface of the specimen, and secondary electrons generated at a depth by the scattered electrons 103b likewise cannot escape from the specimen surface. More specifically, when the depth of the test part 106 as measured from the specimen surface is d, the electron beam 101b at energy $E_0$ is considered to have a range approximating 2d. The depth allowed for secondary electrons to escape is about 100A and most secondary electrons have an energy level of about 10 eV.

On the other hand, the amount of scattered electrons depends on the scattering direction in accordance with the cosine law. More particularly, where an electron beam 101b is vertically incident to a specimen 102 as shown in FIG. 6, for instance, the amount of scattered electrons has a maximum value in a direction at which the scattering angle $\theta$ is 0° and decreases as $\theta$ increases to eventually approach 0 at $\theta=90°$. Scattered electrons in a direction at which $\theta$ is from 0° to 60° occupy about 90% of the total amount of scattered electrons, and scattered electrons within this range may be considered as an image signal.

From the above standpoint, the energy of a scanning electron beam used in observation of a semiconductor device will be studied below.

Generally, a semiconductor device is composed of an element section of, for example, transistors and capacitors, and a wiring layer formed on the element section. The device structure has a depth which depends on the number of wiring layers and which amounts to an average value of about 5 μm.

On the other hand, when scattered electrons allowed to contribute to an image signal are considered to be those within a scattering angle range of from 0° to 60° in accordance with the above discussion, it can be understood from FIG. 7 that the range or length of path of the scanning electron beam which allows scattered electrons to escape from the specimen surface must be 15 μm or more.

In order to convert a range of 15 μm into the energy of the scanning electron beam, the following equation by Katz and Penfold (Revs. Modern Phys., Vol. 24:28 (1952)) is used.

$$R = 0.412 E^{1.265 - 0.0954 \ln(E/1000)}$$

(10 keV<E<3000 keV)

where R is the range (mg/cm$^2$) and E is the energy of the electron beam (keV). The density of the specimen (unit:mg/cm$^3$) is added to this range.

The relationship between the range R and the energy E is shown in FIG. 8. The range R is substantially proportional to the square of the energy $E^2$.

When the conversion is carried out by using Si of 2.34 g/cm$^3$ density as a typical semiconductor material and Al of 2.69 g/cm$^3$ density as a typical wiring material, the range is about 17 μm in Si and about 15 μm in Al when the energy of the electron beam is 50 keV.

This proves that an electron beam energy level of 50 keV or more is required for observation of the semiconductor device. The numerical value amounting to 50 keV is sufficiently compatible with practical, empirical observation.

An electrically non-conductive material can be observed under the fresh condition for the reason that most of an electron beam intrudes into a specimen to reach a large depth thereof or to pass through the specimen and as a result, the charge-up amount near the specimen surface can be minimized.

Contrast of a specimen image to be observed is of a complexity which is not only attributable to the internal structure of the specimen as described above, but also to the surface structure of the specimen and the difference in material between parts of the specimen.

For example, when the surface is uneven as shown in FIG. 9, the total amount and the directional dependency of reflection electrons 103a reflected from the specimen surface are different in comparison with the case where a scanning electron beam 101b irradiates a flat portion of the specimen, the case where the irradiation is to a stepped portion and the case where the irradiation is to a portion close to a stepped portion. Thus, differences result for the number of electrons intruding into the specimen which result in scattered electrons 103b, for the amount of secondary electrons generated as an image signal and for the ratio between secondary electrons 105a representative of the primary information and secondary electrons 105b representative of the secondary information.

Further, as shown in FIG. 10, the number of electrons intruding into the specimen which result in scattered electrons, as well as the total number of detectable secondary electrons and the ratio between secondary electrons 105a and secondary electrons 105b, are different in comparison with the case where specimen materials 102a and 102b are different from each other and the case where a foreign material 102c is adhered to the specimen surface.

Furthermore, even for an embodiment as shown in FIG. 11, where there are shielding structures 102d and 102e against an electron beam 101b, if the shielding structures have a thickness or a depth through which the electron beam 101b can pass, there is contrast even at normally-shadowy locations D and E, which are irradiated with the transmitting electron beam, and resulting specimen images can be observed. In other words, this indicates that even in the presence of very large unevenness or precipitous unevenness on the specimen surface, the interior or bottom of a depression and the side of a raised portion, as well as a surface portion shadowed by the raised portion, can be observed.

BRIEF DESCRIPTION OF THE DRAWINGS

FIG. 6 is a conceptual diagram showing an example of distribution of the scattered electron amount;

FIG. 7 is a conceptual diagram useful to determine the electron beam energy necessary for observation of a semiconductor device;

FIG. 29 is a conceptual diagram showing an embodiment of a method for determining a crystal direction of a crystal grain in a specimen;

FIG. 45A shows an image photograph of a semiconductor wafer formed with a resist pattern which is photographed with a scanning electron microscope according to teachings of the prior art in connection with a specimen having a hole structure;

FIG. 45B shows an image photograph of the FIG. 45A semiconductor wafer photographed according to teachings of the present invention;

FIG. 48 is a block diagram for explaining still another embodiment of the observing method;

FIG. 59A shows an image of an obliquely placed rectangular parallelepiped obtained with the artical dimension measurement SEM of the FIG. 49 embodiment;

DESCRIPTION OF THE PREFERRED EMBODIMENTS

Figure 12:
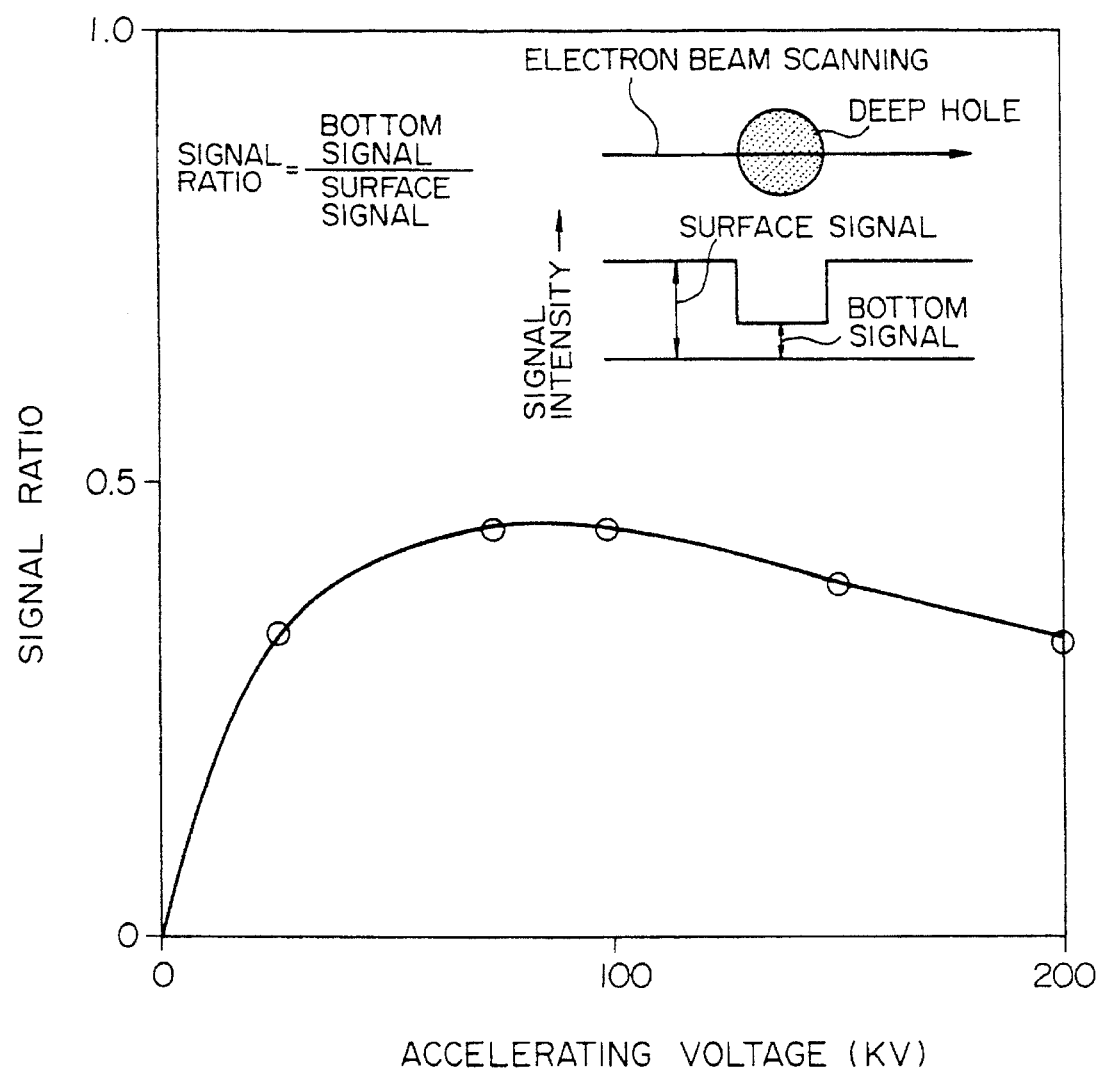
FIG. 12 shows results of actual measurement of increased signals from the bottom of a hole which are obtained by increasing accelerating voltage (energy)

When a hole in $SiO_2$ having an aspect ratio of about 3 and a depth of 1.5 μm was observed, the ratio between signals from the bottom and the surface was measured by changing energy of a primary electron beam to obtain results as shown in FIG. 12. Namely, the ratio between secondary electrons generated by reflection electrons, and secondary electrons generated by the primary electron beam, was measured. It will be appreciated that the ratio is maximized around 100 kV of electron beam energy. When the primary electron beam has low energy, reflection electrons are absorbed by the side wall and therefore no secondary electrons are generated by the reflection electrons. As the energy of the primary electron beam increases, the number of reflection electrons penetrating through the side wall increases and hence the number of secondary electrons thereby generated is increased gradually. However, as the energy is further increased, the primary electron beam intrudes into the specimen more deeply and the number of reflection electrons decreases, leading to a decrease in the number of secondary electrons. This is the reason for existence of the maximum value. Electron beam energy corresponding to the maximum value is related to the depth and material of the hole. The deeper the hole and the denser the material, the higher the maximum value becomes.

Figure 13:
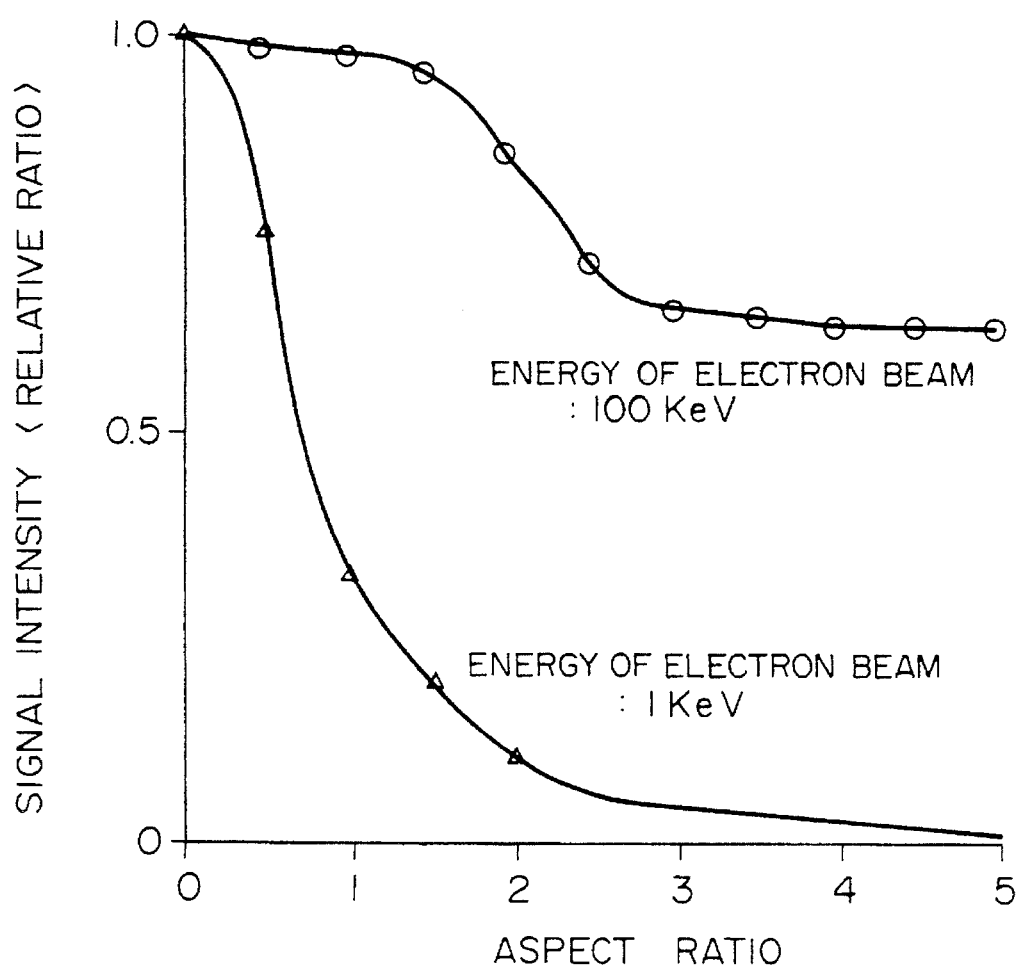
FIG. 13 is a diagram showing the relationship between signal intensity and aspect ratio obtained according to the invention.

FIG. 13 shows the relation between the aspect ratio and the signal ratio obtained when a deep hole was observed by using 100 keV energy. The relation obtained with 1 keV is indicated for reference and it will be appreciated that with 100 keV, even when the aspect ratio exceeds 3, the signal ratio does not decrease and holes of higher aspect ratios can be observed.

In the conventional scanning electron microscope, the energy is less than 50 keV and high energy exceeding 50 keV is not used. This is because there was no concept of observation grounded on the principle described herein. Effectiveness of the high-energy primary electron beam permitting observation of deep holes is disclosed herein for the first time.

Figure 14:
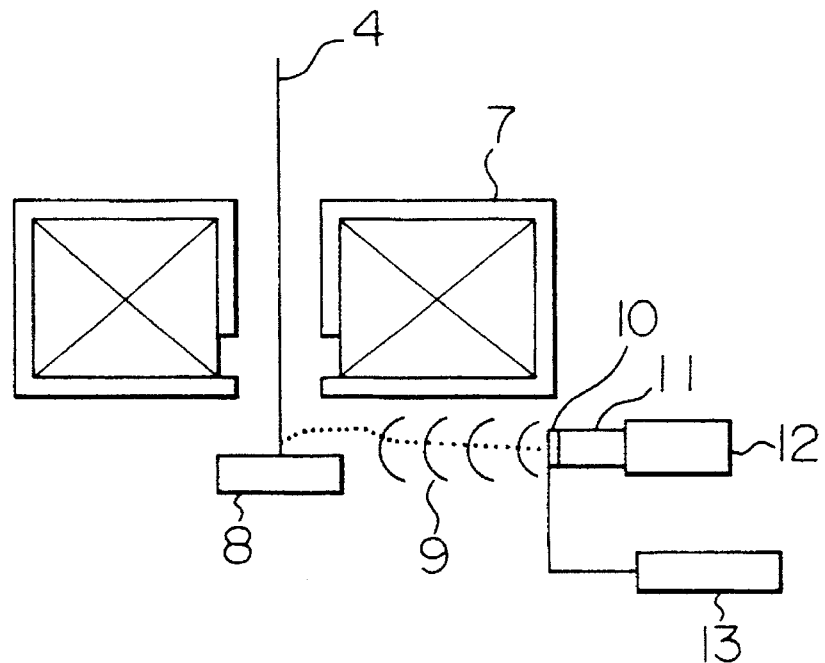
FIG. 14 is a diagram for explaining a method of detecting secondary electrons generated by reflection electrons from the bottom of a hole.

FIG. 14 shows a method of detecting secondary electrons generated by reflection electrons of high energy. This method uses a scintillator 10 and a secondary-electron multiplier 12. Supplied to the scintillator 10 is a high voltage of 10 kV from a high voltage power supply 13. By using an attraction electric field 9 formed by the high voltage, secondary electrons generated by the reflected electrons in the surface of a specimen 8 are detected. A primary electron beam 4 having energy sufficient to generate the secondary electrons from reflection electrons is focused and irradiated on the specimen 8 by means of an objective lens 7. In the Figure, circuits for scanning the primary electron beam and for displaying scanning images are omitted.

Figure 15:
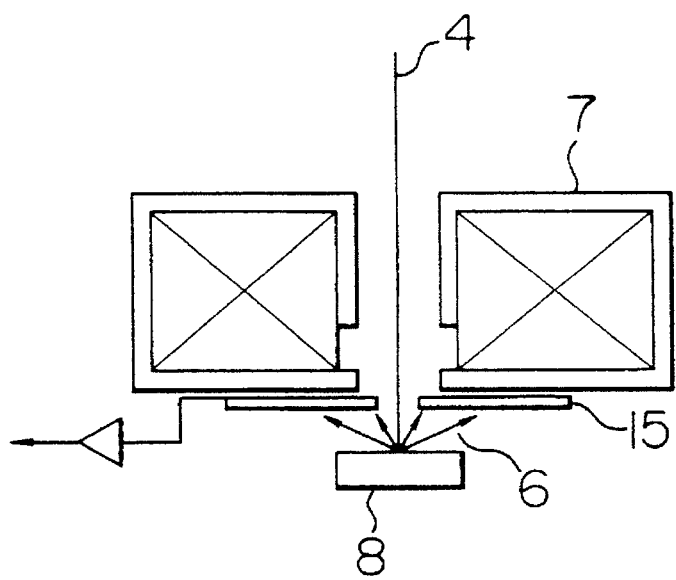
FIG. 15 is a diagram for explaining a method of observing reflection electrons from the bottom of a hole.

FIG. 15 shows an example of detecting not secondary electrons but reflection electrons transmitting through the side wall. A reflection electron detector 15 having a large view angle relative to a specimen 8 is interposed between an objective lens 7 and the specimen 8. The reflection electron detector 15 may be a semiconductor detector having a PN-junction or a Schottky junction or may be based on a method of causing phosphors to luminesce, and of detecting luminescence (an example using a semiconductor is shown in the embodiment). Since the energy of reflection electrons is high, the surface layer of the semiconductor detector is made to be thick (1 to 10 μm), thus preventing degradation of detection efficiency. In the case of phosphors, similar thickening is also employed. The thickness of the phosphor layer measures 10 to 100 μm, depending on energy.

Figure 16:
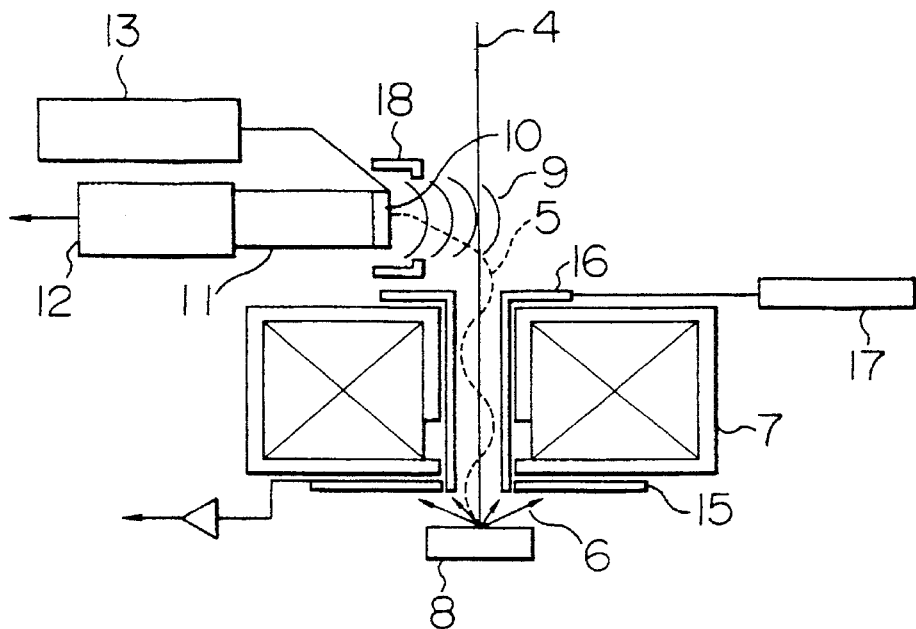
FIG. 16 is a diagram for explaining a method of observing both reflection electrons and secondary electrons simultaneously.

FIG. 16 shows an example where reflection electrons and secondary electrons are both detected. An attraction electrode 16 is provided which passes through the center of an objective lens 7. Secondary electrons 5 generated by the reflection electrons from a specimen 8 are drawn into a magnetic field of the objective lens 7 and pulled upwards by means of the attraction electrode 16. The secondary electron 5 thus pulled upwards are accelerated by an attraction electric field 9 formed by a scintillator 10 so as to impinge on the scintillator 10 and cause it to luminesce.

Luminescent light is guided to a light guide 11 and amplified and converted into an electrical signal by means of a secondary-electron multiplier 12. Reflection electrons generated from the specimen 8 have high energy and therefore they are hardly deflected by an electric field formed by the attraction electrode 16, keeping a substantially straight path and impinging upon a reflection electron detector 15. Through this process, the reflection electrons themselves and the secondary electrons generated from the reflection electrodes can be detected distinctively. Since scanning images formed by the two types of electrons are slightly different from each other, it is possible to select one of the images which has better contrast, or to perform addition/subtraction to improve contrast.

In the foregoing embodiments, secondary electrons and reflection electrons are generated on the side upon which the primary electron beam is incident, but, when the specimen is thin, either secondary electrons generated by transmitted electrons or the transmitted electrons themselves may be detected.

Figure 17:
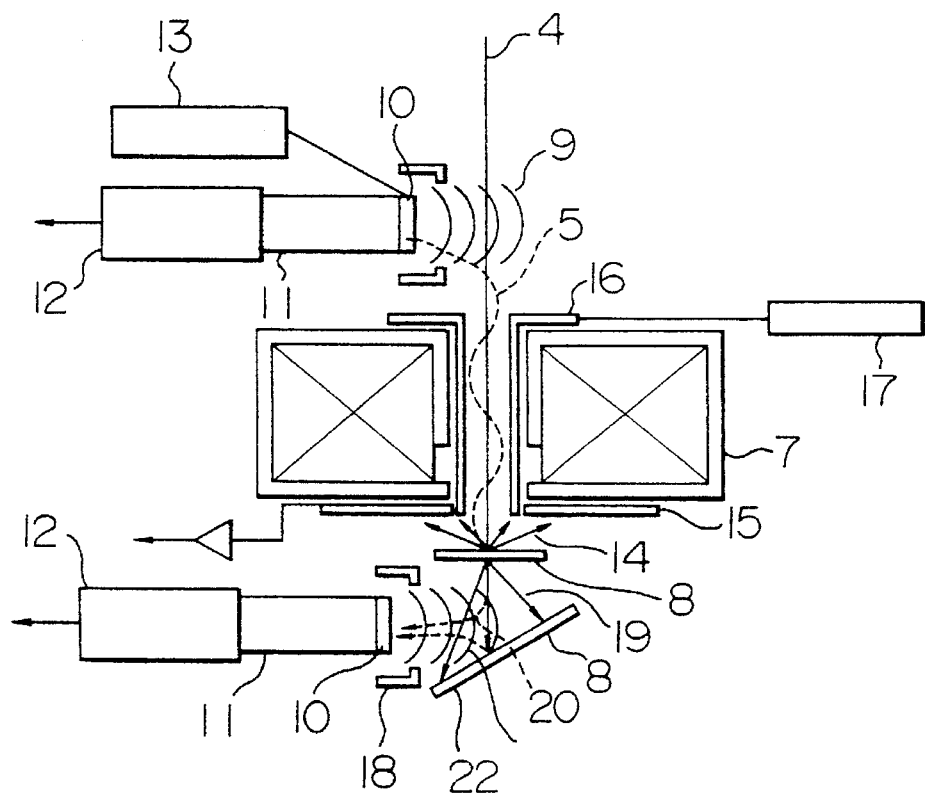
FIG. 17 is a diagram illustrative of detection of electrons transmitting through a specimen.

FIG. 17 shows an embodiment in which secondary electrons generated on the side opposite the primary electron beam and transmitted electrons are detected. The manner of detection on the primary electron beam side is the same as that in the previously-described embodiment. Secondary electrons 20 generated from the undersurface of a specimen 8 by electrons transmitting through the specimen and secondary electrons 21 generated by impingement of transmitted electrons 19 upon a reflection plate 22 are detected by using a scintillator 10, a light guide 11 and a secondary-electron multiplier 12. Electrons of a primary electron beam of 200 keV energy have a range of 200 μm and can transmit through even a Si wafer used in the semiconductor industry. Thus, by detecting transmitted electrons and secondary electrons generated from the undersurface of the specimen, a hole formed in the surface of the specimen 8 can be observed.

Figure 18:
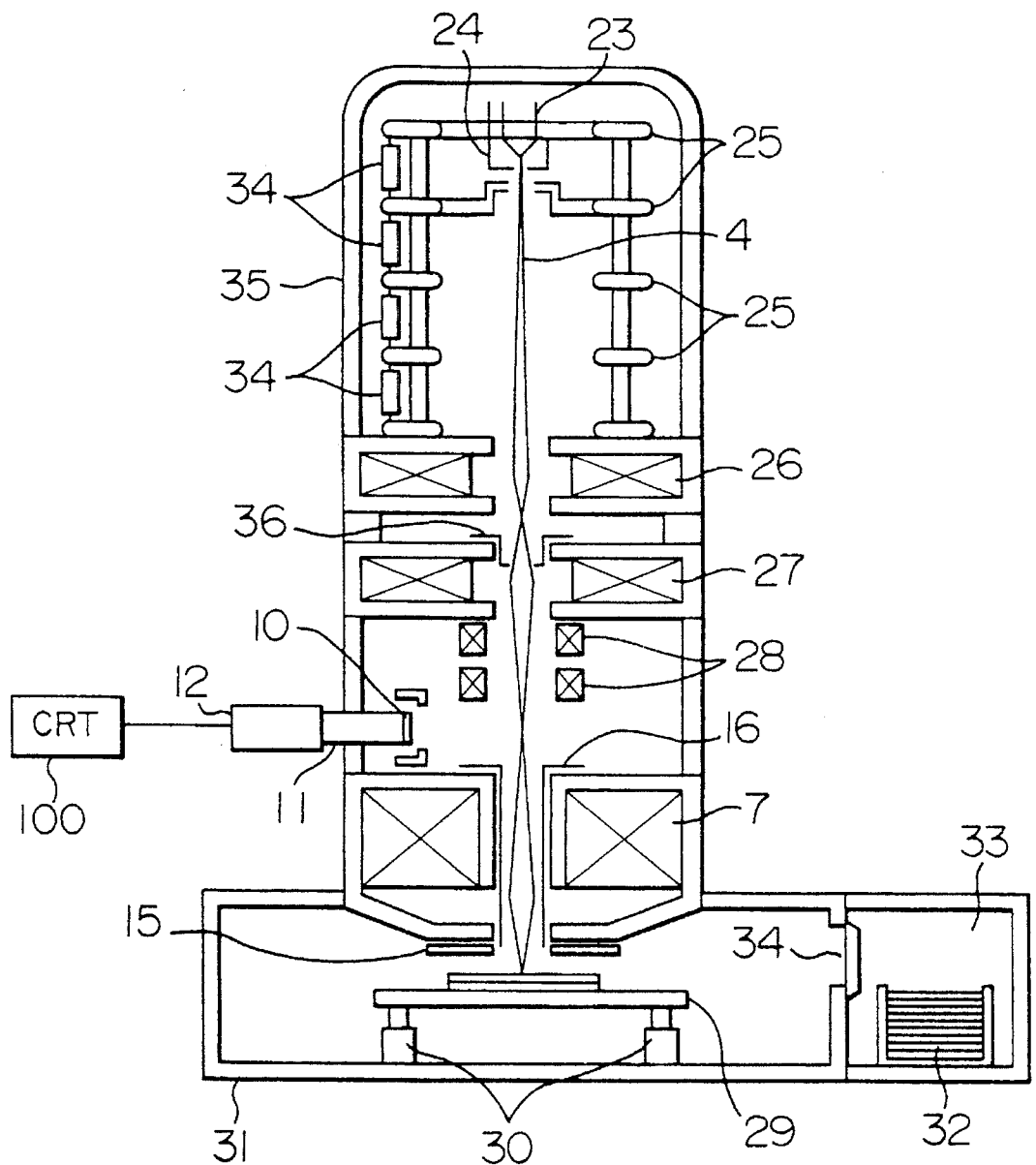
FIG. 18 is a diagram for explaining an embodiment of the invention which can permit observation of an object in wafer condition in accordance with the principle of the observation and detection method according to the invention.

FIG. 18 shows a scanning electron microscope using the principle of observation and the detection method described previously. The source of electrons can be a single crystal of $LaB_6$ heated to emit electrons. Emitted electrons are controlled by means of a Whenelt 24. The emitted electrons are accelerated by accelerating electrodes 25. The accelerating voltage (energy) in the present embodiment has a maximum value of 200 keV.

An accelerating electrode 25 of the uppermost stage is applied with the accelerating voltage, and divisional voltages due to dividing resistors 34 are applied to individual accelerating electrodes 25. Here, the cable and power supply for application of the accelerating voltage are omitted.

An accelerating unit including the accelerating electrodes 25 is shielded with a high voltage shield 35. An accelerated primary electron beam 4 is reduced in size by means of a first condenser lens 26, a second condenser lens 27 and an objective lens 7. When an objective lens having a focal distance of 30 mm is used, a resolution value of 3 nm can be obtained at 200 keV. The aperture of the electron beam is determined by an aperture 36 placed on the second condenser lens 27.

Scanning of the electron beam is carried out by a scanning coil 28. The scanning coil is constructed of two stages of coils so that the electron beam subject to scanning may pass through the center of the objective lens 7. Reflection electrons reflected at a specimen are detected by a reflection electron detector 15 and secondary electrons generated by the reflected electrons are led upwardly of the objective lens 7 and detected by a detector comprised of a scintillator 10, a light guide 11 and a secondary-electron multiplier 12.

The specimen is a wafer of 4 inches or more carried on an XY fine movement stage 29. The specimen can be inclined by ±15 degrees in desired directions by means of a specimen inclination fine movement section 30. The specimen inclination fine movement section 30 has three posts, and the length of each post can be controlled by a computer. A wafer to be observed is contained in a dedicated cassette 32 and the cassette is stored in a preparatory chamber 33. When conducting an observation, a valve 34 is opened and the specimen is brought onto the XY fine movement stage 29 by using an exchange mechanism (not shown). When the same portion of the specimen is observed by changing the inclination angle, the height can be measured (stereo-measurement).

In highly integrated semiconductor devices, the etching process for working a deep hole of high aspect ratio is important as has already been described. Etching for working a deep hole of high aspect ratio is very difficult and for determination of etching conditions, observation of the bottom of the deep hole and confirmation of the process of etching are needed.

Figure 19:
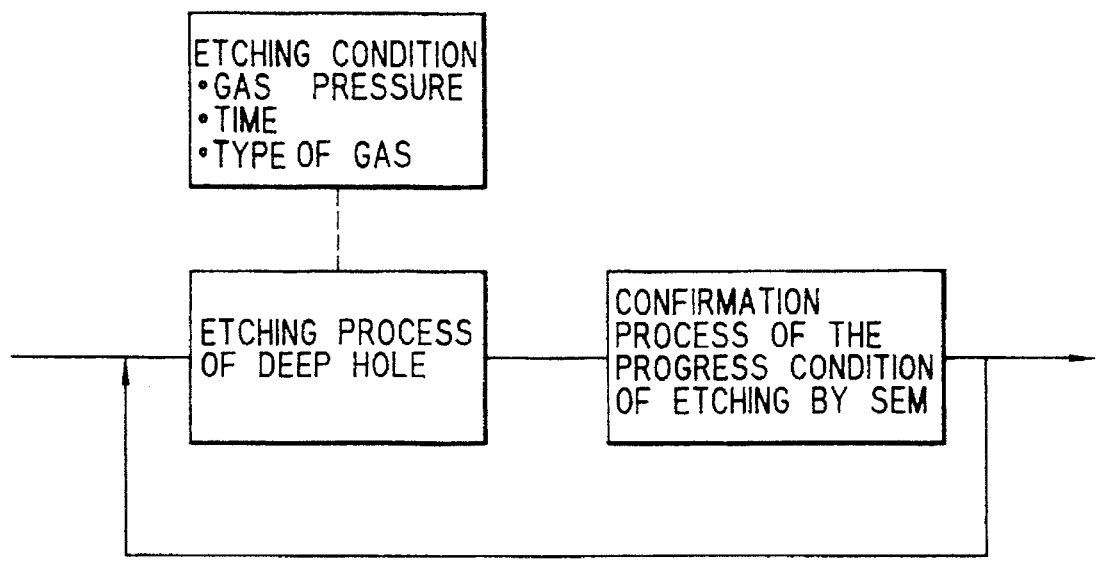
FIG. 19 is a diagram showing a flow for determining etching conditions by using the scanning electron microscope.

FIG. 19 shows a flow of the confirmation wherein in accordance with the results of confirmation, feedback for urging, for example, re-etching is undertaken to ensure process integrity. The thus-determined etching conditions are relayed to the succeeding process. By repeating the confirmation at a fixed period, the process can be made to be stabler.

The scanning electron microscope is very effective for the confirmation of etching and can contribute to improvement in yield of production of highly-integrated devices. Especially, the high-energy scanning electron microscope utilizing secondary electrons generated by reflected/transmitted electrons described so far is effective.

Figure 20:
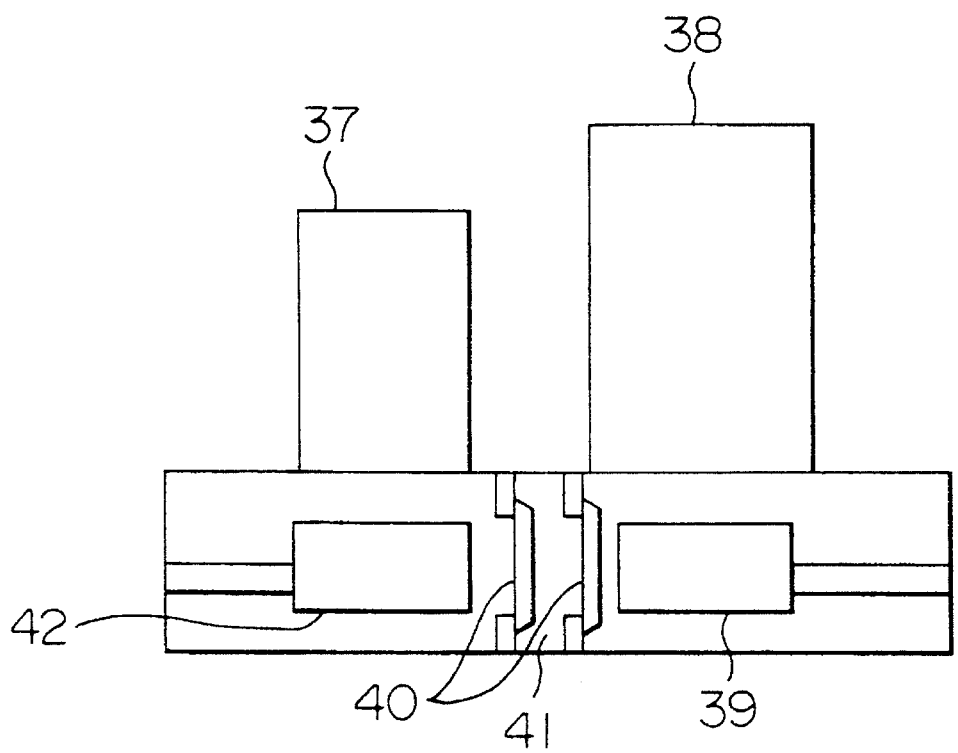
FIG. 20 is a conceptual diagram of an arrangement in which a specimen chamber is provided in common for microwave etching and for a scanning electron microscope to facilitate determination of etching conditions.

FIG. 20 shows an arrangement contrived to simplify the aforementioned confirmation process, in which a specimen chamber is provided in common for a microwave etching apparatus 38 and a high-energy scanning electron microscope 37, and etching and inspection can be carried out alternately by merely moving a specimen from an etching apparatus specimen stage 39 to a scanning electron microscope XY fine movement stage 42. The degree of vacuum in the microwave etching apparatus is $10^{-4}$ Torr which is comparable to that in the scanning electron microscope but, because of the use of inert gas, an intermediate chamber 41 is provided in the present embodiment in order that the inert gas can be prevented from flowing into the scanning electron microscope by switching valves 40 alternately for intermediate chamber 41. In the Figure, the evacuation system is omitted.

As described above, in accordance with the principle of observation according to the invention, deep holes of which observation was impossible in the past can be observed. This implies that inspection can be carried out in-line in the process of semiconductor device production, resulting in very beneficial effects.

Figure 21:
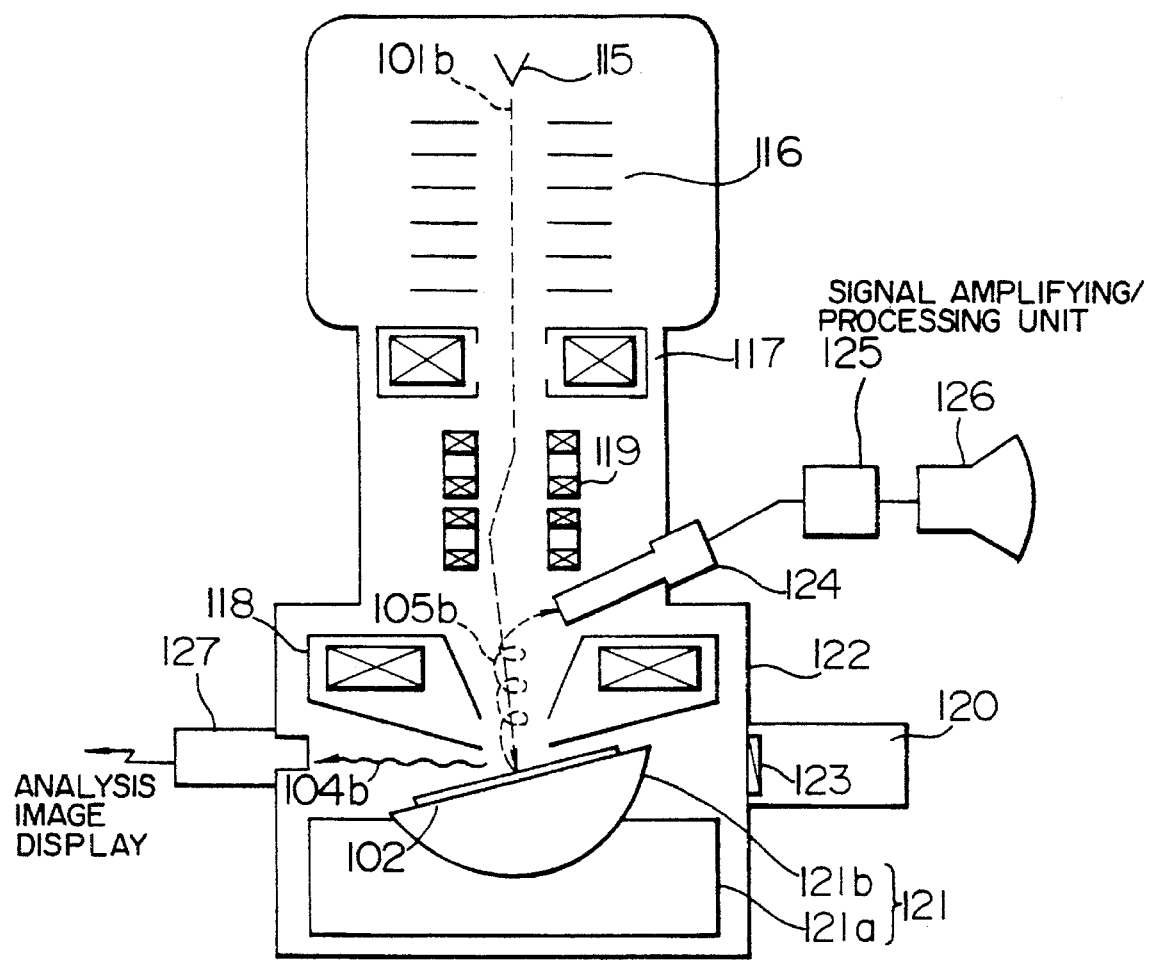
FIG. 21 is a sectional view showing the construction of a scanning electron microscope according to another embodiment of the invention.

Another embodiment will be described with reference to FIG. 21.

Firstly, a specimen 102 is moved from a loader/unloader chamber 120 onto a specimen stage 121 inside a specimen chamber 122 by a load/unload mechanism, not shown, and loaded on the specimen stage. The loader/unloader chamber 120 is in the form of a load lock mechanism, wherein the loader/unloader chamber is separated from the specimen chamber 122 by a vacuum valve 123 so that the specimen 121 may be loaded on the specimen stage 121 without breaking vacuum. An electron beam 101*b* is then emitted from an electron gun 115 and it is accelerated to an energy level of several tens of keV by means of an accelerating tube 116, focused to be thinned by means of a focusing lens 117 and an objective lens 118, and irradiated to the specimen 102. When subjected to XY deflection by means of a deflector 119, the electron beam is scanned on the specimen 102.

A mechanism for moving the specimen and the specimen stage 121 is provided, and may be an external view inspection apparatus (trade name: S-7000) manufactured and sold by Hitachi, Ltd. The electron gun 115, accelerating tube 116 and focusing lens 117 are structurally the same as those of a transmitting electron microscope (trade name: H-800) also manufactured and sold by Hitachi, Ltd.

Secondary electrons 105*b* are discharged or emitted from a portion of the specimen irradiated with the scanning electron beam 101*b*, along with an electromagnetic wave 104*b* representative of X-rays and photons.

Secondary electrons 105*b* are drawn upwards in the axial direction of the objective lens 118 while whirling under the influence of a magnetic field of the objective lens 118, and are detected by a secondary electron detector 124 constructed of a scintillator and a photomultiplier tube so as to be converted into an electrical signal. The electrical signal is amplified and then modulated in brightness by means of a signal amplifying/processing unit 125 to produce a specimen image which is displayed on a display 126. Similarly, electromagnetic wave 104*b*, such as X-rays or photons, discharged from the specimen 102 is detected by a detector 127 and used for analysis or image display.

The specimen stage 121 includes an X/Y moving mechanism 121*a* and a rotating/inclining mechanism 121*b* to permit selection of a desired observation site or location and a desired observation direction.

Figure 22:
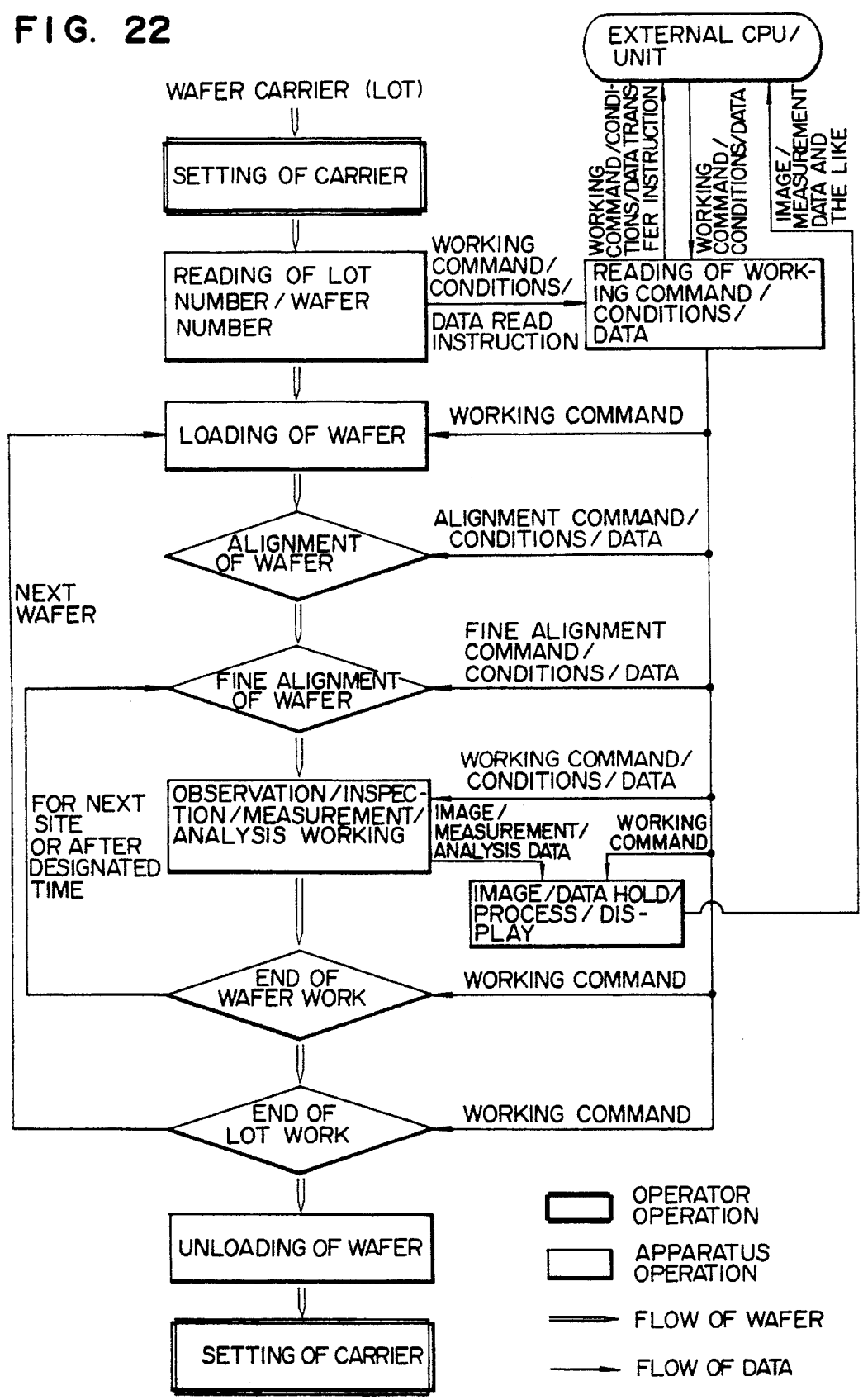
FIG. 22 is a flow chart showing the operation of a display apparatus according to an embodiment of the invention.

FIG. 22 shows an example of a flow chart of scanning and processing in the case where semiconductor wafer specimens 102 are processed in lot units.

Wafer specimens 102 are kept by lot in a wafer carrier. When the wafer carrier is set in the loader/unloader chamber 120, a lot number described on the wafer carrier is read by means of an optical or magnetic reader and the apparatus is started. Subsequently, working command, working conditions and working data corresponding to the lot number are read. The succeeding process is automatically carried out on the basis of the working command, working conditions and working data.

The working command stipulates the processing operation that determines which one of the wafers is to be subjected to which operation at which site. The working conditions are concerned with electron beam irradiation, image forming process and measuring process, and prescribe apparatus parameters necessary for performing the various operations. The working data correspond to data other than the apparatus parameters needed for work prosecution, for example, position coordinate data of defects transferred from an external tester or a defect inspection apparatus.

In the processing, a sheet of a designated wafer is first loaded on the specimen stage 121. Subsequently, wafer aligning work is carried out according to the alignment method adopted in an electron beam exposure apparatus. Rough alignment of the wafer may be conducted before loading the wafer on the specimen stage 121. For example, a method may be employed wherein a contour of the wafer is detected optically to determine the center of the wafer. For fine alignment of the wafer, a method may be employed wherein an electron beam 101*b* is scanned on an alignment mark formed on the wafer to produce reflection electrons, and an alignment mark position is determined from a signal waveform representative of the thus-produced reflection electrons. Alternatively, an alignment mark position may be determined by bringing a scanning image of an alignment mark into coincidence with a previously stored reference image.

After completion of the alignment, another work of interest, such as observation, inspection and measurement or analysis is carried out. These operations may be conducted individually or simultaneously; for example, observation and analysis may be conducted in combination. Work results as represented by image data, inspection data, measurement data and analysis data of the specimen are then subjected to predetermined data processing and thereafter kept and displayed in accordance with a predetermined procedure, or are transferred to an external host computer, analysis apparatus or wafer process apparatus.

Various operations can be practiced in such a way that a plurality of desired sites within a wafer are worked, or the same site on o in a wafer is worked repetitively at desired time intervals.

Further, the particular operations can be changed for individual wafers or for individual working sites on or in a wafer. The type of operation can be inputted through a control computer of the present apparatus or from a host computer on line.

The above operations are applied to all of the designated wafers.

Specific examples of work of interest or the present work will now be described.

Figure 23:
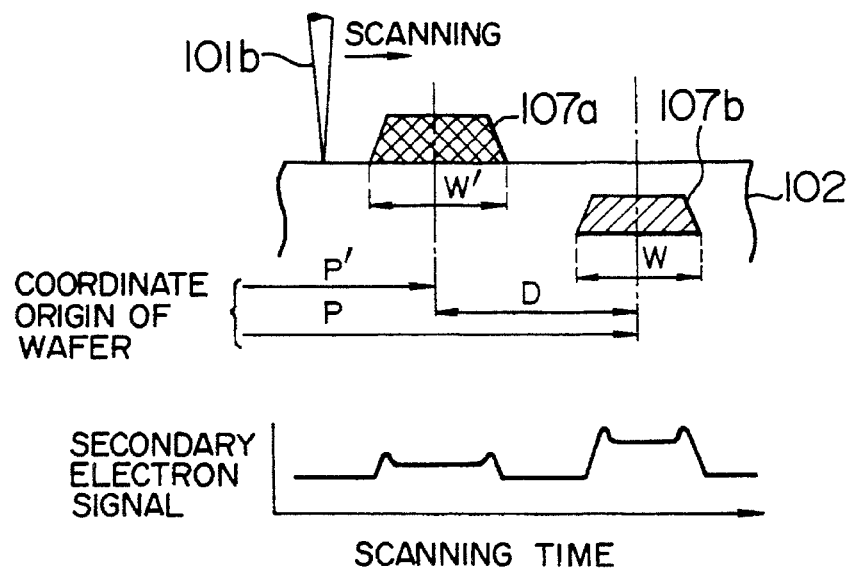
FIG. 23 is a conceptual diagram showing an example of a length-measuring method according to an embodiment of the invention.

One of the inspection operations is a length-measuring operation. An example of this working is shown in FIG. 23.

Figure 1:
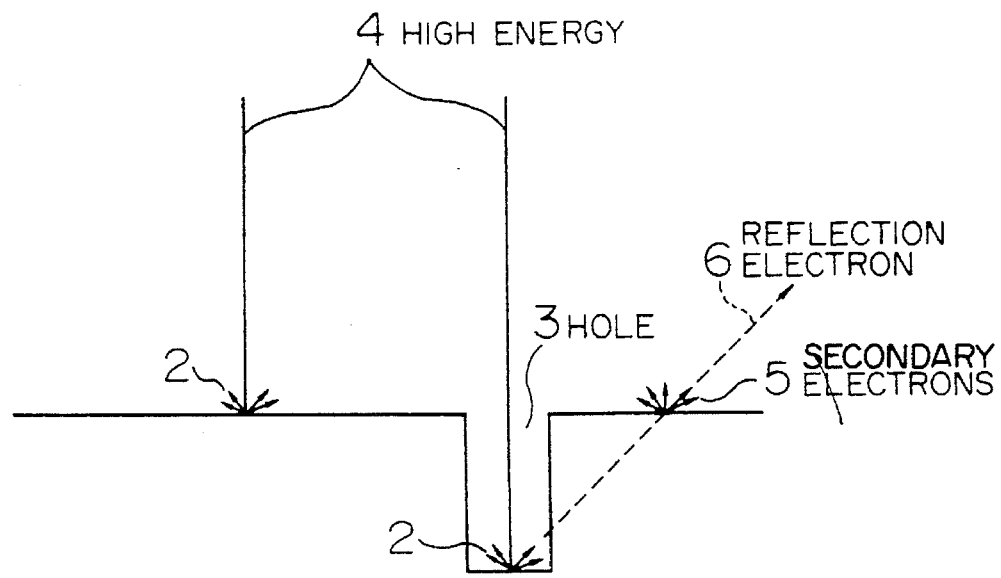
FIG. 1 is a diagram for explaining the principle of observation according to the invention.
Figure 2:
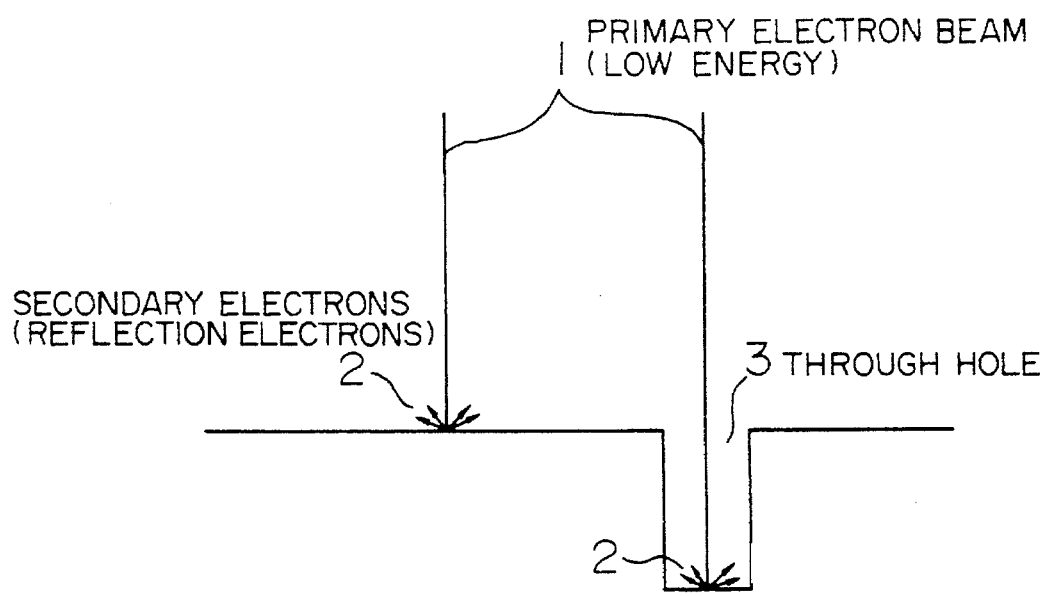
FIG. 2 is a diagram for explaining a conventional observation method.
Figure 3:
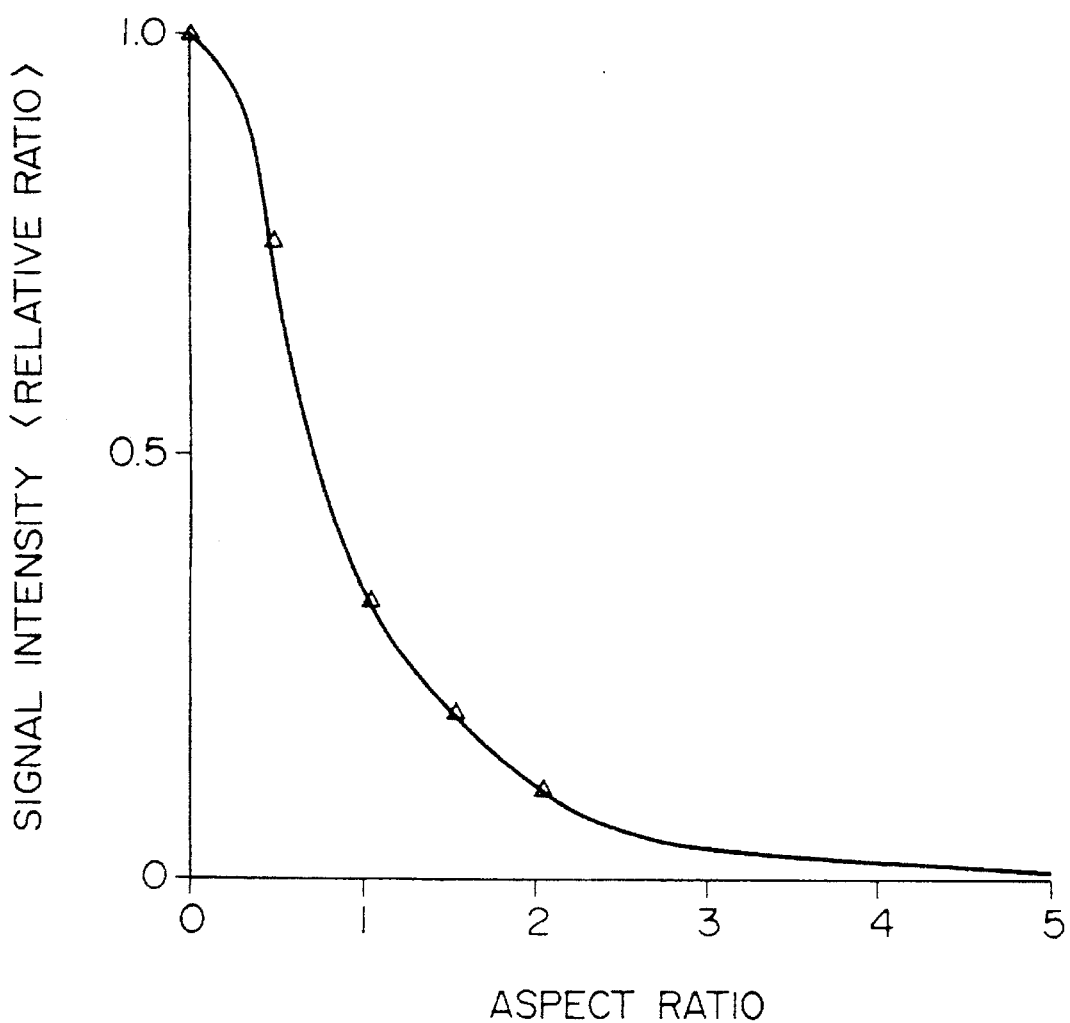
FIG. 3 is a diagram showing the relationship between signal intensity from a hole and aspect ratio obtained in accordance with the conventional method.
Figure 4:
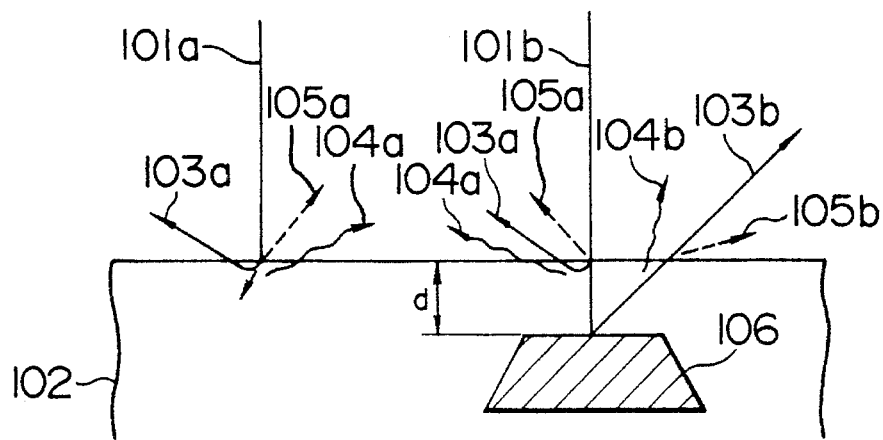
FIG. 4 is a conceptual diagram diagrammatically showing the principle of a scanned specimen image displaying technique of the invention.
Figure 5:
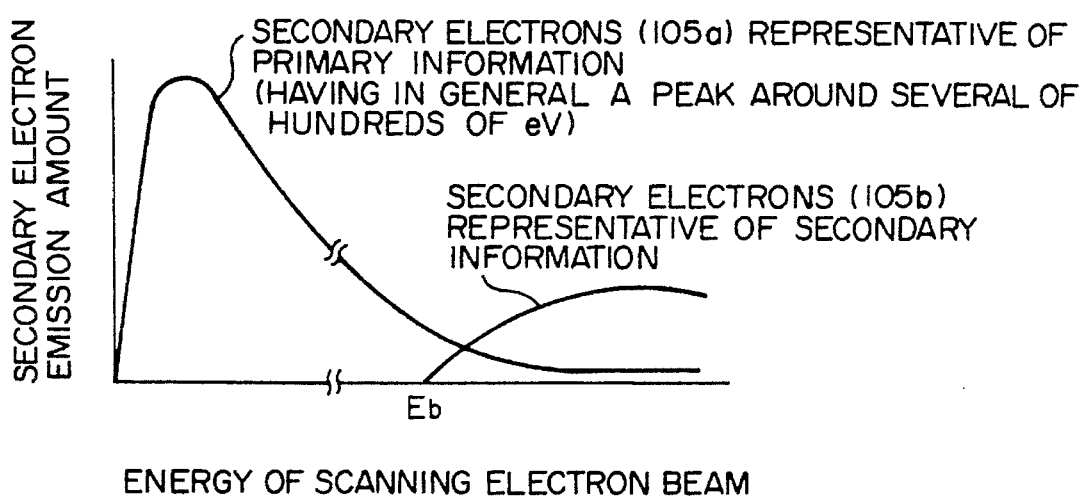
FIG. 5 is a graph showing a model of the relationship between the scanning electron beam energy and the secondary electron emission amount.
Figure 8:
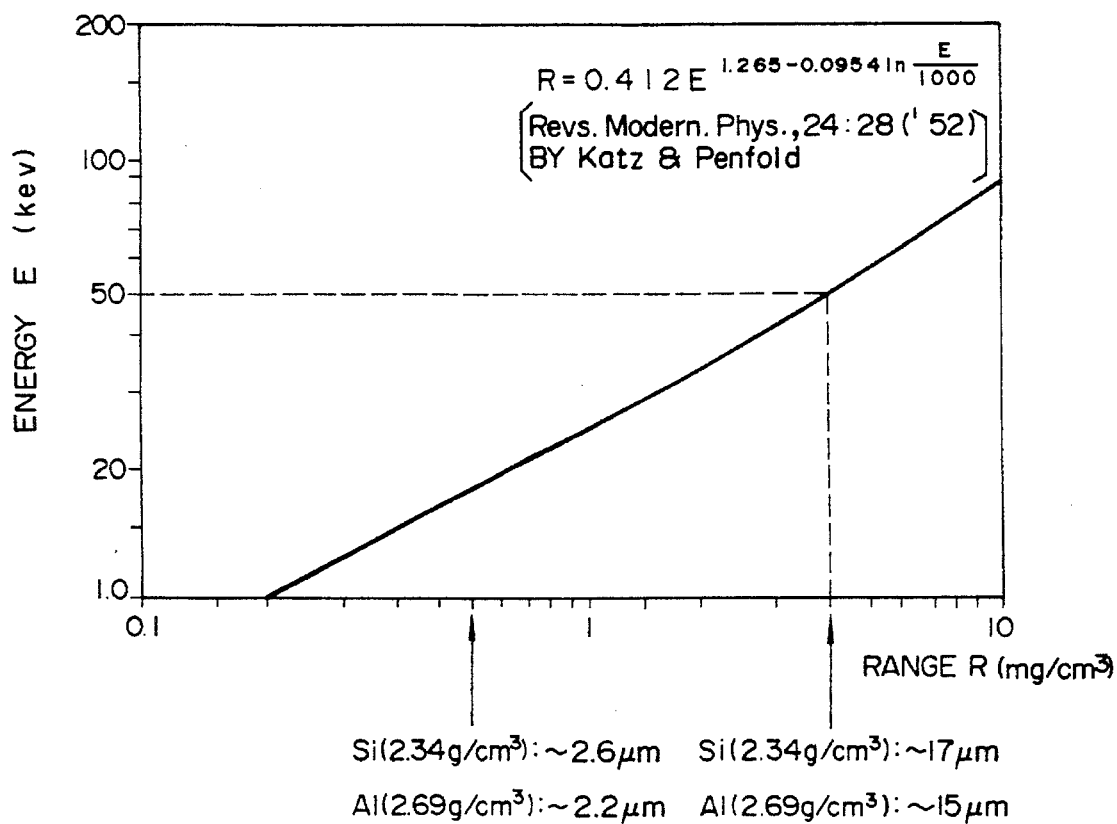
FIG. 8 is a graph useful to determine the electron beam energy necessary for observation of the semiconductor device.
Figure 9:
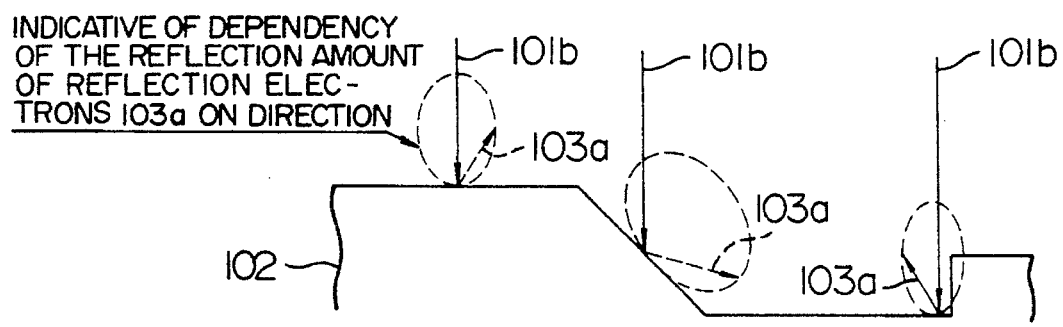
FIG. 9 is a conceptual diagram useful to explain an example of the change of contrast with conditions of the specimen surface.
Figure 10:
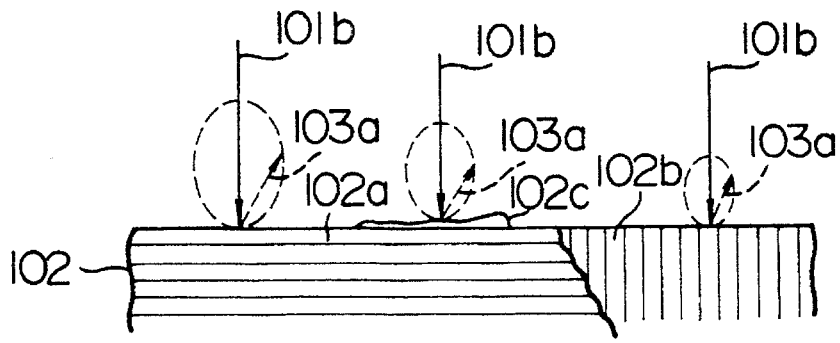
FIG. 10 is a conceptual diagram useful to explain another example of the change of contrast with conditions of the specimen surface.
Figure 11:
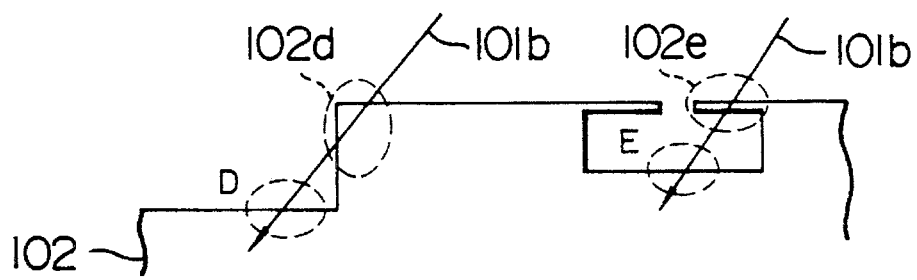
FIG. 11 is a conceptual diagram useful to explain still another example of the change of contrast with conditions of the specimen surface.

A pattern 107*a* formed on the surface of a specimen 102 and a pattern 107*b* formed inside the specimen are scanned with an electron beam 101*b*, and pattern dimensions W and W', inter-pattern distance D and pattern position coordinates P and P' are determined from secondary electron signal waveforms. Length measurement is carried out in a specific manner which accords with a method generally employed in a length-measuring SEM. The electron beam 101b has an energy level of 50 keV or more. Therefore, as will be seen from the relation depicted in FIG. 5, a signal corresponding to a first pattern 107b is larger than a signal corresponding to a second pattern 107a.

Figure 24:
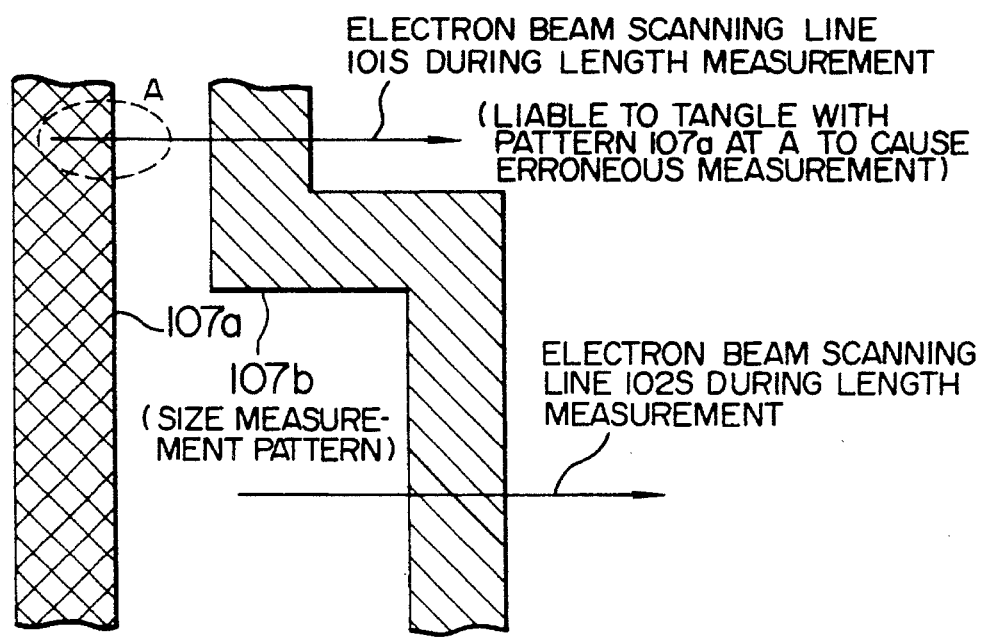
FIG. 24 is a plan view of a specimen.

In this case, if, as shown in FIG. 24, the pattern 107a is located so near the pattern 107b to be measured that a scanning line 101s of the electron beam encounters the pattern 107a as shown at A, errors in measurement possibly occur. It is desirable that at a length measuring portion the patterns 107a and 107b be spaced apart from each other by a width of a scanning line or more as shown at scanning line 102s.

Figure 25:
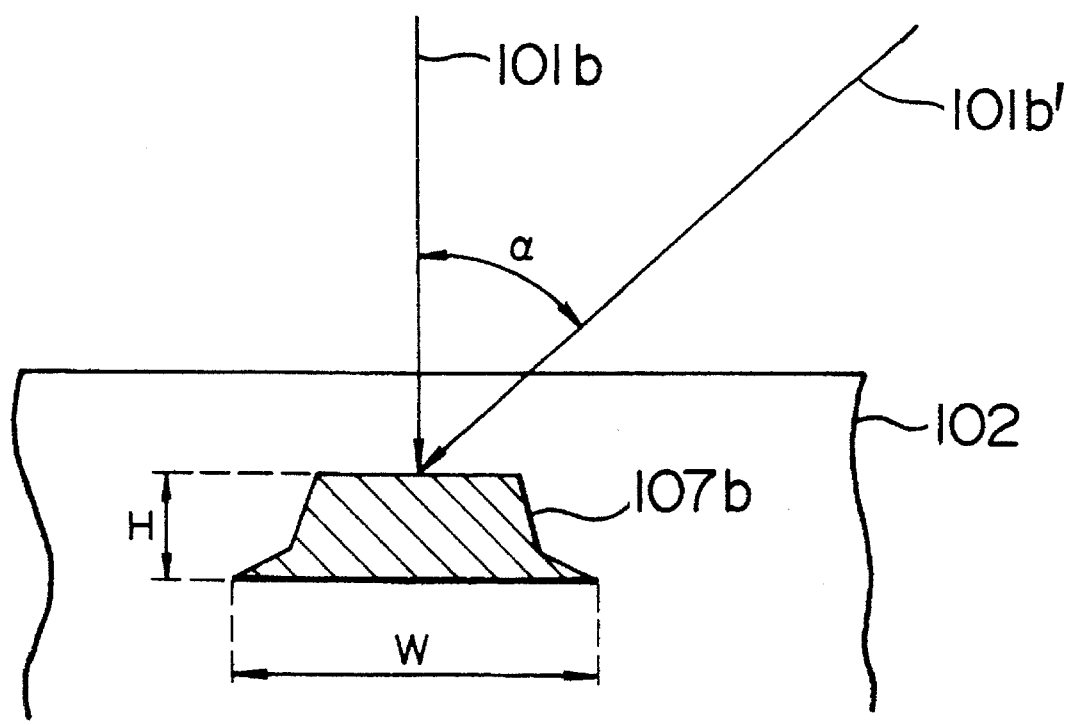
FIG. 25 is a conceptual diagram showing a method of determining a three-dimensional configuration of a specimen according to an embodiment of the invention.
Figure 26:
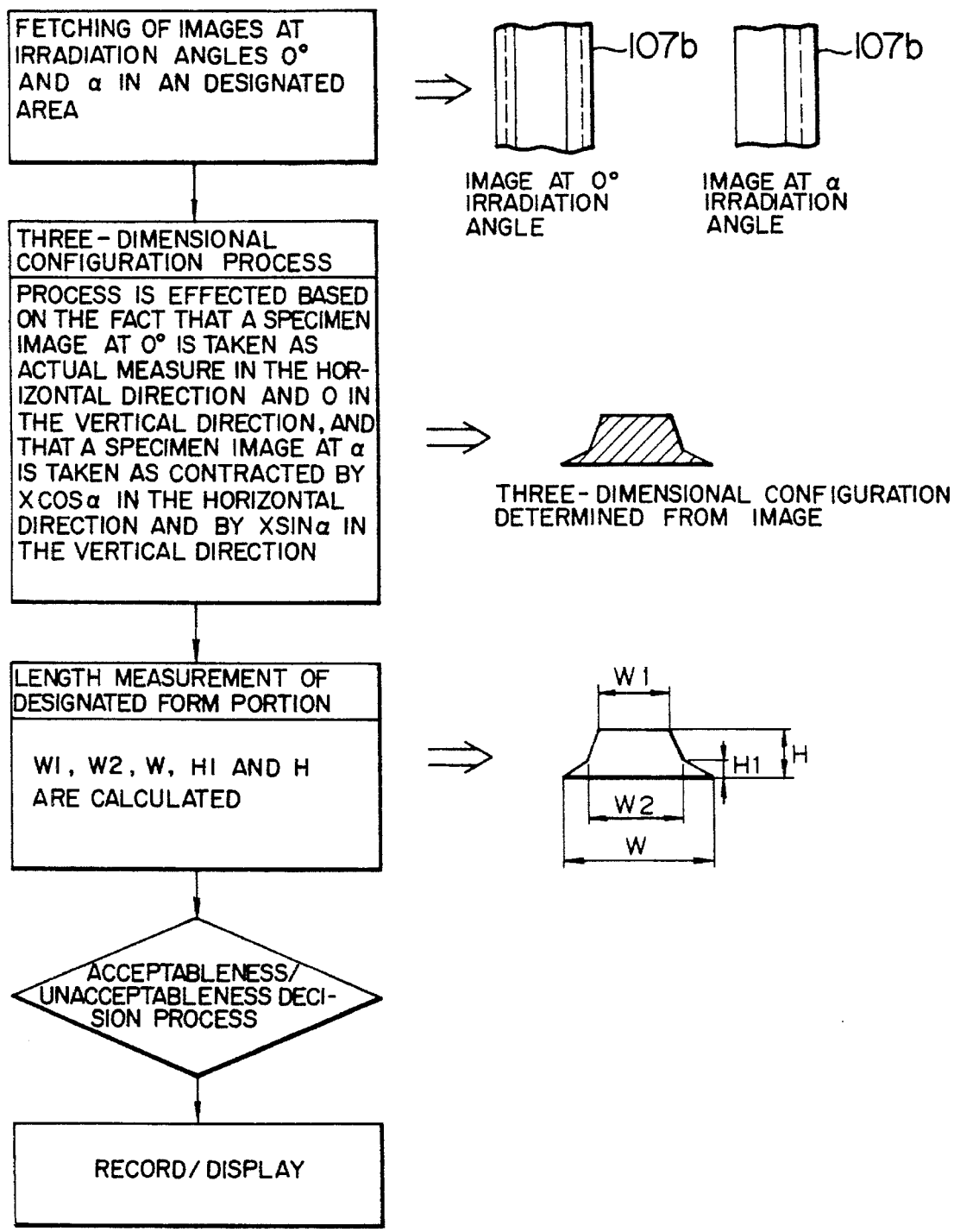
FIG. 26 is a flow chart for determination of the three-dimensional configuration of a specimen according to an embodiment of the invention.

As exemplified in FIGS. 25 and 26, the same view field can be observed at different angles or in different directions to obtain two or more images of the same field of view, thus determining a three-dimensional configuration, and display of the three-dimensional configuration or measurement of three-dimensional size can be effected on the basis of the three-dimensional configuration. For example, images of the same view field are fetched at an irradiation angle of 0° subtended by the electron beam 101b and specimen 102 (observed from directly above) and at an irradiation angle of α subtended by the electron beam and specimen (observed obliquely from above), and the two images are examined with a distance difference between two points to be measured to calculate a three-dimensional configuration. Specifically, in a specimen image at an irradiation angle of 0°, a distance between two points in the horizontal direction is taken as an actual measure but a distance in the vertical direction is taken as 0 (zero).

On the other hand, utilized in connection with a specimen image at an irradiation angle of α is the fact that the actual size is taken as contracted by x cos α in the horizontal direction and x sin α in the vertical direction.

The irradiation angle can be changed by changing the incident angle of electron beam 101b to the specimen 102 by means of a deflector or by changing the inclination angle of specimen stage 121. The change of irradiation direction and angle is not limited to the two-step change. When a specimen is inclined in a number of directions in which the specimen is desired to be observed in configuration and to be measured in length, and a number of specimen images are fetched, fidelity and accuracy of a three-dimensional configuration to be calculated can be improved. By narrowing the width of scanning of the electron beam, a substantial sectional view can be formed accurately.

A plurality of images can be displayed simultaneously by, for example, displaying a specimen image and a three-dimensional image in combination. The simultaneous display can be provided on the same display or on different displays.

This function can be applied, in particular, to a pattern size measuring apparatus, a pattern position coordinate measuring apparatus, an apparatus for accurate measurement of pattern superimposition and an apparatus for measurement of pattern drawing distortion or transfer distortion.

Especially, the conventional applied electron beam apparatus was unable to measure a pattern positioned inside a specimen and failed to measure the accuracy of pattern superimposition, but the present embodiment makes both possible.

As a second example, measurement of particles and domains, bubbles and foreign materials is enumerated.

Figure 27A:
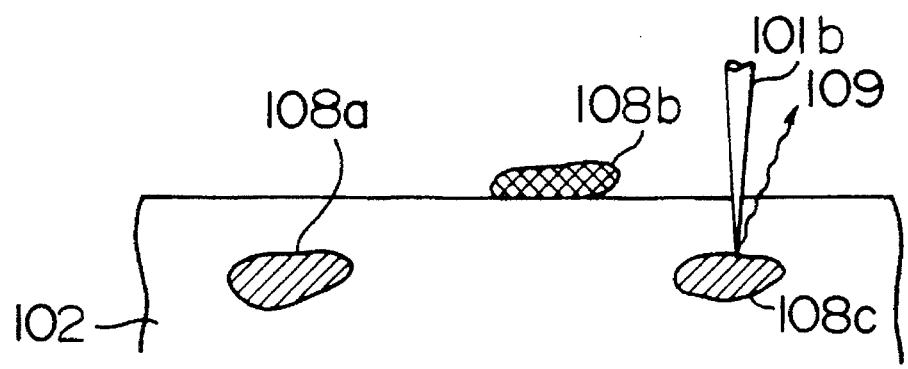
FIG. 27A is a conceptual diagram showing an embodiment of observation of particles in a specimen.
Figure 28:
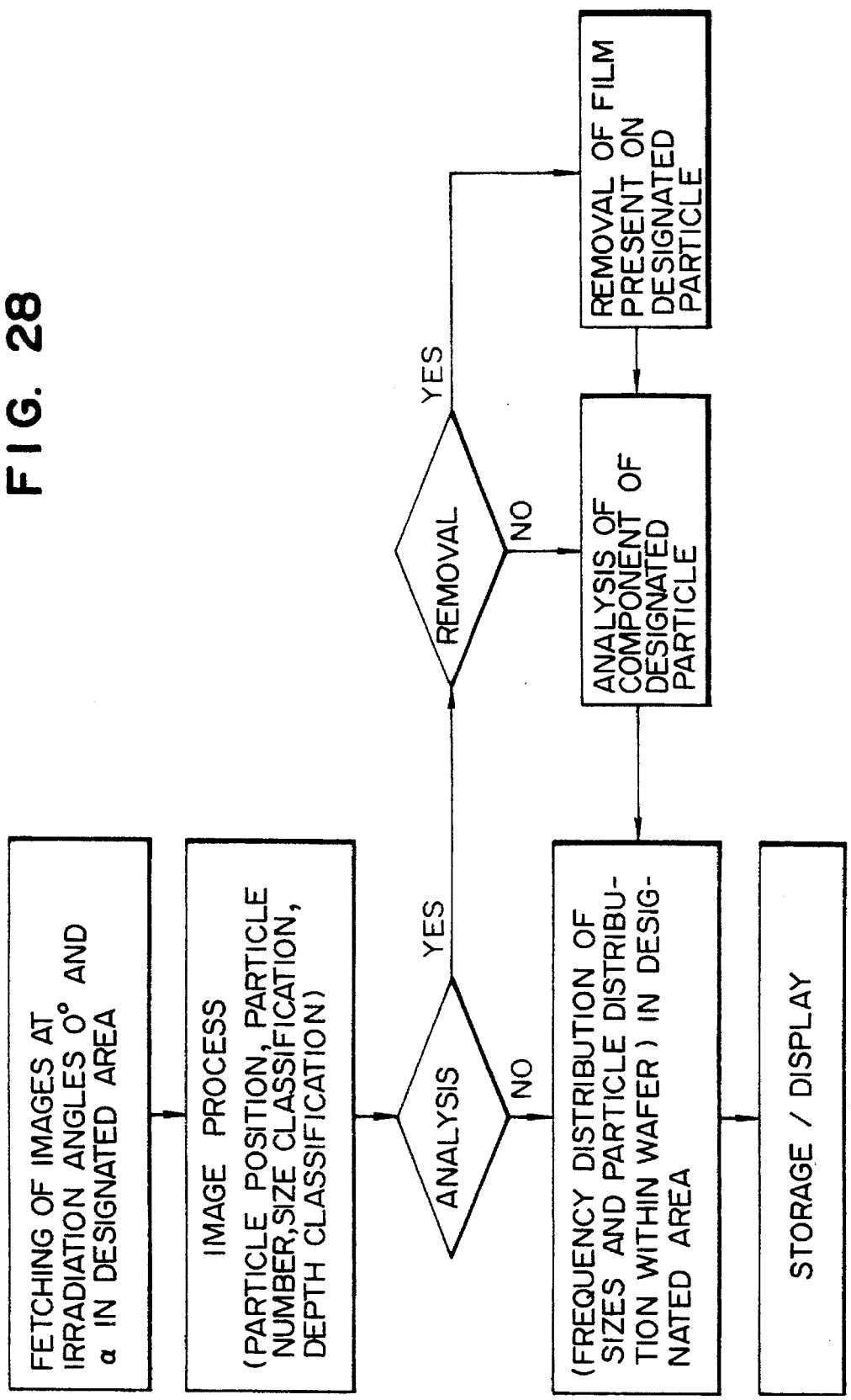
FIG. 28 is a flow chart for observation of particles.

FIG. 27A shows an example of measurement of particles according to the method illustrated in FIG. 28. A designated area of specimen 102 is scanned with a scanning electron beam 101b to fetch specimen images. The specimen images are analyzed and the number of particles are counted to determine data indicative of size distribution and distribution of particles within a wafer. In this case, the number of counted particles can be analyzed in a manner which accords with the method generally employed in an image analyzer.

A measuring operation can be carried out along with analysis of components of particles. Used for the component analysis is a method wherein position coordinate data of a particle 108c desired to be subjected to component analysis is determined from a specimen image, positions of the electron beam and of the particle to be analyzed are determined on the basis of the position coordinate data, the electron beam 101b is irradiated onto the target particle 108c, and characteristic X-rays 109 emitted from the particle 108c are detected to determine a component. A semiconductor detector is used for X-ray detection and a technique is employed wherein the kind and quantity of an element are determined from the peak value and number of current pulses generated by incident X-rays.

Figure 27B:
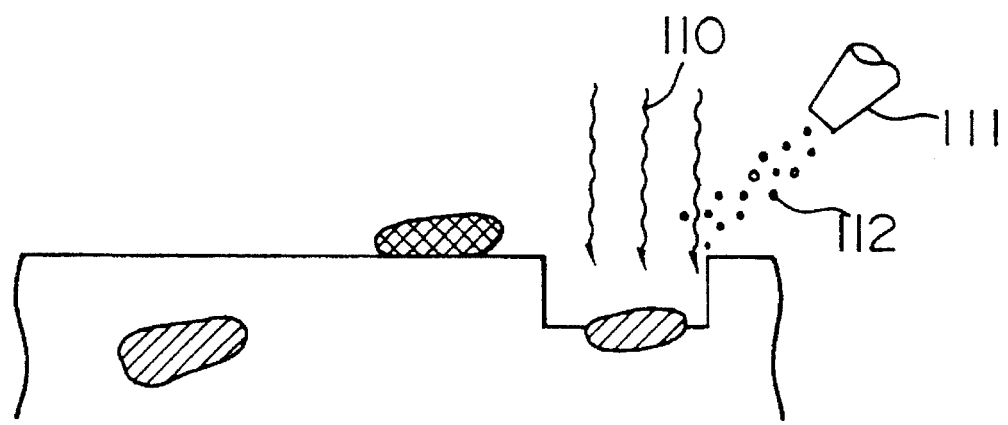
FIG. 27B is a conceptual diagram showing a method of removing a particle on a specimen by etching.

In this procedure, for the sake of increasing sensitivity and accuracy of the component determination, a covering on the particle 108c may be removed. Selective removal of the covering on the particle can be achieved by, for example, laser-assist etching as shown in FIGS. 27B and 28, in which an etching gas 112 is sprayed from a gas nozzle 111 while a finely focused laser beam 110 is irradiated to a portion desired to be etched away. The etching gas is a gas having selectivity for etching only the covering without impairing the particle.

When the target consists of various kinds of specimens, a plurality of gas nozzles are adopted and a proper kind of gas is selectively used.

In order to optimize the etching conditions, the horizontal position and vertical position of the gas nozzle are designed to be adjustably movable and the direction of gas spraying is made to be adjustable.

Obviously, for the component analysis, such information as an Auger electron beam or cathode luminescence may be detected in place of X-rays. In addition to an electron beam, a laser beam or an ion beam may be used as an exciting beam for use in the analysis.

As for the etching method, other chemical etching methods may be used. For example, an ion beam-assist etching and a physical etching method such as ion beam sputtering may also be employed. Generally, however, because of the necessity for securing high selectivity of etching between the covering and the particle, the chemical etching method is suitable.

Even in the particle measurement, by fetching a plurality of specimen images in different irradiation directions and at different irradiation angles and subjecting the fetched images to a three-dimensional configuration processing, information in the direction of depth as to a three-dimensional configuration of a particle or as to what kind of particle is distributed at which depth position can be obtained.

When a specimen is observed by changing the irradiation direction and angle, knowledge of the direction of a crystalline structure can also be obtained. FIG. 29 shows an example to this effect.

Illustrated in the figure is an instance where a specimen 102 has a polycrystalline structure 106 (internal structure) and the crystal direction is oblique in a crystal grain 106a, vertical in a crystal grain 106b and horizontal in a crystal grain 106c. When the specimen is observed with a scanning electron beam 101b from directly above, the amount of scattered electrons 103b directed to the specimen surface, that is, the image signal amount is the largest for the crystal grain 106c and is decreased, in order, for crystal grains 106a and 106b. On the other hand, when observation is carried out with a scanning electron beam 101b' irradiating in an oblique direction, the image signal amount decreases in the order of crystal grains 106c, 106b and 106a.

In this manner, the image signal amount or image contrast changes in accordance with the relation between crystal direction and observation direction. By analyzing the condition of this change, the crystal direction of each crystal grain can be decided. Through image analysis, as in the case of particle number counting, data of crystal grain size distribution and data of crystal direction distribution can be obtained.

Figure 30A:
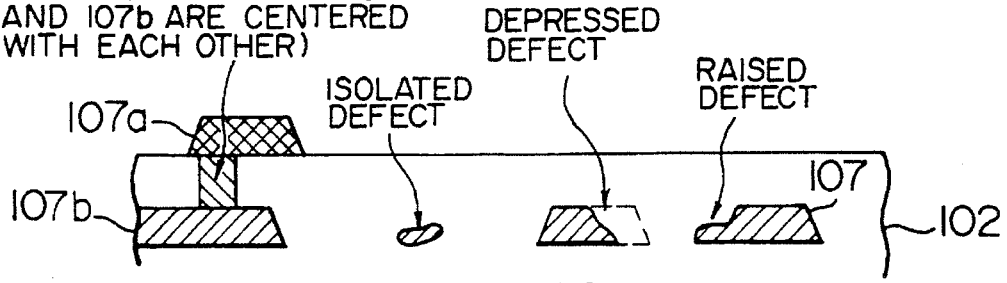
FIG. 30A is a sectional view showing examples of the kind of defects subjected to defect inspection.
Figure 30B:
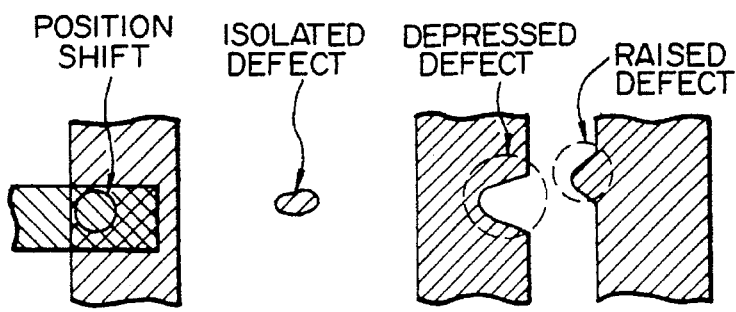
FIG. 30B is a plan view of the defects shown in FIG. 30A.
Figure 31:
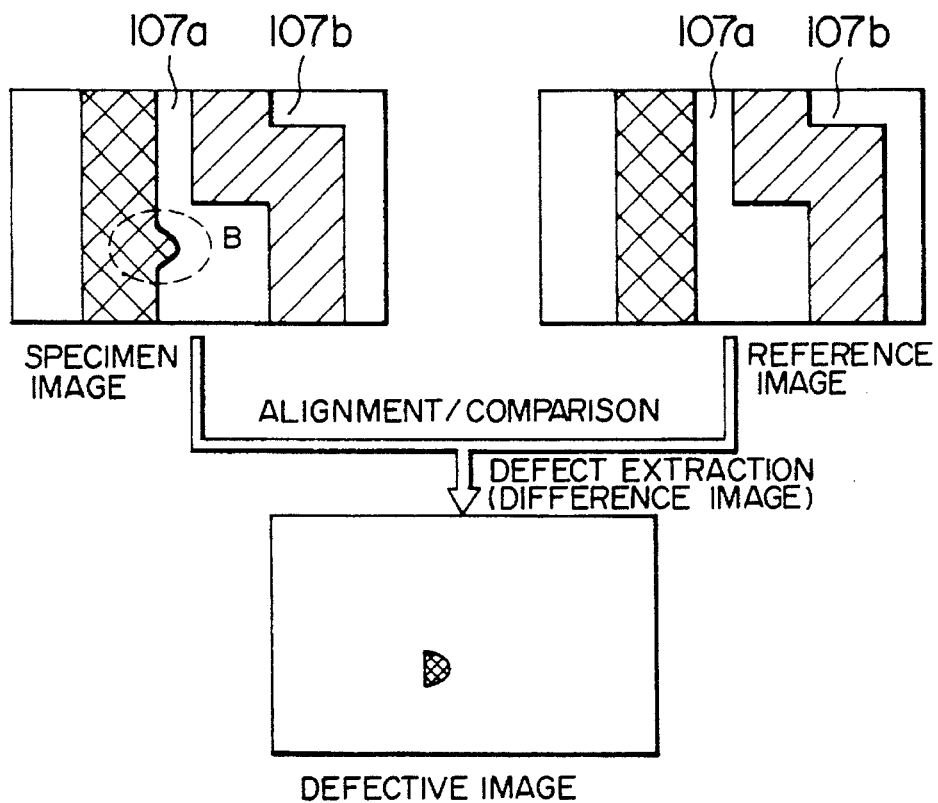
FIG. 31 is a conceptual diagram showing an embodiment of a method of performing defect inspection of a pattern in a specimen.
Figure 32:
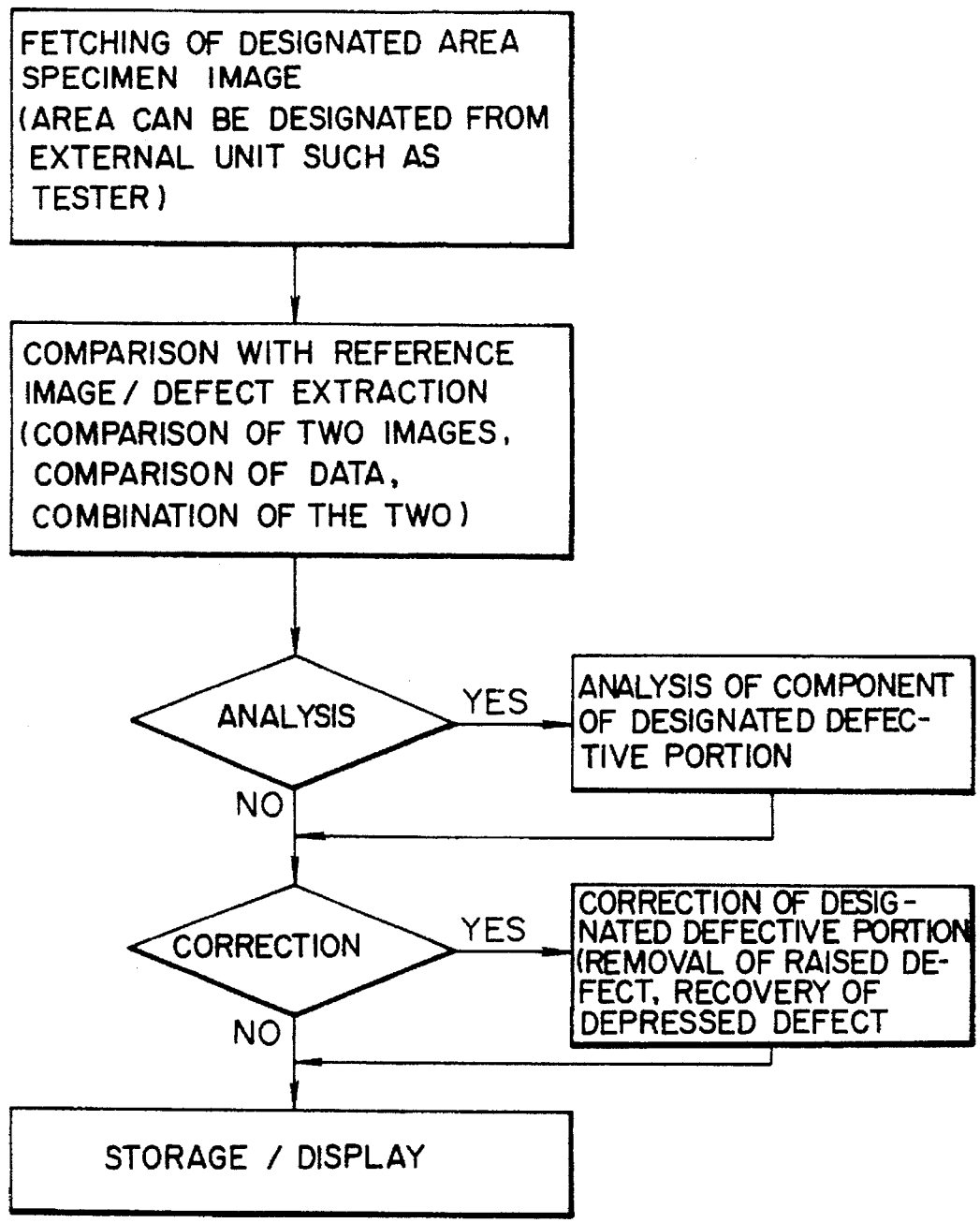
FIG. 32 is a flow chart of an embodiment of a method for performing defect inspection.

Enumerated as a third example is inspection of pattern defects and foreign matter. There are various kinds of defects as exemplified in FIGS. 30A and 30B. FIG. 30A is a sectional view of a specimen and FIG. 30B is a plan view of the specimen. In order to detect these defects, the procedure shown in FIGS. 31 and 32 is performed, which accords with a technique used in a general defect inspection apparatus.

A specimen image of a designated area is first fetched and subjected to image processing such as smoothing, and thereafter the alignment and comparison of the specimen image with a previously stored reference image is effected to provide a difference between the specimen and reference images, and a defect/foreign matter is detected from the difference. In FIG. 31, a portion B is detected as a raised defect.

The reference image may be either a standard specimen image taken within an area corresponding to a designated area of an identical specimen or within the same kind of specimen, or a pattern data image of the corresponding area prepared on the basis of pattern data. In the inspection operation, the reference image can partly be defined by a standard specimen image, and partly by a pattern data image. These images may be used in combination.

The entire surface of a wafer may be used as an inspection area, or only part of the wafer surface may be inspected. For example, position coordinate data of a chip or a circuit block, which have been decided to be unacceptable or defective through inspection based on a tester or a defect inspection apparatus, are inputted from the tester or the defect inspection apparatus on line, positions of the unacceptable chip or circuit block are determined from the inputted coordinate data, and only a portion in question is selectively subjected to defect inspection. On the other hand, even in the defect inspection, component analysis of the defective portion can be effected, as in the case of the example of particle measurement.

By using a technique similar to the removal of a covering by an etching gas, a pattern defect can be corrected. In contrast, however, to the removal of a raised defect or an isolated defect, wherein an etching gas is used, a sedimentary gas is used for correction of a depression defect. Essentially, the defect correction technique is the same as that performed by a photomask defect correction apparatus or an LSI wiring correction apparatus.

While the conventional defect inspection apparatus is in general of the optical type, the defect inspection based on a high energy electron beam is advantageous in that not only the defect detection sensitivity is high but also a defect underlying an opaque material can be detected. In particular, of the defects shown in FIGS. 30A and 30B, detection of a pattern position shift would be impossible with the conventional method, but possible with the inventive method based on the high energy electron beam.

Figure 33A:
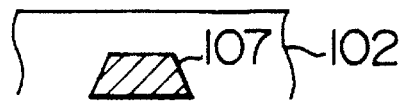
FIG. 33A is a sectional view showing a pattern in a specimen.
Figure 33B:
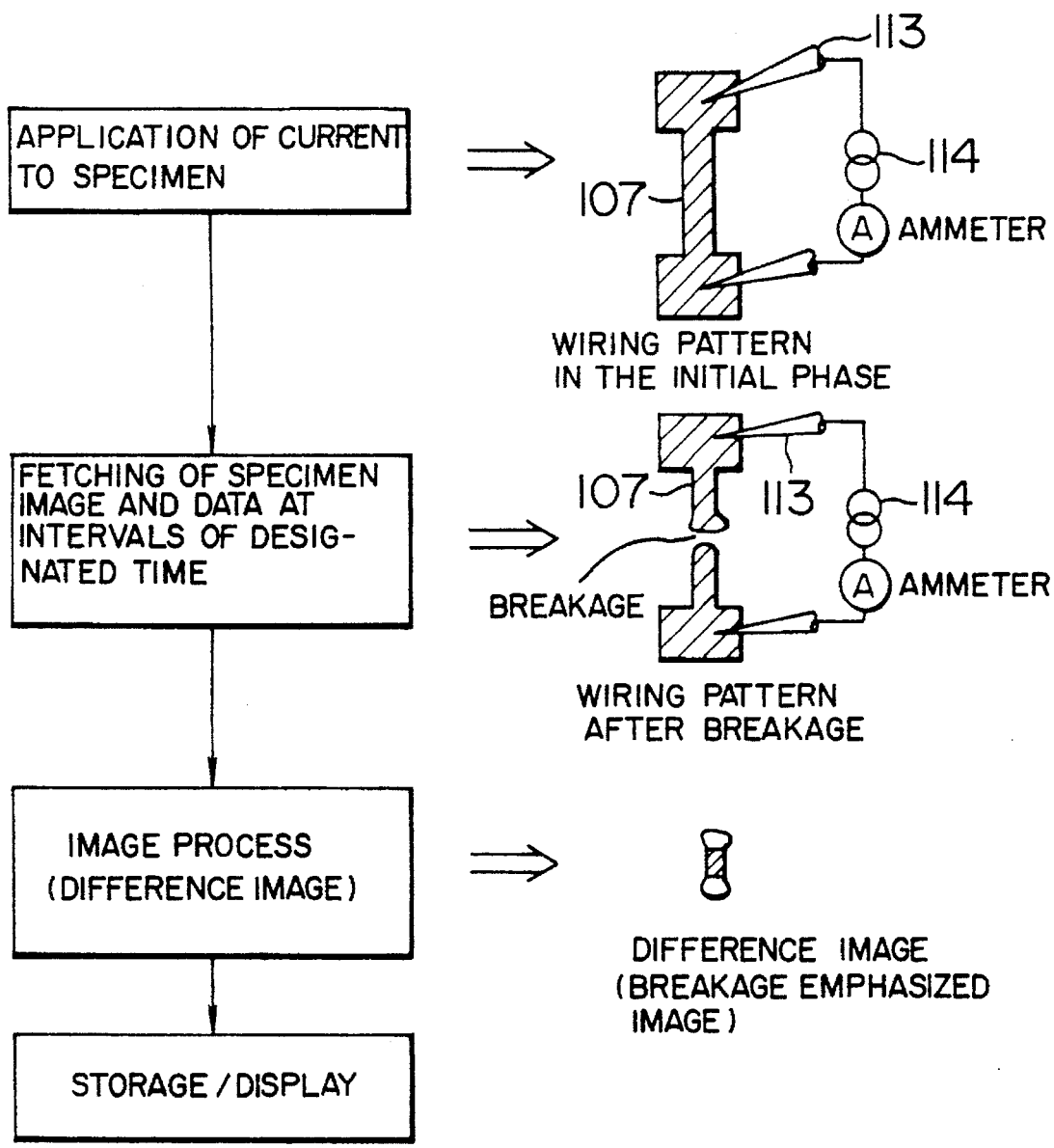
FIG. 33B is a flow chart showing an embodiment of a method of observing a change in configuration of the pattern of FIG. 33A when stress is applied to the pattern.

A fourth example is for monitoring a change in state of a specimen. FIG. 33A is a sectional view of an exemplary wiring pattern 107 embedded in the specimen. FIG. 33B shows, as an example, an application of the semiconductor device specimen to an accelerating test.

A probe 113 is put on opposite ends of the wiring pattern 107 to be monitored and a stress current is applied from a current source 114 to the wiring pattern through the probe 113. A specimen image of the wiring pattern 107 is fetched at designated time intervals and the state of wiring pattern 107 ultimately ending in breakage is recorded and displayed. For example, a difference between the preceding state and the present state is displayed to emphasize only a change. Simultaneously with the specimen image, lapse of electrical parameters such as current value and resistance value are collected, recorded and displayed. Of course, the number of probes and power supplies used can be increased in accordance with the number of wiring conductors to be monitored.

The stress applied is not limited to DC current but may also be AC current or pulse current. In addition to current, voltage or an operating electrical signal may be applied to the specimen, or the specimen can be heated or cooled to observe and monitor a change due to temperatures. In the case of heating, noises attributable to thermions or radiation from a heating unit adversely affect an image signal and must be compensated. The plurality of kinds of stress as above may be applied in combination or one at a time. A mechanism for applying the stress to the specimen accords with that used in observation with the conventional scanning electron microscope.

A fifth observation technique is for tomographic observation. This type of observation takes advantage of the fact that information obtained in the direction of depth of a specimen changes depending on the energy of the electron beam.

Figure 34:
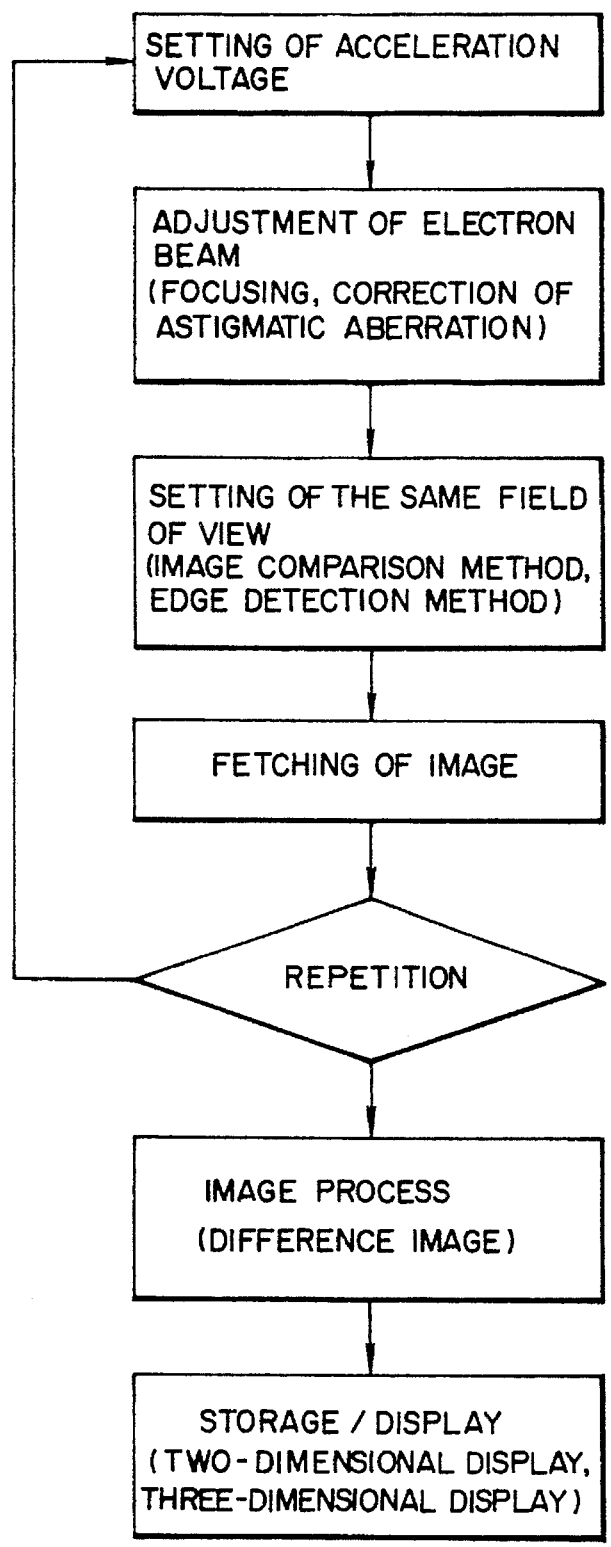
FIG. 34 is a flow chart of an embodiment of observing a three-dimensional structure of a pattern in a specimen.

FIG. 34 shows an example of a process flow. Specimen images are sequentially fetched while changing the acceleration voltage of the electron beam.

The acceleration voltage is first set. Then the electron beam is adjusted and the same field of view is settled. The electron beam adjustment is fulfilled by performing axial alignment, focusing and correction of astigmatic aberration in order to maintain high-resolution conditions. Settlement of the same field of view aims at permitting an area of the same field of view to be always observed even when the acceleration voltage is changed. For example, a method is employed wherein a specimen image previously fetched is used as a reference image, and the scanning area of the electron beam is adjusted to allow the specimen image currently under observation to coincide with the reference image. Alternatively, according to the alignment system used in the electron beam exposure apparatus, alignment can be accomplished by using an object with a designated image in place of an alignment mark.

Subsequently, a specimen image within a designated area is fetched. The higher the set acceleration voltage, the deeper a portion from which information contained in the fetched specimen image is obtained becomes.

Figure 35:
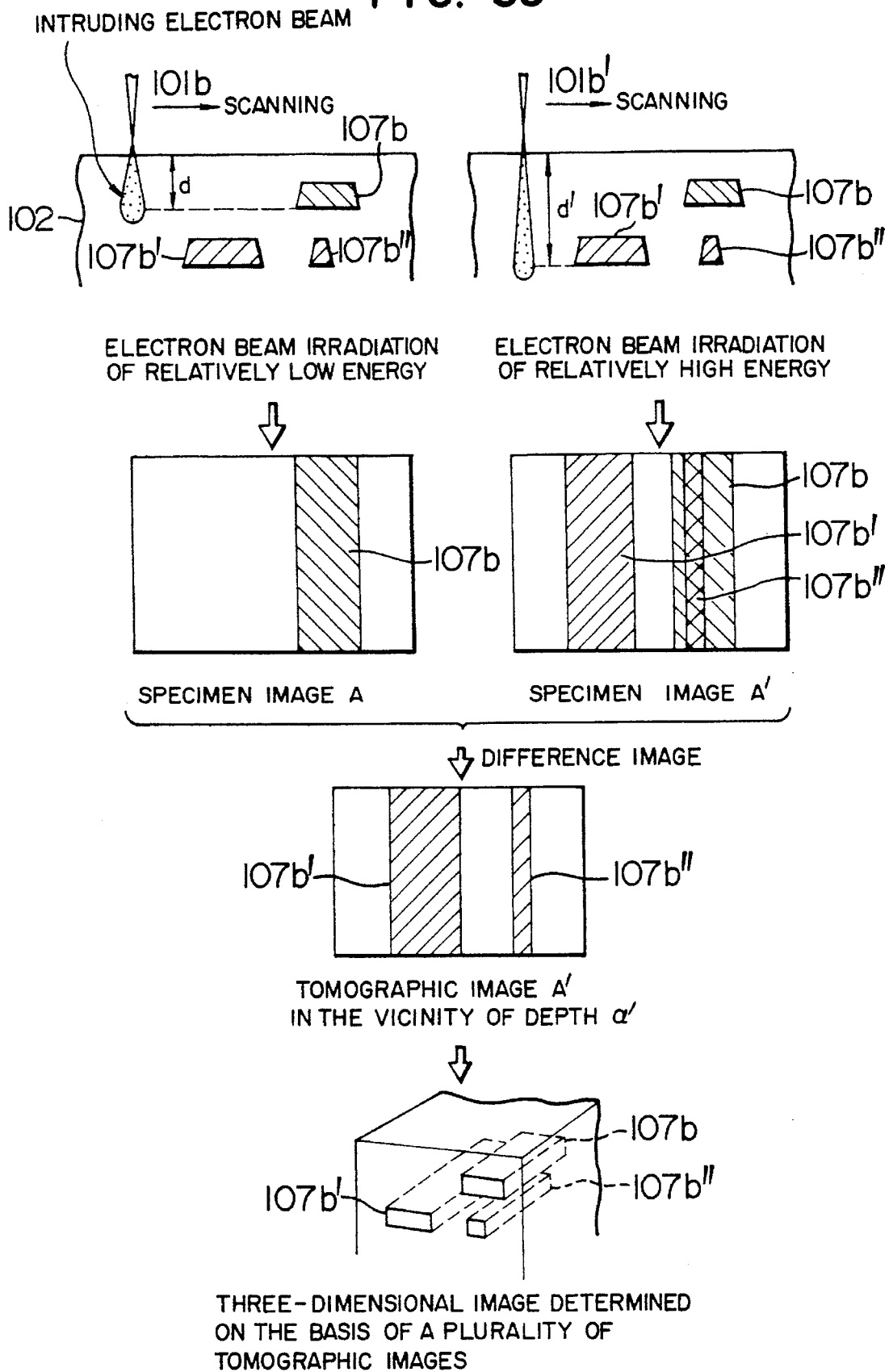
FIG. 35 is a conceptual diagram of an embodiment of observing a three-dimensional structure.

For example, an instance is considered where, as shown in FIG. 35, wiring patterns 107b, 107b' and 107b" are inside a specimen 102.

If the set acceleration voltage is relatively low and a scanning electron beam 101b intrudes to a depth d, reaching the vicinity of the wiring pattern 107b, the wiring pattern 107b can be seen in a specimen image A but the wiring patterns 107b' and 107b" located at deeper levels cannot be observed.

On the other hand, when a relatively high acceleration voltage is applied and the electron beam 101b' intrudes to a depth d', reaching the wiring patterns 107b' and 107b", the wiring patterns 107b' and 107b" can be observed in a specimen image A' obtained.

Accordingly, by preparing a difference image between the specimen images A' and A, a tomographic image A' in the vicinity of the depth d', that is, images of only the wiring patterns 107b' and 107b" can be obtained. By combining a plurality of tomographic images obtained in this manner, a three-dimensional configuration inside the specimen can be obtained.

Usually, the signal level and the degree of contrast are different for the specimen images A and A'. Therefore, in order to obtain a highly accurate difference signal, the signal level and contrast degree of the specimen image A must be overlapped with those of the specimen image A' in a pre-process.

Figure 36:
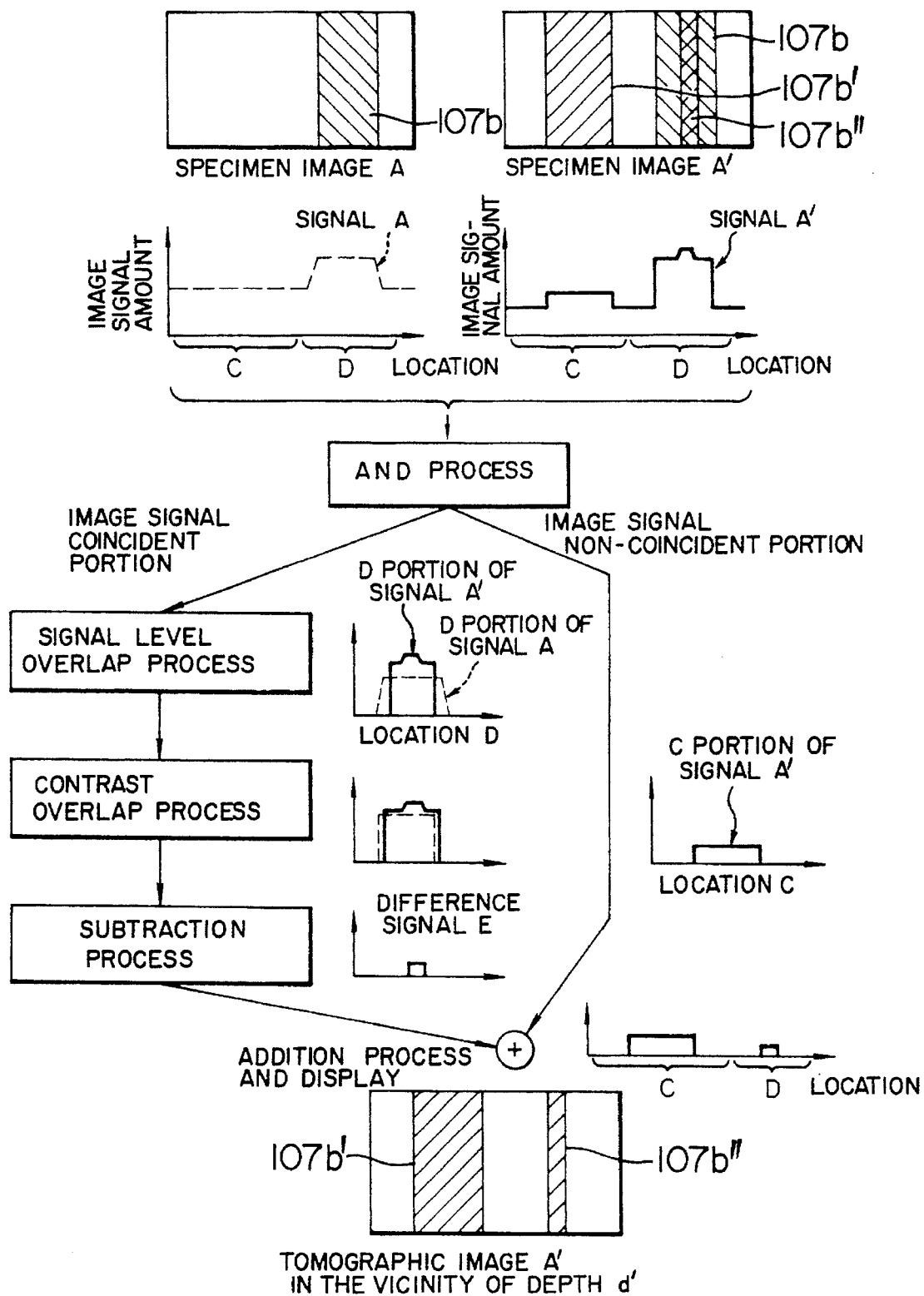
FIG. 36 is a conceptual diagram showing an embodiment of observing a sectional area of a pattern in a specimen.

FIG. 36 shows an example of the pre-process needed for determination of a difference signal. Image signals of the specimen images A and A' are first ANDed. In the AND process, each pixel of the image A is compared with each pixel of the image A' to determine the presence of an image, to provide a portion C where an image signal of only the A' image exists and a portion D where signals of both the A and A' images exist. In this case, the portion C corresponds to the wiring pattern 107b' and is used to provide a signal indicative of a tomographic image.

On the other hand, in the portion D, a signal level overlap process and a contrast overlap process are effected and then subtraction is carried out between the overlapped signal levels and between the overlapped contrast degrees. A difference signal E obtained by the subtraction corresponds to the wiring pattern 107b" and is used in combination with the signal at the portion C to provide a signal indicative of the tomographic image A'.

In the embodiments shown in FIGS. 35 and 36, the incident energy of the primary beam is changed. Additionally, by changing the incident angle of the primary beam as shown in FIGS. 25 and 26, a tomographic image or a three-dimensional image of the pattern can be formed with higher accuracy.

When a semiconductor device is irradiated with the electron beam, there arises a problem that the device is damaged by the irradiation. The irradiation damage degrades characteristics of the device, and therefore it is necessary that the damage should be mitigated or a damaged portion should be recovered.

Figure 37:
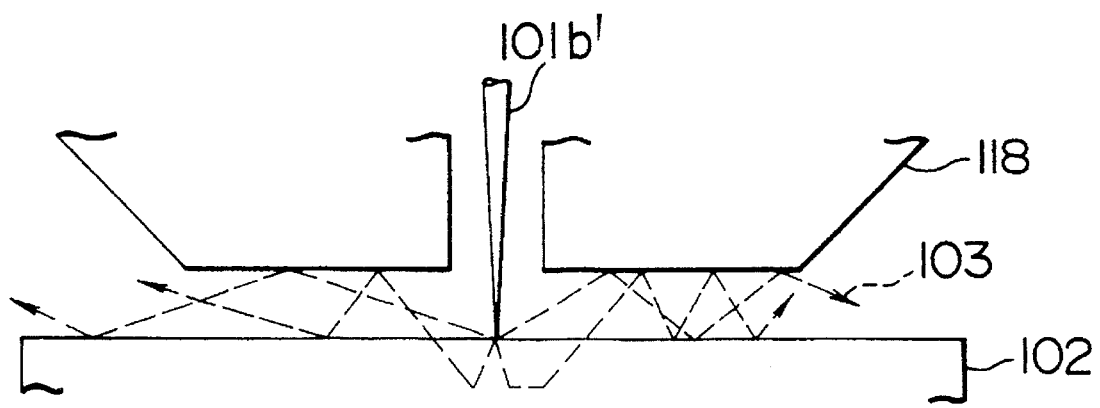
FIG. 37 is a conceptual diagram showing an example of multiple scattering of reflection electrons.

The causes of the irradiation damage have been studied to find that reflection electrons 103 of high energy undergo multiple scattering, as shown in FIG. 37, in a space between the specimen 102 and the underside of the objective lens 118 arranged above the specimen. The multiple scattering is a major cause of heavy damage.

Figure 38A:
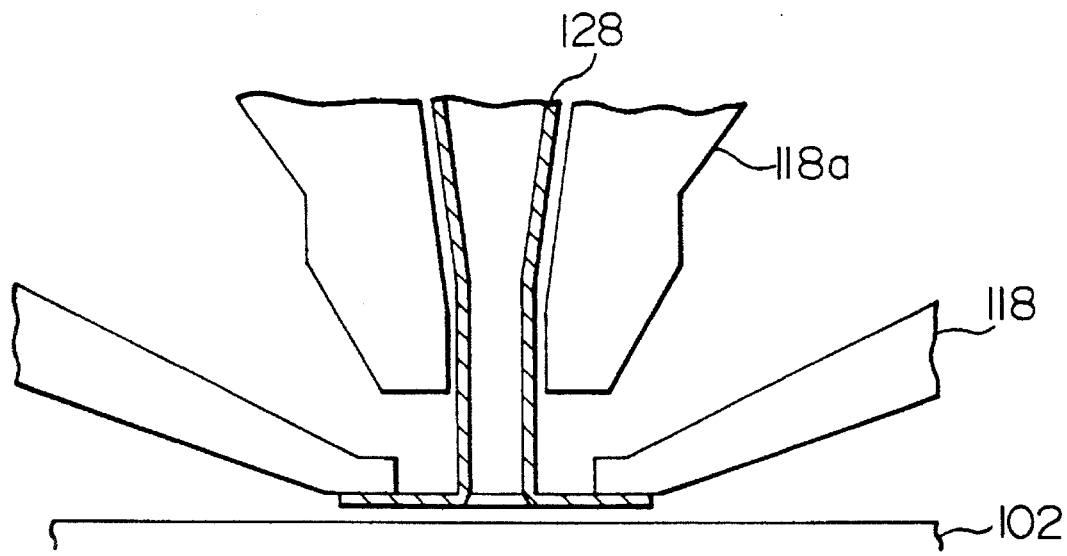
FIG. 38A is a sectional view showing the construction of a prior art objective lens.
Figure 38B:
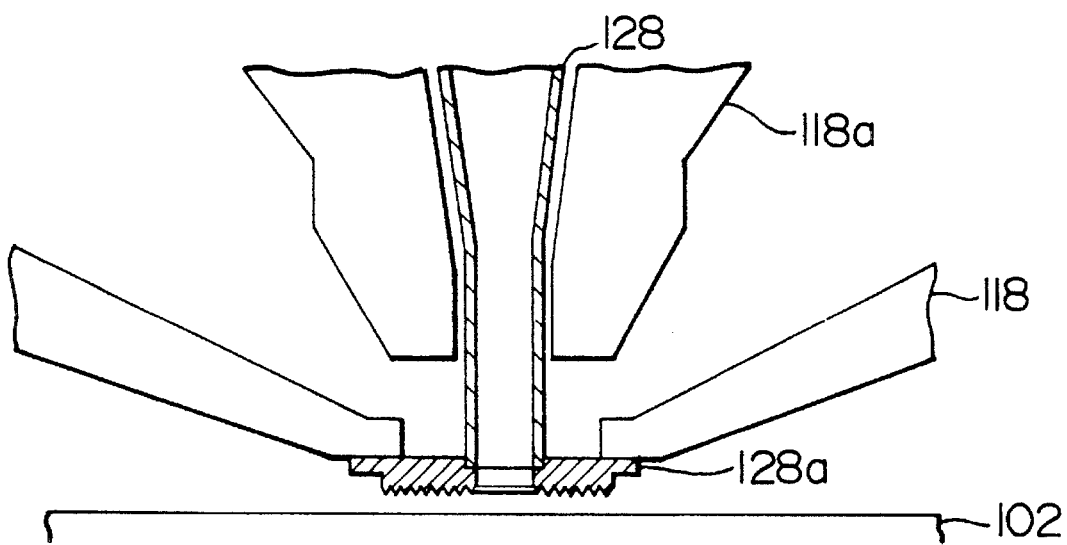
FIG. 38B is a sectional view showing the construction of an embodiment of an objective lens.

FIGS. 38A and 38B show enlarged sectional views of a specimen and an objective lens portion and are useful to study countermeasures against the multiple scattering of reflection electrons.

Conventionally, as shown in FIG. 38A, a vacuum shield pipe 128 made of phosphor bronze passes through an electron beam path defined by an upper pole piece 118a and a lower pole piece 118b of the objective lens. However, phosphor bronze has a large reflection coefficient and is liable to cause the multiple scattering.

FIG. 38B shows a technique of suppressing the multiple scattering of reflection electrons. A specimen-opposing portion 128a of vacuum shield pipe 128 facing the specimen 102 is made of carbon, which is a light element having a small reflection coefficient for electrons. The specimen-opposing portion 128a has a sawtooth-shaped sectional form, which inhibits multiple scattering of reflection electrons.

The material of the specimen-opposing portion 128a may also be a light metal material such as aluminum. The sawtooth-shaped form is not limitative and the portion 128a may have a different non-flat form, such as a comb form.

As for recovery of a portion suffering an irradiation damage, it has been confirmed that the threshold value of a MOS device shifted under the irradiation of an electron beam during observation can recover by annealing with hydrogen at 450° C. After observation, the specimen must be annealed in accordance with its application. Most preferably, the anneal process is performed immediately after observation of the specimen.

The annealing function can be fulfilled by using a heating mechanism provided to the specimen stage 121, a heating mechanism additionally provided to the loader/unloader chamber 120 or a separate unit. Heating may be of the resistance-heating type or the lamp-heating type, and a gas such as hydrogen or nitrogen may be admitted to an annealing process unit.

While the foregoing embodiments use a system wherein the secondary electron detector 124 is arranged above the objective lens 118 and secondary electrons are collected by utilizing a magnetic field of the objective lens, a different system may alternatively be employed wherein a secondary electron detector is arranged under an objective lens to apply an electric field by means of which secondary electrons are detected.

In place of the scintillator and photomultiplier tube, a secondary-electron multiplier may be used as the secondary electron detector.

X-rays, photons or absorbed electrons, other than the secondary electrons, may be detected as the secondary information which is used as a signal.

Figure 39:
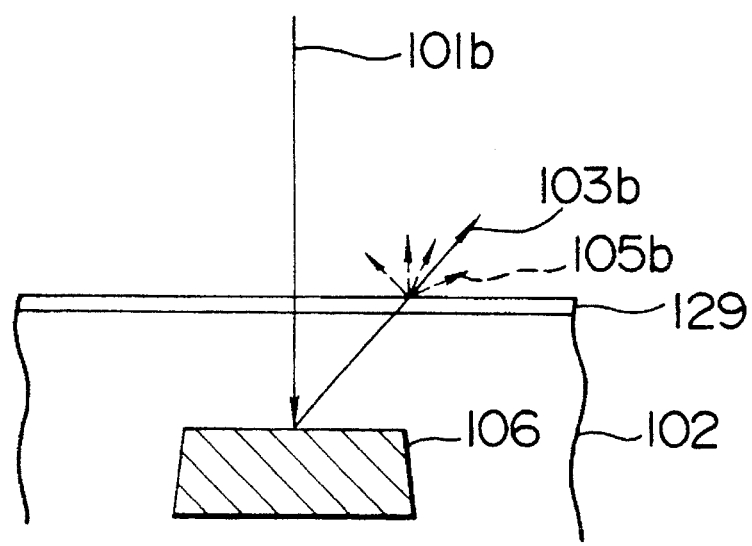
FIG. 39 is a schematic sectional diagram showing the construction and operation of the embodiment of a specimen.

In order to increase the signal amount of the secondary information, a substance liable to generate secondary electrons or fluorescence may be deposited or coated thinly on a specimen to be observed. FIG. 39 shows an example to this effect. An oxide material having a high secondary electron emission efficiency is deposited thinly on a specimen 102 to increase the number of secondary electrons generated by scattered electrons 103b. In an alternative, a fluorescent material substituting for the oxide material may be coated thinly on the specimen so that scattered electrons may cause the fluorescent material to generate fluorescence, which in turn is detected.

The specimen is not limited to a wafer, but any device built in a package may be used as a specimen.

Specimens have been described as treated in by lot, but this is not limitative and specimens may be treated sheet by sheet. The specimen has been described as mounted or dismounted manually by the operator, but instead it may be conveyed automatically to another processing unit.

Movement, rotation and inclination of a site of a specimen to be observed have been described as being effected by moving, rotating and inclining the specimen stage, but alternatively they can be accomplished by moving the irradiation position of an electron beam, rotating the electron beam irradiation area and inclining the electron beam irradiation direction.

In addition to an electron beam, other exciting beams such as an ion beam and a laser beam may be used as the particle beam.

In addition to scattered electrons, an electromagnetic wave may be used as the primary information for producing the secondary information.

The target specimen is not limited to a semiconductor device, but may be a photomask substrate, a display device, a wiring board, an optical disc, a metal material, a polymer material or a living body. With the aim of increasing contrast, such a light element as a living body can be dyed with a heavy metal.

Effects brought about by typical features of the present invention disclosed in the present application will be described briefly as follows.

According to the present invention, by utilizing the newly-found phenomena described above, conventionally-considered difficulties or impossibilities can be solved with ease. Beneficial applications will be exemplified below.

From the viewpoint of non-destructive observation, attainable advantages are: (1) structure, defects and foreign matter inside a specimen can be observed, (2) surface structures having greater and more precipitous unevenness than that observable with the prior art can be observed, (3) three-dimensional configurations of the surface and internal structures can be determined, (4) tomographic observation can be ensured, and (5) an electrically non-conductive material can be observed with higher resolution according to the present invention than in the prior art.

From the viewpoint of non-destructive inspection and measurement, attainable advantages are: (1) length and height of a pattern or structure formed inside a specimen or on the surface thereof can be measured, (2) particles, domains, bubbles and foreign materials present inside a specimen or on the surface thereof can be counted and measured, (3) pattern defects and foreign matter present inside a specimen or on the surface thereof can be inspected, (4) lapse of a change in the structure inside a specimen or on the surface thereof can be monitored on the spot, and (5) length can be measured with higher accuracy, and defects and foreign matter can be inspected with higher sensitivity in the present invention than in the prior art.

In defect inspection, work can be done more efficiently by using component analysis and defect correction.

When used in combination with another processing apparatus, the present apparatus can also be utilized as an in-line process monitor.

Further, since applications of the present techniques can solve impossibilities and difficulties, as previously considered, devices and parts of higher quality and higher reliability can be manufactured economically.

Another embodiment of the observing method will be described with reference to FIG. 40A. The previously-described scanning electron microscope can be used as an observing apparatus. Obviously, a charged particle beam may be used in place of an electron beam.

The observing method of the present embodiment is for providing such a superimposed display that a specimen image of a part of a specimen which is unseen in the direction of irradiation of an electron beam is superimposed on a specimen image of a part of the specimen which is seen in the direction of irradiation of the electron beam. In the observing method, an electron beam 202a for scanning a specimen 201 is irradiated thereon to interact with the specimen 201 to thereby generate secondary electrons 203 and secondary electrons 203a, and an image signal indicative of the secondary electrons 203 and an image signal indicative of the secondary electrons 203a are used to form a specimen image.

In this case, the electron beam 202a is used at a higher speed than an electron beam used in the prior art in order that a signal indicative of ordinary secondary electrons 203 and a signal indicative of secondary electrons 203a generated by reflection electrons scattered in the inside of the specimen 201 are employed as they are to provide a superimposed display of a specimen image of a part of the specimen which is unseen in the direction of irradiation of the electron beam 202a and a specimen image of a part of the specimen which is seen in the direction of irradiation of the electron beam 202a, and so can be displayed according to the prior art. The energy of the electron beam 202a is suitably selected in accordance with the material and structure of the specimen and may preferably be, for example, 50 KeV or more. More preferably, it may be 100 to 200 KeV.

Figure 40A:
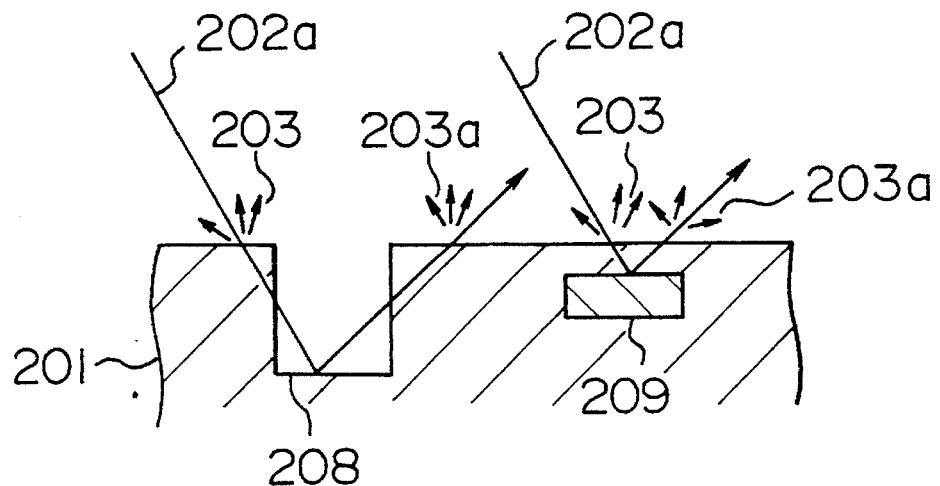
FIG. 40A is a sectional view showing the principle of signal detection in another embodiment of the observing method according to the invention.

In the specimen having the structure of FIG. 40A and made of silicon oxide, a hole has a diameter of 0.4 µm and a depth of 1.5 µm and an internal structure 209 is a line made of tungsten which is buried at a depth of 0.6 to 1.2 µm measured from the specimen surface. When such a specimen was irradiated with an electron beam 202a at 100 KeV, the specimen surface and the shapes of hole bottom 208 and line 209 could be observed at the same time.

The operation of the present embodiment will now be described by making a comparison with that of the prior art.

Figure 40B:
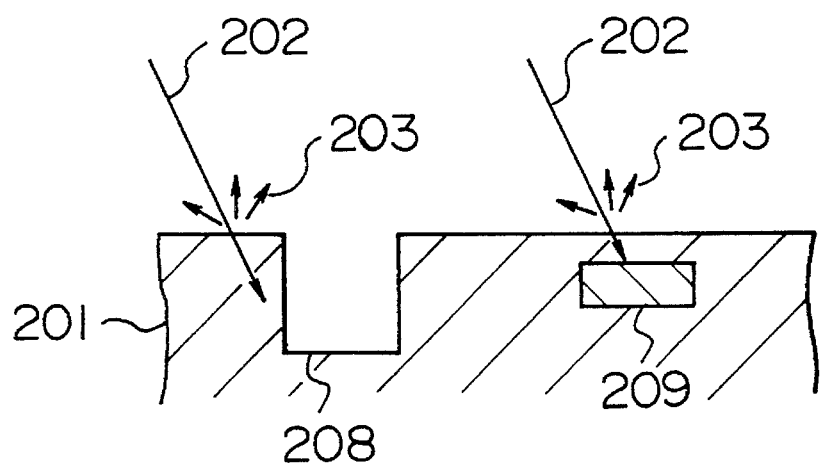
FIG. 40B is a sectional view showing a principle of signal detection in the prior art.

In the prior art, an electron beam 202 at a relatively low speed (typically at 0.5 to 20 KeV) is used and as a result, portions shaded from the electron beam take place as shown in FIG. 40B and secondary electrons 203a due to electrons reflected at the hole bottom 208 and internal structure 209, standing for the shaded portions, are not generated or are generated in a very small amount, making it impossible to observe images of these shaded portions.

In contrast, when an electron beam 202a at a high speed as in the present invention is used, the irradiated electrons have sufficient kinetic energy and as a result, the electron beam 202a can penetrate through the specimen 201, can be reflected at the hole bottom 208 and internal structure 209 and eventually can escape from the specimen 201, as shown in FIG. 40A.

In addition, upon departure from the specimen 201, a relatively large amount of reflection electrons generate secondary electrons 203a. The generation amount of the secondary electrons 203a depends on the amount and energy of the irradiated electron beam 202a. Since the electron beam 202a now reflected has information about the hole bottom 208 and internal structure 209, that is, test parts, images of the hole bottom 208 and internal structure 209 can be obtained by detecting an image signal indicative of the secondary electrons 203a.

More particularly, by detecting secondary electrons 203 and secondary electrons 203a generated by reflection electrons scattered in the inside of the specimen 201 in combination, a hole bottom part, a side wall part of a bank, a buried internal part or a conical hole part which is shaded from the electron beam 202a can be displayed in combination with such a specimen image as shown in FIGS. 41B, 42B, 43B or 44B which can be observed with the prior art, thereby permitting a display including a part unseen in the direction of irradiation of the electron beam 202a which is hatched in FIGS. 41C, 42C, 43C or 44C.

Referring now to FIGS. 45A, 45B, 46A, 46B, 47A and 47B, photographic examples of specimen images taken by the technique of the present invention will be described by making a comparison with conventional photographic examples taken with the scanning electron microscope.

In this case, the monochromatic (white/black) density is determined in accordance with generation amounts of secondary electrons 203 and 203a, and the larger the generation amounts of secondary electrons 203 and 203a, the lighter the photographed color becomes. Conversely, the smaller the generation amounts, the darker the photographed color becomes.

Figure 41A:
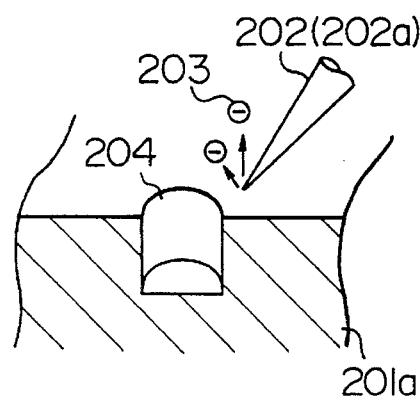
FIG. 41A is a perspective view, partly sectioned, of an essential part of a specimen having a hole structure.
Figure 41B:
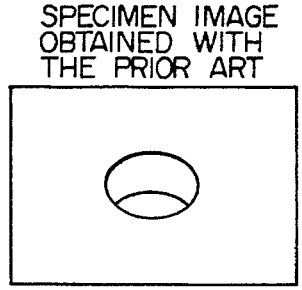
FIG. 41B is a diagram showing a specimen image obtained when the FIG. 41A specimen is observed according to the prior art.
Figure 41C:
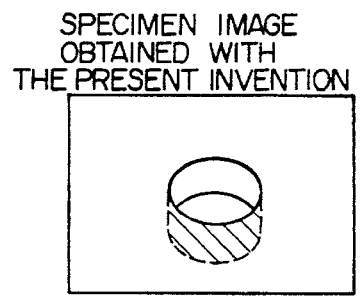
FIG. 41C is a diagram showing a specimen image observed according to the invention.

In obtaining the photographs shown in FIGS. 45A and 45B in connection with the specimen 201a having hole structure 204 corresponding to the structure of FIG. 41A, a hole in a resist of a resist pattern formed on a semiconductor wafer, for example, is observed with the scanning electron microscope.

In this case, with the prior art, an edge of the hole and a side wall portion which can be seen in the direction of irradiation of the electron beam are photographed in light color and the hole bottom and a resist portion surrounding the hole are photographed in dark color, as shown in FIG. 45A. The hole bottom part shaded by the hole wall from the electron beam cannot be displayed in a specimen image in this manner but according to the present embodiment, a specimen image combined with the concealed hole bottom part displayed in light color can be photographed as shown in FIG. 45B.

Figure 42A:
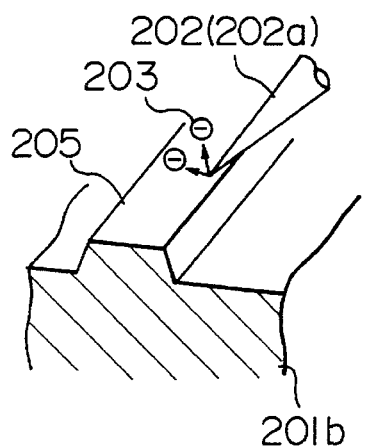
FIG. 42A is a perspective view, partly sectioned, of an essential part of a specimen having a bank structure.
Figure 42B:
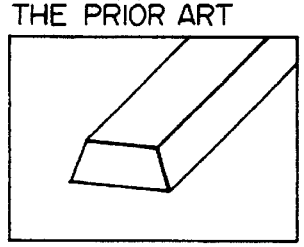
FIG. 42B is a diagram showing a specimen image obtained when the FIG. 42A specimen is observed according to the prior art.
Figure 42C:
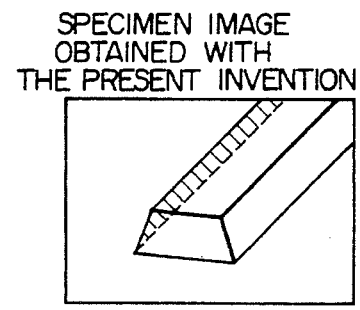
FIG. 42C is a diagram showing a specimen image observed according to the embodiment.
Figure 43A:
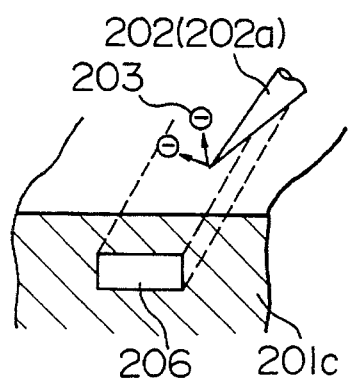
FIG. 43A is a perspective view, partly sectioned, of an essential part of a specimen having an internal structure.
Figure 43B:
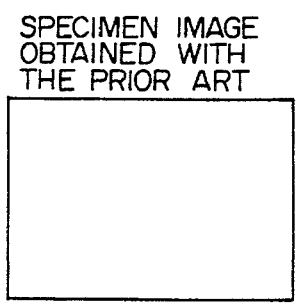
FIG. 43B is a diagram showing a specimen image obtained when the FIG. 43A specimen is observed according to the prior art.
Figure 43C:
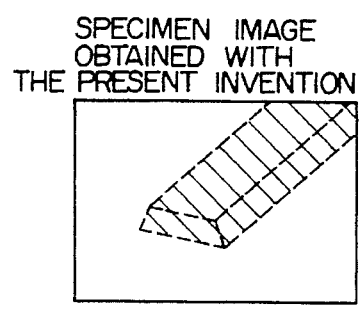
FIG. 43C is a diagram showing a specimen image observed according to the embodiment.
Figure 44A:
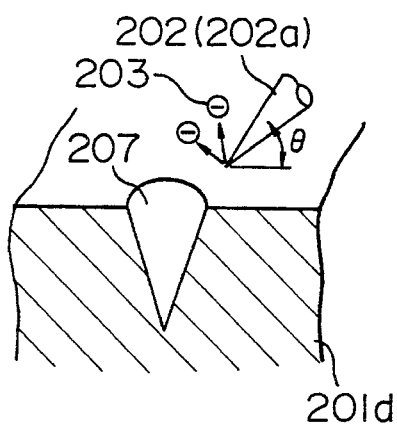
FIG. 44A is a perspective view, partly sectioned, of an essential part of a specimen having a conical hole structure.
Figure 44B:
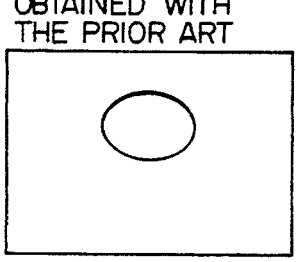
FIG. 44B shows a specimen image obtained when the FIG. 44A specimen is observed according to the prior art.
Figure 44C:
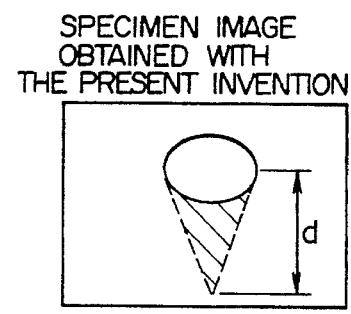
FIG. 44C shows a specimen image observed according to the embodiment.
Figure 46A:
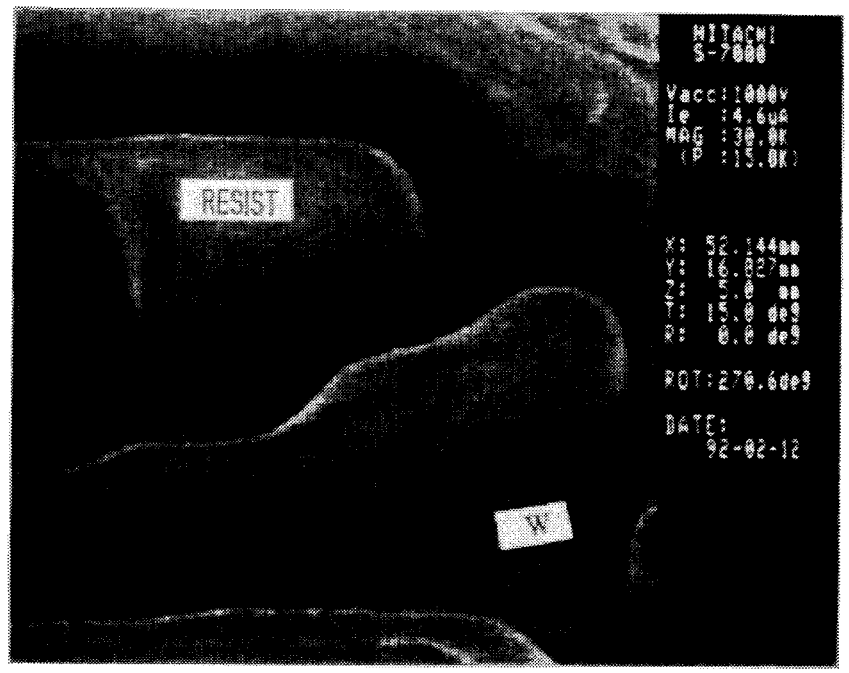
FIG. 46A shows an image photograph of a semiconductor wafer formed with a resist pattern which is photographed with the scanning electron microscope according to teachings of the prior art in connection with a specimen having a bank structure.
Figure 46B:
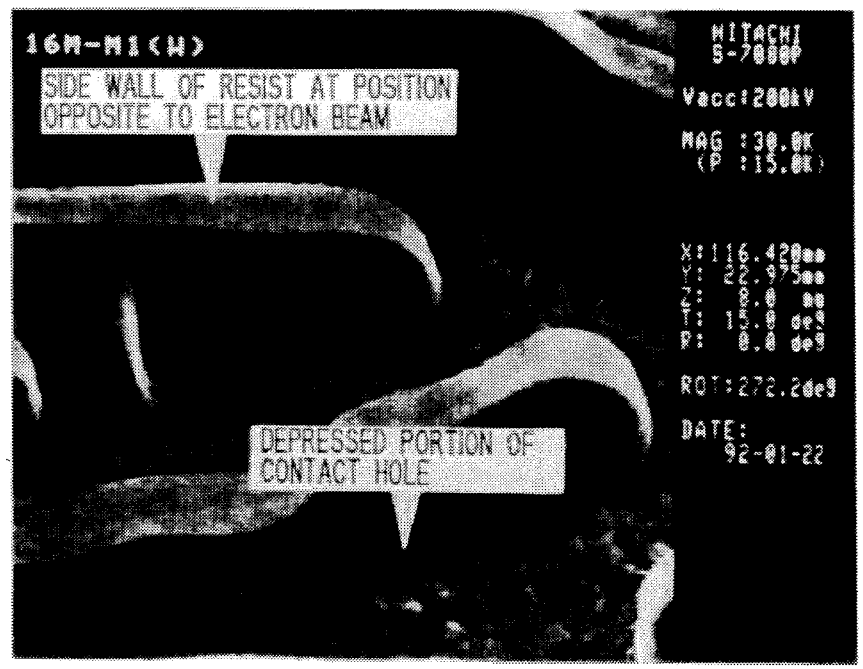
FIG. 46B shows an image photograph of the FIG. 46A semiconductor wafer photographed according to teachings of the present invention.

In connection with a specimen 201b having a bank structure 205 as shown in FIG. 42A, a semiconductor wafer formed with a resist pattern is observed as in the case of the photographs of FIGS. 45A and 45B to obtain a photograph as shown in FIG. 46B which demonstrates that a side wall of resist at a position opposite to an electron beam and shaded therefrom can be photographed and observed in lighter color as compared to a photograph of FIG. 46A taken with the prior art. Further, in the photograph of FIG. 46B, a depressed portion of a contact hole standing for an inner structure can be photographed in darker color than the surface resist portion.

Figure 47A:
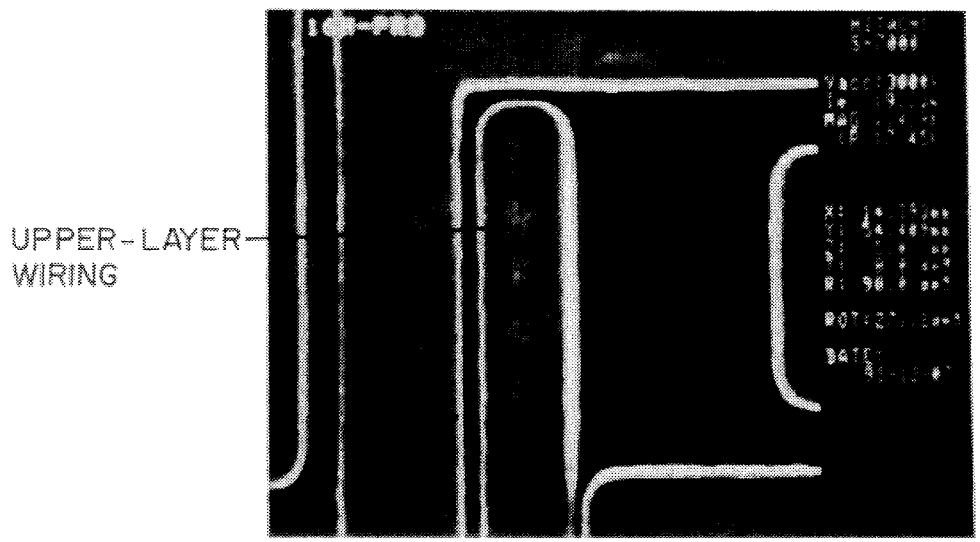
FIG. 47A shows an image photograph of a semiconductor wafer formed with wiring patterns which is photographed with the scanning electron microscope according to teachings of the prior art in connection with a specimen having an internal structure.
Figure 47B:
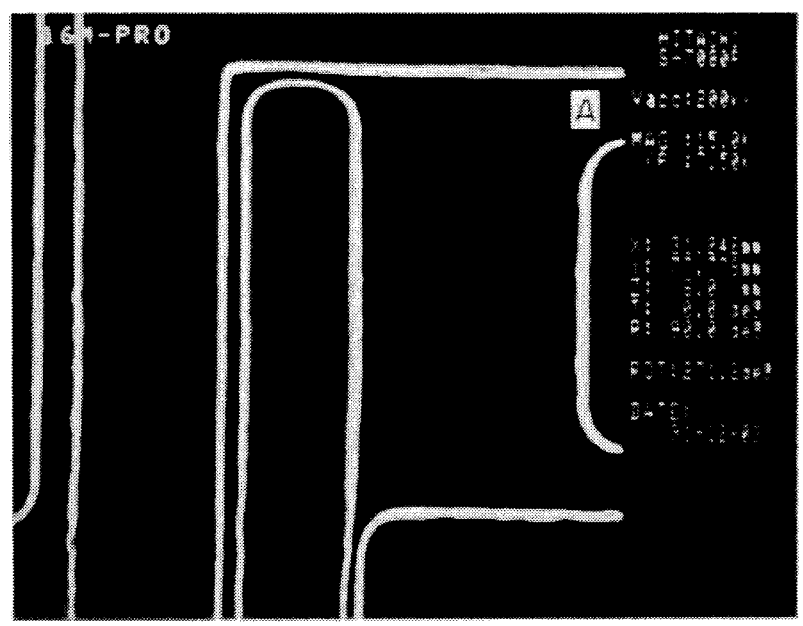
FIG. 47B shows an image photograph of the FIG. 47A semiconductor wafer photographed according to teachings of the present invention.

A wiring pattern having, for example, a two-layer wiring structure is photographed to obtain photographs as shown in FIGS. 47A and 47B. In the photograph of FIG. 47A taken with the prior art, only a side wall of surface wiring is photographed in light color but an internal structure cannot be photographed in dark and light color and the presence of an internal structure cannot even be inferred. In the present embodiment, however, as shown in FIG. 47B, even the undersurface wiring buried internally can be photographed in lighter color than its surroundings and can be observed in combination with the surface upper-layer wiring.

Observation conditions for the photograph shown in FIG. 47A are as follows: acceleration voltage: 3 keV; emission current: 10 μA; magnification in observation (magnification on photograph):×15K (×6.35); inclination of specimen: 0°; and working distance: 5 mm (minimum). Thereby, the shape of a PRO layer is only observed. The shape observed shows ups and downs reflecting a wiring M2 (see FIG. 47C).

Figure 47C:
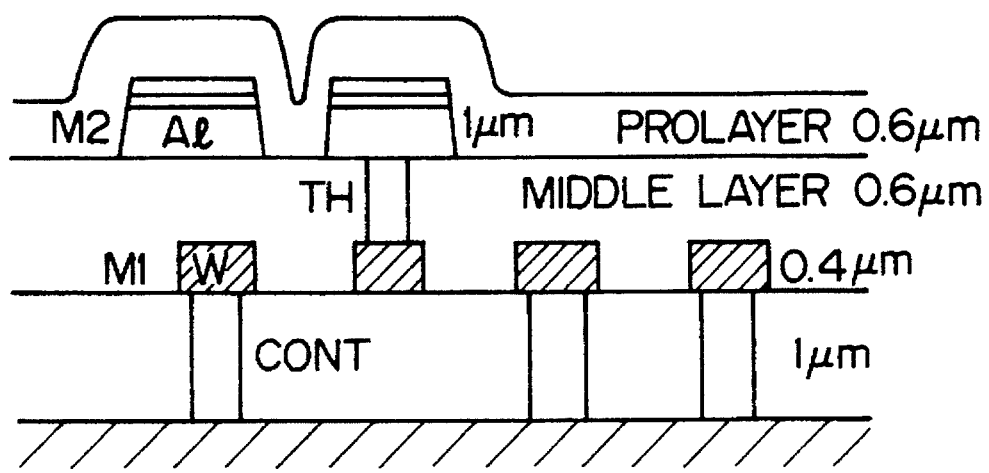
FIG. 47C shows a schematic sectional view of the semiconductor wafer of FIG. 47B.

Observation conditions for the photograph shown in FIG. 47B are as follows: acceleration voltage: 200 keV; emission current: 10 μA; magnification in observation (magnification on photograph):×15K (×7.5); inclination of specimen: 0°; and working distance: 8 mm (minimum). Thereby, the shape of a PRO layer is observed. The shape observed shows ups and downs reflecting the wiring M2. Furthermore, FIG. 47C shows shapes of the wiring M2, a wiring M2 in a middle layer, and holes of CONT that are observed. It is difficult to observe the shape of a hole right under the wiring M2.

Thus, in accordance with the image display method of the present embodiment, by using as they are a signal indicative of ordinary secondary electrons 203 and a signal indicative of secondary electrons 203a due to reflection electrons scattered in the inside of a specimen 201 under the application of an electron beam 202a at a very high speed, a specimen image of a specimen part which is unseen in the direction of irradiation of the electron beam 202a can be displayed while being superimposed on a specimen image of a specimen part which is seen in the direction of irradiation of the electron beam 202a and so can be displayed with the prior art, thereby making it possible to observe a display including the part which cannot be seen with the conventional method.

The image observing method of the present embodiment has been described as being exemplified such that a signal indicative of secondary electrons 203a due to reflection electrons scattered in the inside of a specimen 201 is used, as it is, as an information source for displaying a part which is unseen in the direction of irradiation of an electron beam 202a, but the present invention is in no way limited to the foregoing embodiment and may also be applied widely to other methods as described below.

More particularly, in the case where an image signal indicative of reflection electrons or X-rays generated from a specimen under the application of an electron beam is utilized as an information source for displaying an unseen part as in the foregoing embodiment, a method may be employed wherein the signal indicative of reflection electrons or X-rays is processed and then used for image display.

In this case, in addition to, for example, a specimen image due to ordinary secondary electrons, an image due to X-rays may be fetched, the two images are compared with each other to calculate information about a concealed part such as an internal structure, and the thus calculated information may be displayed while being superimposed on the image due to ordinary secondary electrons. Further, secondary electrons resulting from interaction of X-rays or secondary electrons generated from a test part such as hole bottom 208 or internal structure 209 with the surface of a specimen may be used to form an image, and this image may be superimposed on a surface image of the specimen.

Further, a method may be employed wherein design information such as pattern/structure data of LSI is used as an image signal. For example, as shown in FIG. 48, pattern data concerning a specimen and device structure information are previously stored in a data base (memory 210), information about the observing direction/position, inclination and area of an image observing field is detected by a controller 214 when performing observation with a scanning electron microscope 215, and the data are read out of the data base 210 and subjected to computer graphic processing by means of an image generator 212. A graphic image thus obtained is superimposed on an image produced from the scanning electron microscope 215 by means of a composer 213 and displayed on a display 216. In this case, the irradiation energy of an electron beam in the scanning electron microscope 215 is determined for exclusive use in observation of the specimen surface and is of 0.5 to 20 KeV.

Furthermore, when performing display of the specimen image as above, display of the concealed part may be characterized by, for example, color display or contour display.

While in the foregoing description, the present invention has been described as being applied mainly to the scanning electron microscope used for fabricating semiconductor wafers, it is not limited thereto and may also be applied widely to related apparatus or similar apparatus using a scanning electron microscope and to all of the fields utilizing these apparatus; especially, the invention may be applied preferably to the case where observation of a specimen inclusive of a part thereof which is unseen in the direction of irradiation of an electron beam is needed.

Briefly, effects brought about by the present embodiment are as follows.

More particularly, by providing a superimposed display of a specimen image of a specimen part which is seen in the direction of irradiation of an electron beam and a specimen image of a specimen part which is unseen in the direction of irradiation of the electron beam, a part which cannot be observed using only an ordinary secondary electron image can be displayed, and therefore a greater amount of information, including, for example, three-dimensional shapes and three-dimensional sizes, can be obtained.

Consequently, a display method for a specimen image in a scanning electron microscope can be provided which can visualize a part conventionally unseen by the scanning electron microscope and can widen and deepen knowledge obtained from a specimen image.

Figure 49:
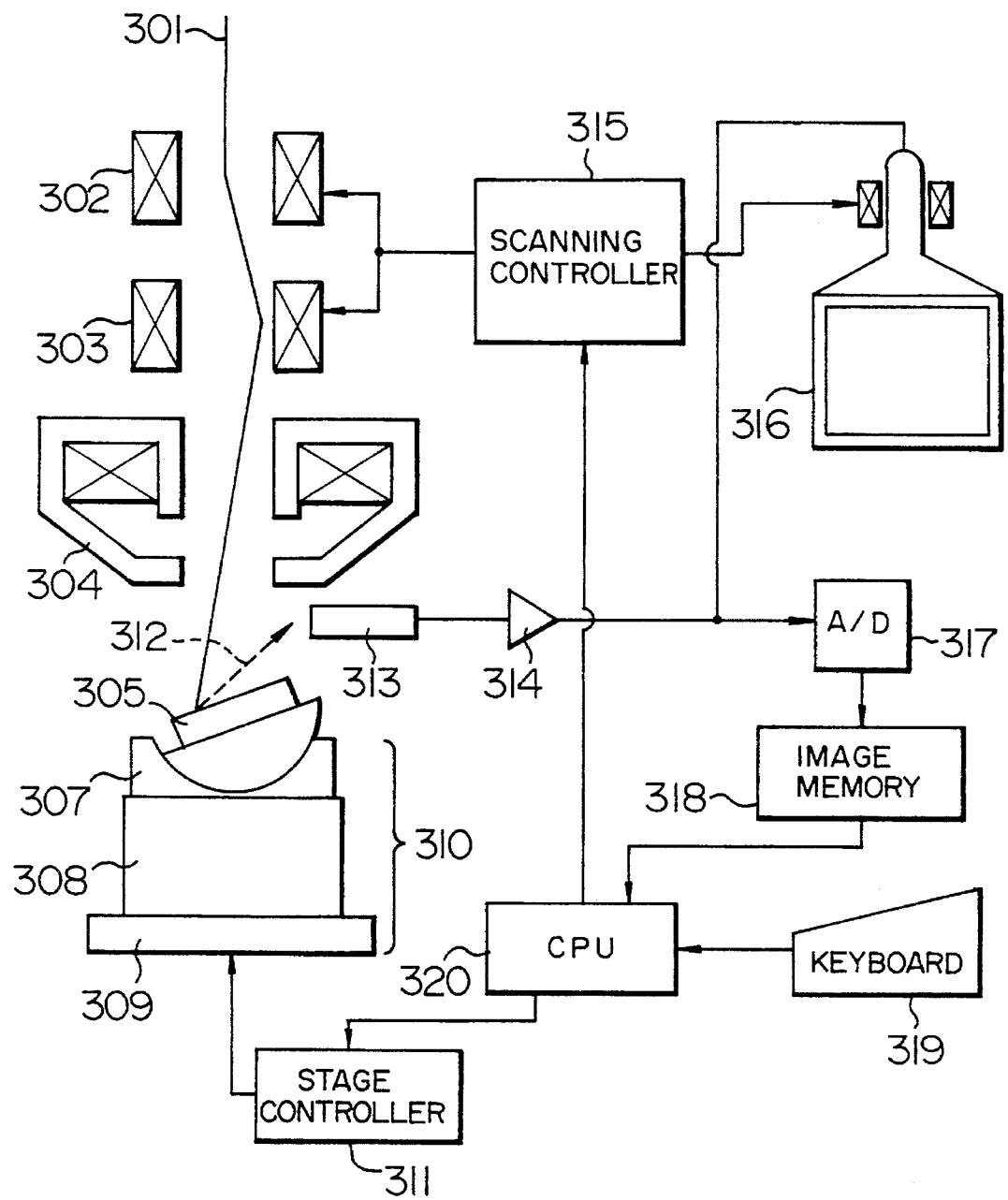
FIG. 49 is a block diagram showing the construction of an artical dimension measurement SEM for length measurement according to another embodiment of the present invention.

FIG. 49 shows, in block form, a scanning electron microscope according to another embodiment of the present invention. The scanning electron microscope has all components of the conventional scanning electron microscope, but only components necessary for explaining the present invention are depicted in the figure.

An electron beam 301 of high energy emitted from an electron source (illustration of the electron source as well as the accelerating electrode, condenser lens and the like is omitted) is deflected by an upper scanning coil 302 and a lower scanning coil 303 which are controlled by a scanning controller 315, so as to be raster-scanned on a specimen 305 after having passed through the lens center of an objective lens 304. A CPU 320 suitably sets an output of the scanning controller 315 on the basis of a magnification inputted in advance from a keyboard 319 to determine a range for the electron beam 301 to be scanned on the specimen 305.

The specimen 305 is carried on a specimen stage 310 comprised of an X inclining stage 307, a Y inclining stage 308 and an XY moving stage 309, and the specimen stage 310 is controlled by a stage controller 311 so as to be driven in respective directions. Secondary electrons 312 generated from the surface of the specimen 305 during scanning of the electron beam 301 are detected by a secondary electron detector 313 and amplified by a video amplifier 314. A thus-amplified secondary electron signal is inputted to a scanning image display unit 316 as a brightness modulation signal for the scanning image display unit 316 which is scanned in synchronism with the electron beam 301 to provide a scanning image displayed on the screen.

The secondary electron signal amplified by the video amplifier 314 is, on the other hand, converted by an A/D converter 317 into digital data which in turn is stored in an image memory 318. When the CPU 320 reads image data from the image memory 318, it recognizes a position of an object subject to length measurement by utilizing known pattern recognition techniques, and performs an article dimension measurement operation on the basis of a result of detection of an edge at that position and the aforementioned enlargement magnification. In other words, a distance between detected edges is measured.

The specimen stage 310 described hereinbefore preferably does not include any rotation mechanism but in the case where a rotation mechanism is included, a rotation angle may be reflected on a three-dimensional model. In such a rotation mechanism, at least one of the specimen stage and the scanning direction is rotated in relation to the other. For example, as hardware for generating an electron beam of high energy, a TEM (type: HF-2000) offered by Hitachi, Ltd., can be utilized, and as the other hardware and software for image formation and length measurement, an article dimension measurement SEM (type: S-6280) offered by Hitachi, Ltd., can be utilized.

In the present embodiment, by using an electron beam of high energy, a portion which cannot be observed with the low acceleration SEM can be observed, thereby ensuring that the length of an object whose length has not been measured in the past or that of an object whose length could not be measured without suffering from a large measurement error can be measured with high accuracy. Preferably, the accelerating voltage for the electron beam is set to 50 keV or more, and more preferably, to 100 to 200 keV. In place of the electron beam, another charged particle beam such as an ion beam can be used.

Figure 50:
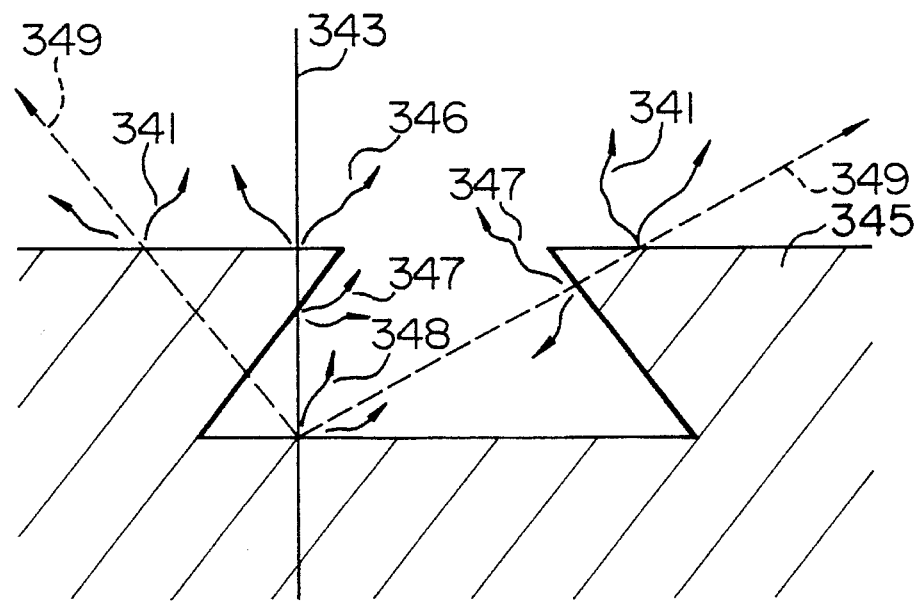
FIG. 50 is a sectional view for conceptually showing interaction between an electron beam and a specimen having an inverted taper surface.

Referring now to FIG. 50, an observing method employing a high-energy electron beam will be described. As will be seen from the figure, in a contact hole formed in the surface of a substrate and having an inverted taper form, the entirety of contour of the bottom of the contact hole cannot be observed at a time even when the specimen is inclined in various ways. More particularly, even when the diameter of the bottom is desired to be measured, one of article dimension measuring start and end points is always blocked visually by another portion of the specimen as viewed in a direction of irradiation of the electron beam, so that the start and end points cannot be viewed simultaneously, thus making it impossible to perform the article dimension measurement.

However, when an electron beam 343 of high energy is irradiated, secondary electrons 346 are generated from the surface of a substrate 345, secondary electrons 347 are generated from the side wall of a contact hole, and secondary electrons 348 are generated from the bottom surface of the contact hole by the electron beam 343 which has transmitted through a portion of the substrate and irradiated the bottom surface. Further, reflection electrons 349 generated from the bottom surface impinge on the side wall to generate secondary electrons 347 and leave the surface while generating secondary electrons 341 from the surface. On the other hand, when an electron beam irradiates a surface portion which is clear of the taper portion, only secondary electrons 346 are generated from the surface portion. With an electron beam 343 irradiated directly on the bottom surface, reflection electrons generated from the bottom surface produce signals indicative of secondary electrons 347 generated from the side wall and secondary electrons 341 generated from the surface.

Figure 51:
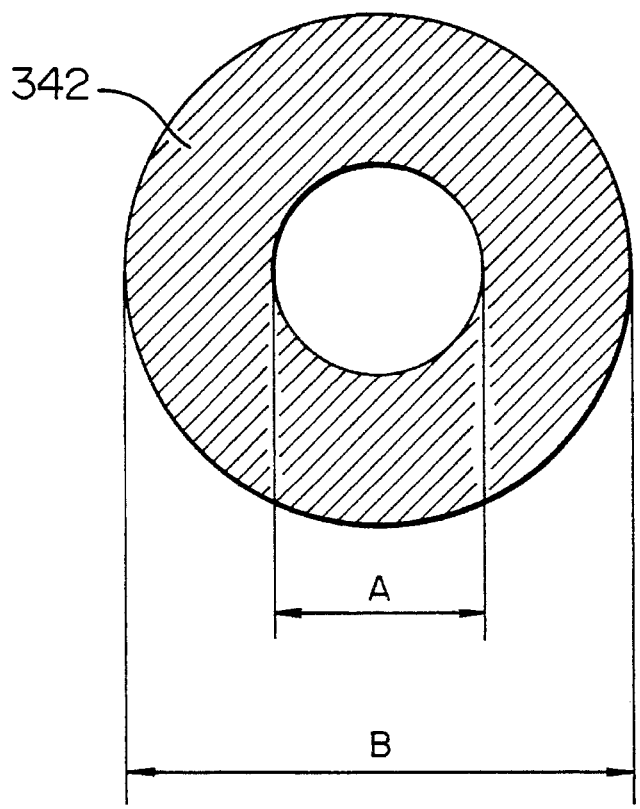
FIG. 51 is a conceptual diagram of an image of the FIG. 50 specimen obtained with the artical dimension measurement SEM of the FIG. 49 embodiment.

Comparison of signals generated from the substrate surface, the hole bottom surface, and the taper portion of the hole side surface, shows that a signal generated from the taper portion is of the highest intensity and, therefore, when the contact hole in the form of an inverted taper is observed using an electron beam of high energy, the taper portion is observed as a light ring 342 as shown in FIG. 51. Accordingly, direct measurement of a diameter A of the top surface and a diameter B of the bottom surface can be ensured.

Figure 52:
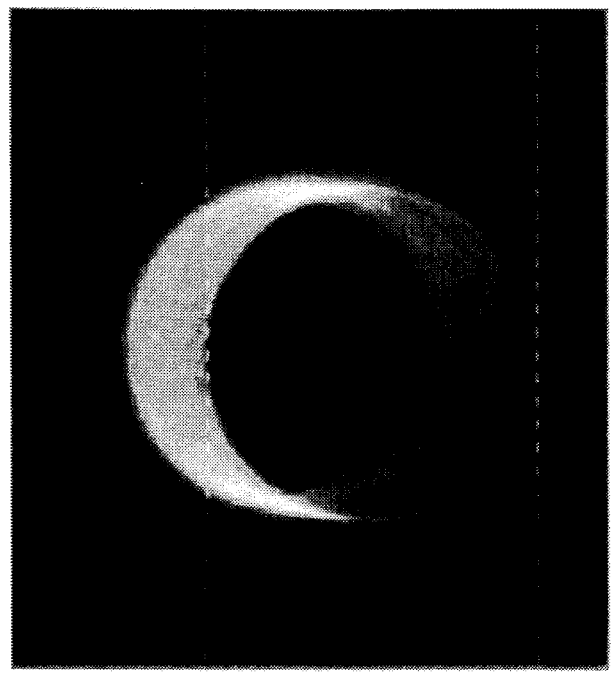
FIG. 52 shows a specimen image obtained with the artical dimension measurement SEM of the FIG. 49 embodiment, along with an indication of a pair of line cursors adapted to prescribe a range of the article dimension measurement.

When the present embodiment is applied, a scanning image as shown in FIG. 52 can be observed, demonstrating that the contour of the bottom, which could not be observed with the low acceleration SEM, can be observed.

Figure 54:
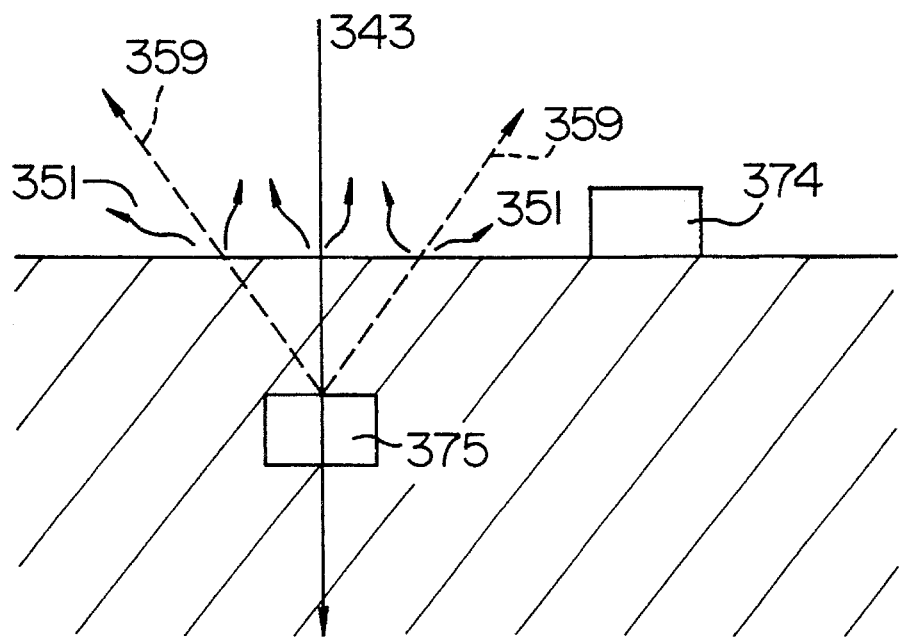
FIG. 54 is a sectional view for conceptually showing interaction between an electron beam and a specimen containing an internal isolated line.
Figure 55:
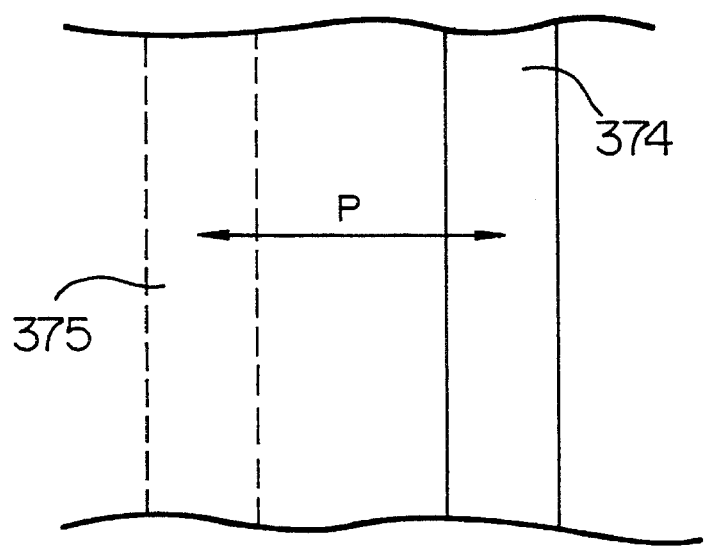
FIG. 55 is a conceptual diagram of an image of the FIG. 54 specimen obtained with the artical dimension measurement SEM of the FIG. 49 embodiment.

Referring to FIG. 54, when an electron beam 343 of high energy is irradiated on a specimen having an exposed wiring line 374 provided on the surface of a substrate and a wiring line 375 embedded in the substrate, the electron beam 343 reaches the embedded wiring line 375 to generate reflection electrons 359 thereat and the reflection electrons generate secondary electrons 351 from the surface. Accordingly, by detecting the secondary electrons 351 generated from the surface, the embedded wiring line 375 can be observed. In addition, since the wiring line 374 on the surface can be observed with ease, measurement of a distance P between the wiring line 374 on the surface and the embedded wiring line 375, which has hitherto been impossible to achieve, can be permitted. See FIG. 55.

Figure 53:
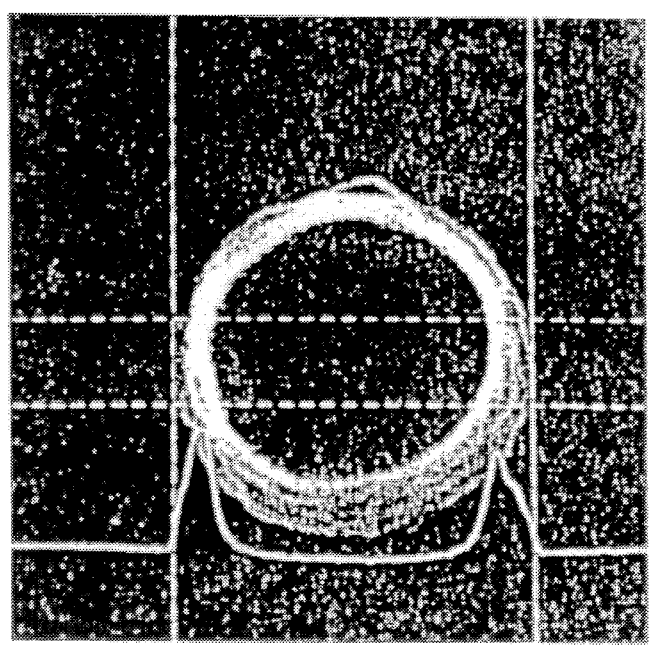
FIG. 53 shows an image of a specimen, which has an inverted taper surface and contains an isolated line, obtained with the artical dimension measurement SEM of the FIG. 49 embodiment, along with an indication of a line profile of signal intensity.
Figure 56:
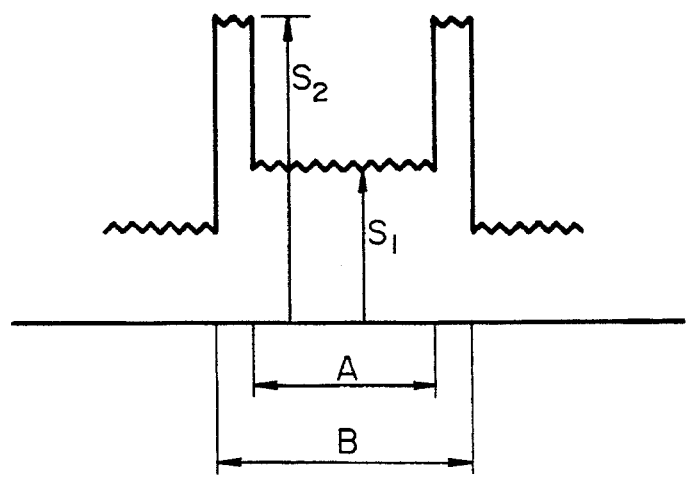
FIG. 56 is a conceptual diagram showing a line profile of signal intensity in an image of a specimen having a taper surface and containing an isolated line.
Figure 57A:
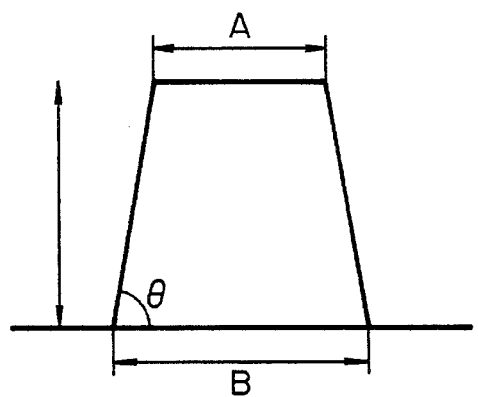
FIGS. 57A and 57B are sectional views showing an isolated line having a non-inverted taper surface and another isolated line having an inverted taper surface, respectively.
Figure 57B:
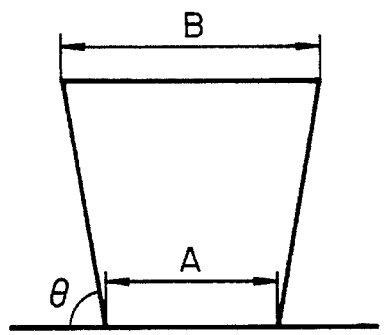

When an isolated line of a resist pattern has a side surface of an inverted taper form and is irradiated with a high-energy beam, a scanning image and a line profile signal as a result of measurement of signal intensity carried out along the isolated line are obtained as shown in FIG. 53. Illustrated in FIG. 56 is a typical example of the line profile signal obtained by measuring the signal intensity across the isolated line of a resist pattern having a side surface of an inverted taper form. In this case, amounts of secondary electrons generated from the top surface, S1, and of secondary electrons generated from the side surface, S2, differ from each other and, therefore, if the cross-sectional shape of the wiring pattern is known to be either trapezoidal as shown in FIG. 57A or inverted trapezoidal as shown in FIG. 57B, geometrical dimensions of individual portions can be calculated.

Figure 58:
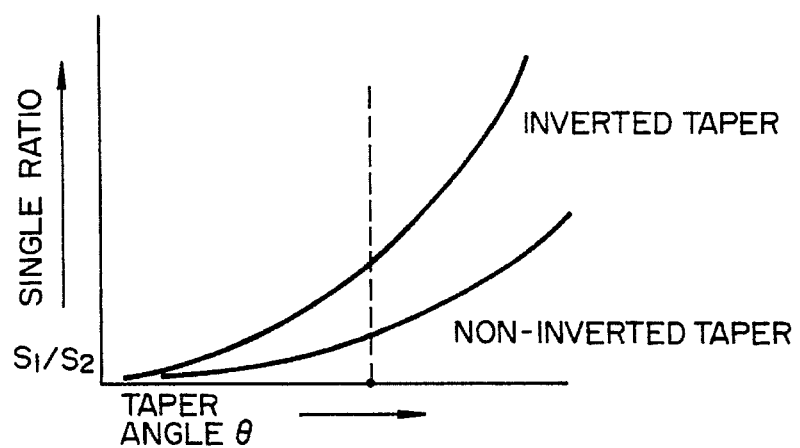
FIG. 58 is a graph showing a ratio of intensity between signals indicative of an inverted taper surface and a non-inverted taper surface.

In experiments conducted by the inventors of the present invention, the relation between a taper angle θ and a signal ratio (S2/S1 in FIG. 56) in the case of the non-inverted taper side surface, is compared with that in the case of the inverted taper side surface to indicate that the signal ratio is larger in the latter case than in the former case as shown in FIG. 58. Hence, by simply making reference to the line profile as shown in FIG. 56, a cross-sectional shape of the wiring pattern can also be recognized.

Figure 59B:
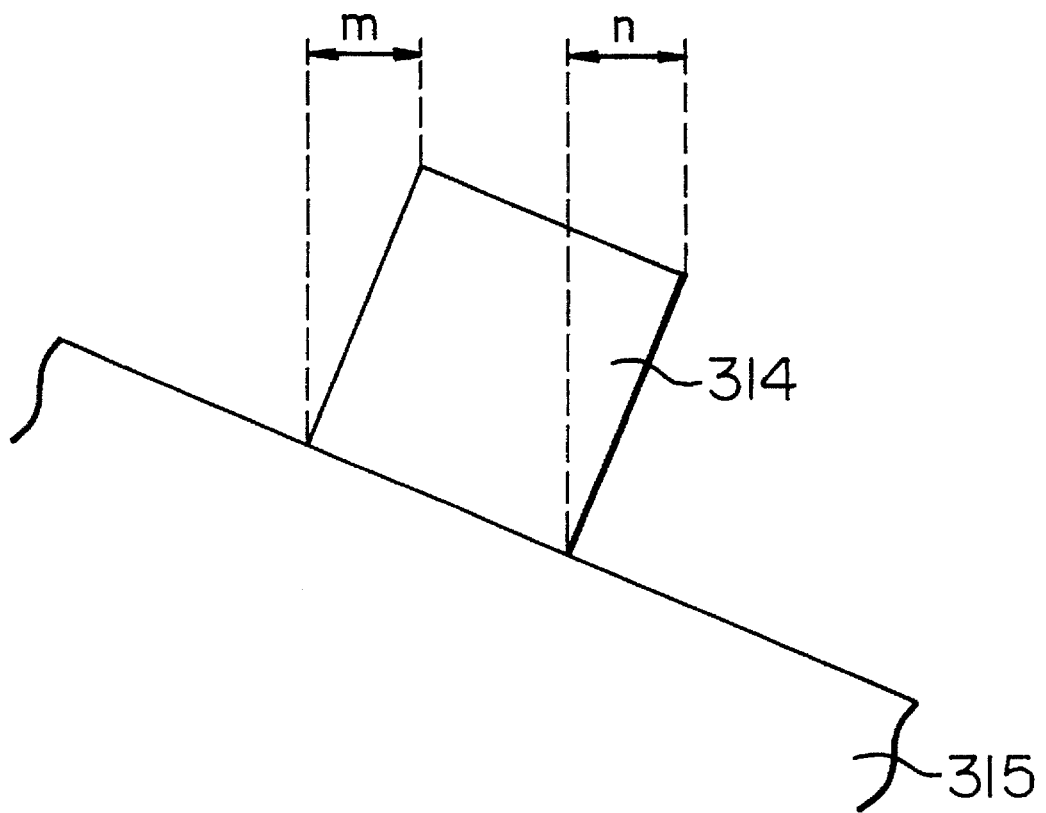
FIG. 59B is a diagram showing an inclined pattern of the rectangular parallelepiped having a rectangular cross-section.

Referring now to FIG. 59A, there is seen an example of a scanning image obtained when a pattern of a rectangular parallelepiped having a rectangular cross-section is inclined (see FIG. 59B) and observed. With an electron beam of high energy is irradiated, amounts of secondary electrons generated from the top, bottom and side surfaces are different from each other and the boundary line between adjacent surfaces can therefore be recognized. Accordingly, the height of a wiring pattern can be calculated from widths of the both side surfaces and an inclination angle of the specimen stage.

A line profile signal obtained in this case indicates that a secondary signal generated from the right side surface in the picture is larger than that generated from the left side surface and, as will be seen from the experimental results shown in FIG. 58, it can also be recognized that the right side surface corresponds to an inverted taper portion and the left side surface corresponds to a non-inverted taper portion.

According to the present embodiment, an electron beam reaches a depth in a specimen, and a scanning image of a portion which is exposed to the specimen surface but is visually blocked by another portion when viewed in a direction of irradiation of the electron beam, or a scanning image of a portion which underlies another portion so as to be prevented from being exposed to the specimen surface, can be observed simultaneously and similarly to a scanning image of a portion that is exposed to the specimen surface. Therefore, article dimension measurement can be ensured in connection with such a portion.

Figure 60:
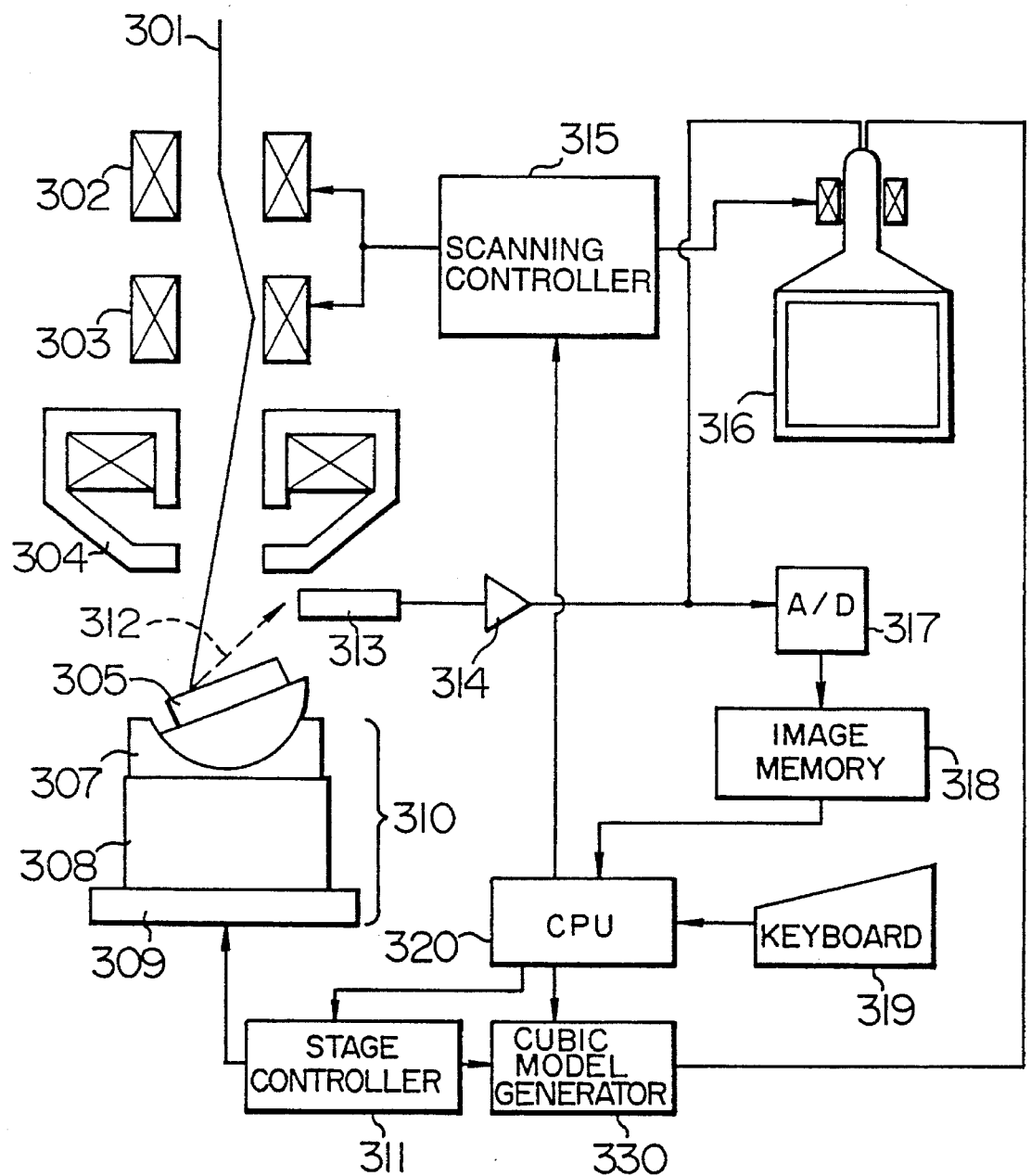
FIG. 60 is a block diagram showing the construction of an artical dimension measurement SEM for length measurement according to still another embodiment of the present invention.

FIG. 60 shows, in block form, the construction of a scanning electron microscope according to still another embodiment of the present invention. In the figure, components identical or equivalent to those of FIG. 49 are designated by identical reference numerals. The present embodiment features the additional provision of a three-dimensional model generator 330 for generation of a graphic three-dimensional model which is displayed by being superimposed on through-holes and wiring patterns displayed on the scanning image display unit 316. The present embodiment does not always require the electron beam to be a high-energy beam, but may also be applied to the conventional low acceleration SEM.

Figure 61:
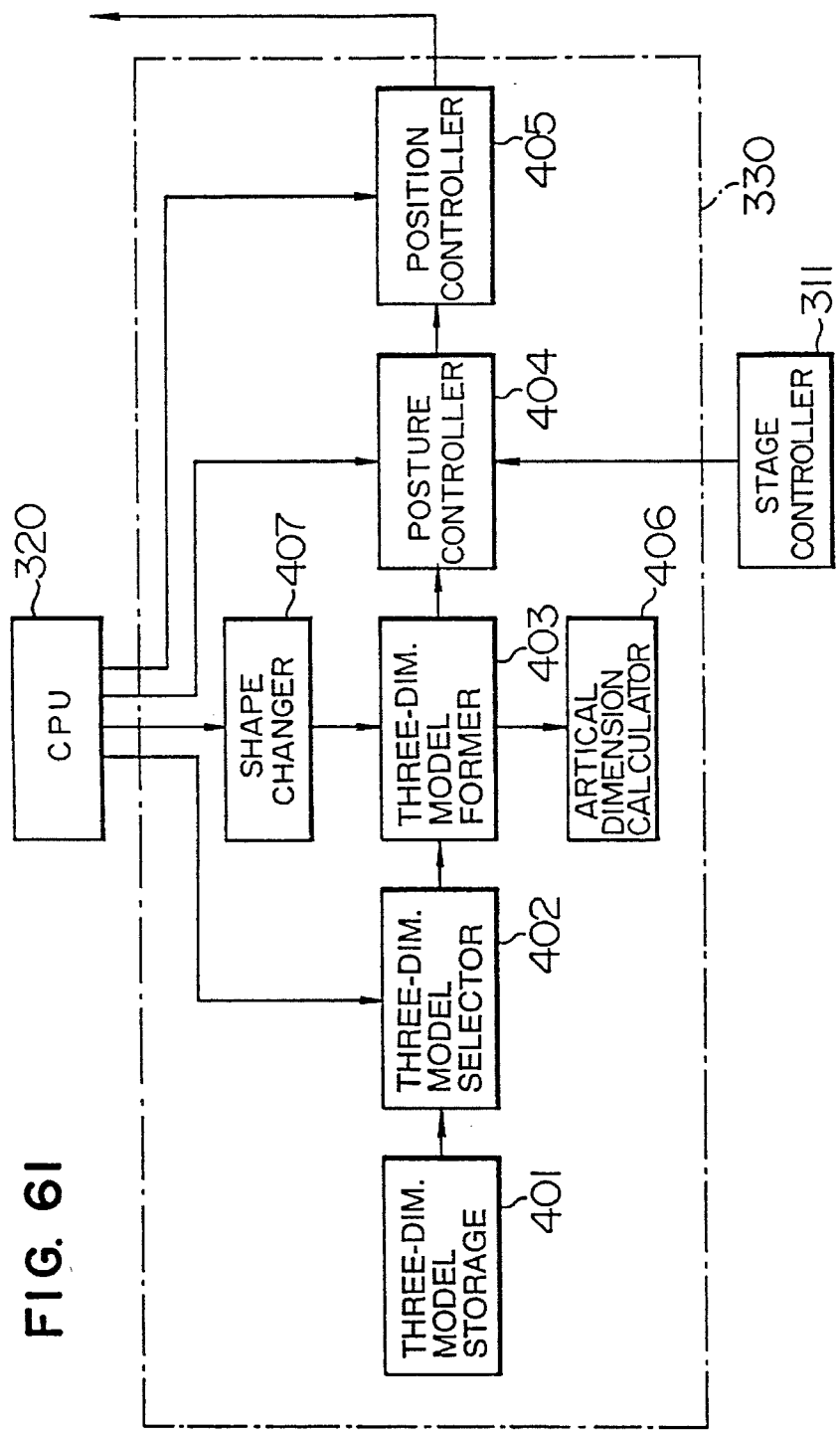
FIG. 61 is a block diagram showing details of the construction of a three-dimensional ("cubic") model generator included in the FIG. 60 SEM.

FIG. 61 is a functional block diagram showing the construction of the three-dimensional model generator 330. In the figure, the same components as those described previously are designated by like reference numerals.

Referring to FIG. 61, a three-dimensional model storage 401 stores shape data concerning a variety of three-dimensional models such as columns, prisms and rectangular parallelepipeds. A three-dimensional model selector 402 selectively reads shape data of a three-dimensional model, conforming to a command from an operator, from the three-dimensional model storage 401. A three-dimensional model former 403 forms a three-dimensional model on the basis of the shape data selected by the three-dimensional model selector 402. The thus-formed three-dimensional model undergoes various kinds of control by posture controller 404 and position controller 405 to be described later, and thereafter it is displayed on the scanning image display unit 316.

A shape changer 407 changes shape data of the three-dimensional model on the basis of a command from the operator to change the shape of the three-dimensional model being displayed. The posture controller 404 decides conditions of the specimen stage 310 (such as an inclination angle of the X inclining stage 307 and an inclination angle of the Y inclining stage 308) from a state controlled by the stage controller 311, and controls the posture of the three-dimensional model such that relative matching of the posture of the three-dimensional model delivered out of the three-dimensional model former 403 to the posture of a scanning image can be attained. The position controller 405 translates, on the screen, a display position of the three-dimensional model at which the relative posture matching to the scanning image is obtained. An article dimension calculator 406 calculates article dimensions of individual portions of the three-dimensional model on the basis of the shape of the three-dimensional model and an enlargement magnification.

Operation of the present embodiment will now be described in greater detail by considering observation and article dimension measurement of an actual pattern, for instance.

Figure 62:
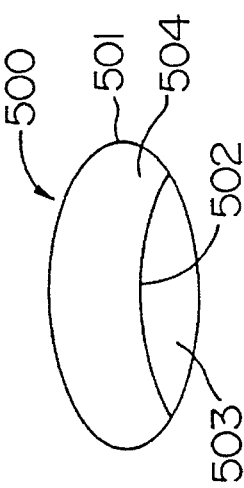
FIG. 62 is a diagram showing a scanning image, obtained using a low energy electron beam, of a contact hole having an inverted taper surface.

Depicted in FIG. 62 is a scanning image 500 obtained by observing a contact hole of an inverted taper form while inclining the specimen stage 310. As shown, only part of contour 501, side surface 504 and bottom surface 503 of an opening and only part of contour 502 of the bottom surface 503 can be observed.

Figure 63:
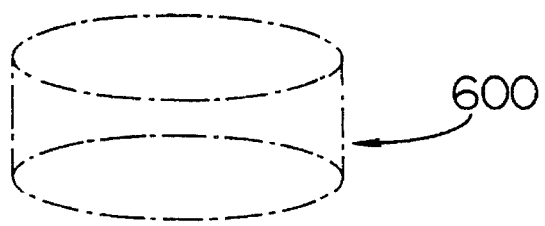
FIG. 63 is a diagram showing a three-dimensional model.

The operator manipulates the keyboard 319 to designate a column as a three-dimensional model of an object to be observed which is predicted from the scanning image, and inputs dimensions of some portions of the object if the dimensions are known. A description will be given hereinafter on the assumption that a diameter of the opening is inputted. The three-dimensional model selector 402 selectively reads shape data of the column from the three-dimensional model storage 401. The three-dimensional model former 403 forms a wire model (three-dimensional model) 600 of the column as shown in FIG. 63 on the basis of the read shape data, an enlargement magnification and the aforementioned known geometrical dimension.

Figure 64:
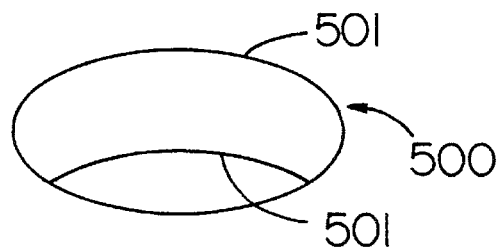
FIG. 64 shows an illustration of the three-dimensional model along with the scanning image.
Figure 65:
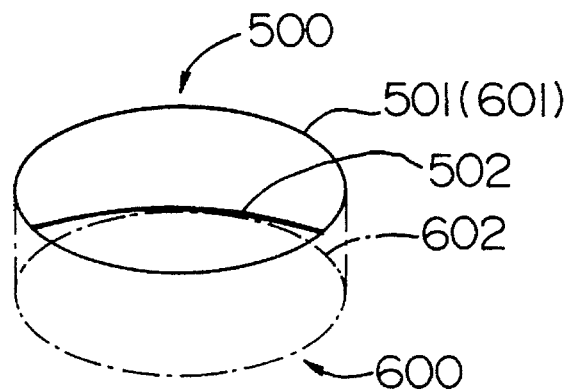
FIG. 65 shows the three-dimensional model illustration on which the scanning image is superimposed.

In order to attain the relative posture matching of the scanning image 500 to the three-dimensional model 600 on the screen, the posture controller 404 determines an inclined state of the specimen stage 310 on the basis of data from the stage controller 311 and controls the posture of the three-dimensional model 500 on the screen. FIG. 64 shows an example of display of the scanning image 500 and three-dimensional model 600 on the screen obtained after completion of posture control, indicating that the inclined state of the scanning image 500 matches the inclined state of the three-dimensional model 600.

Subsequently, the operator manipulates the keyboard 319 to move the three-dimensional model 600 so that contour 501 of the opening of the scanning image 500 may be coincidently superimposed on contour 601 of the top surface of the three-dimensional model 600. In the present embodiment, complete matching of the contour of the opening to that of the top surface can be accomplished because the diameter of the opening has been previously inputted as the known dimension, but contour 502 of the bottom surface of the scanning image 500 does not match contour 602 of the bottom surface of the three-dimensional model 600 because the contact hole has an inverted taper form and the contour 502 of the bottom surface is larger than the contour 501 of the opening.

Figure 66:
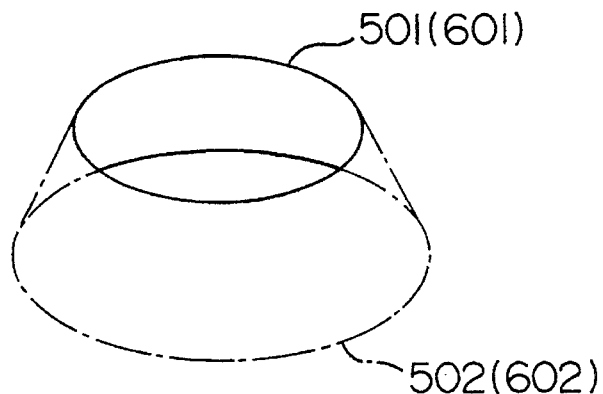
FIG. 66 shows an illustration of a three-dimensional model which is modified to match the scanning image.

Accordingly, the operator manipulates the keyboard 319 to enlarge the diameter of bottom surface of the three-dimensional model and expand or contract the height of the three-dimensional model in order that part of the contour 502 of the contact hole bottom surface matches the contour 602 of the three-dimensional model bottom surface, as shown in FIG. 66.

When the complete matching of the contour of the scanning image 500 to the contour of the three-dimensional model 600 is accomplished, the three-dimensional model 600 has the same shape as the contact hole and therefore, the geometrical dimension calculator 406 calculates geometrical dimensions of unknown portions on the basis of the shape of the three-dimensional model 600 and an enlargement magnification, and delivers results of calculation for display thereof.

Figure 67:
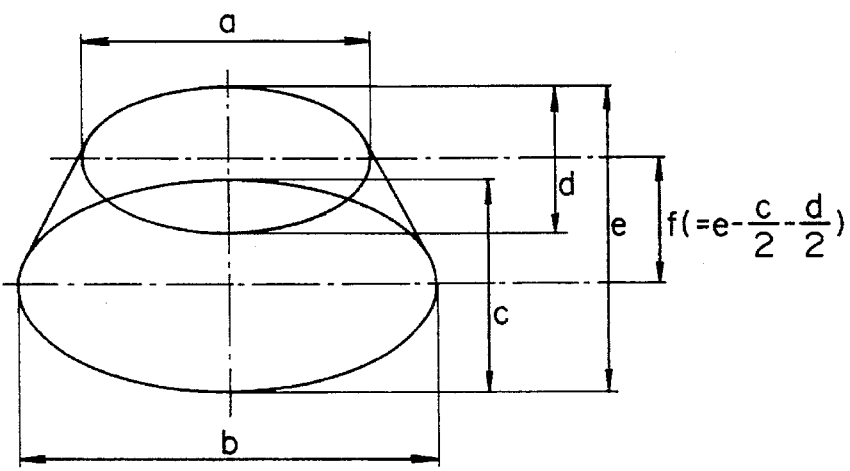
FIG. 67 is a conceptual diagram showing an article dimension measuring method using the modified three-dimensional model illustration.

FIG. 67 diagrammatically shows a method of calculating geometrical dimensions of unknown portions. When only the diameter of the opening is known as in the case of the present embodiment, geometrical dimensions of lengths of other portions can be calculated as will be described below.

More specifically, the diameter of the bottom surface can be determined by directly measuring the diameter of the bottom surface of the three-dimensional model. When lengths of portions c, d and e are measured with the three-dimensional model inclined as shown in the figure, a geometrical dimension f can be calculated from equation (1) as follows.

$$f = e - (c/2) - (d/2) \qquad (1).$$

Figure 68:
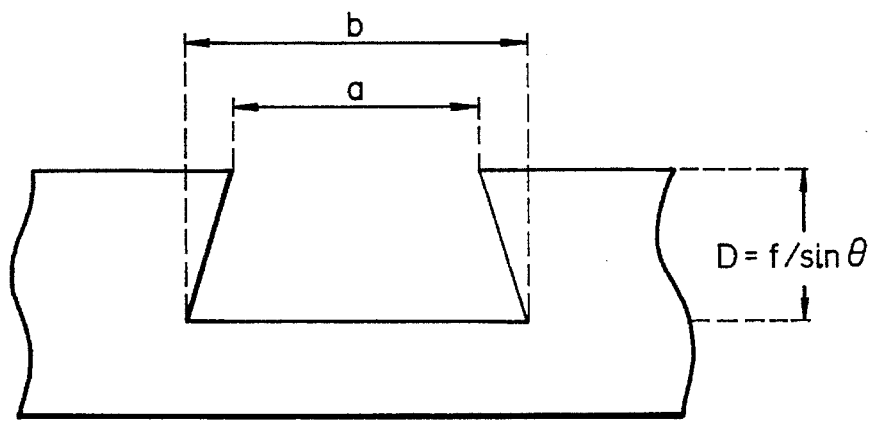
FIG. 68 is a conceptual diagram similar to FIG. 67.

As shown in FIG. 68, when the inclination angle of the specimen is θ, a depth D of the contact hole can be calculated from equation (2) as follows:

$$\text{depth } D = f / \sin\theta \qquad (2).$$

The foregoing embodiment has been described wherein the known diameter of the contact hole opening is inputted initially and the three-dimensional mode sized to conform to the input value is displayed initially, but a three-dimensional model may be displayed by designating only a shape and then may be modified in size, including size modification of the top surface, so as to match a scanning image. The object to which the length-measuring method described so far is applied is not limited to the three-dimensional model, but may also be a scanning image obtained in the foregoing embodiment.

According to the present embodiment, even when only part of a contour of an object is allowed to be observed, the whole contour can be predicted by utilizing a three-dimensional model, and the shape of the object to be observed can be represented by the shape of the three-dimensional model. Therefore, by measuring geometrical dimensions of the three-dimensional model, lengths of portions not that are not to the specimen surface can be measured.

Although the present invention has been described in detail, it should be understood that various changes, substitutions and alterations can be made hereto without departing from the spirit and scope of the present invention as defined by the appended claims.

We claim:

1. A scanning electron microscope, comprising:

means for irradiating a primary electron beam which can transmit through part of a specimen to reach a portion of the specimen that is not directly exposed to the electron beam, said primary electron beam having energy sufficient to produce reflection electrons reflected from within a depression in the object that penetrate through the object so as to escape from the surface of the object or that generate secondary electrons in the surface of the object while penetrating through the object;

means for detecting a signal secondarily generated from the specimen irradiated with the electron beam;

means for generating a scanning image of the specimen on the basis of said secondary signal; and means for performing measurement of a dimension of a specimen article between dimension-measuring start and end points on the basis of said scanning image.

2. A scanning electron microscope according to claim 1, wherein said electron beam has an energy level capable of permitting said electron beam to reach a specimen portion which is exposed at the surface of said specimen but is visually blocked by another specimen portion when viewed in a direction of irradiation of said electron beam.

3. A scanning electron microscope according to claim 1, wherein said electron beam has an energy level capable of permitting said electron beam to reach a specimen portion which underlies another specimen portion and is not directly exposed at the surface of said specimen.

4. A scanning electron microscope, comprising:

a specimen stage for supporting and universally displacing a specimen;

means for generating a three-dimensional model conforming to a predicted shape of an object to be observed;

means for generating a scanning image;

means for displaying both of said three-dimensional model and said scanning image;

means for modifying the shape of said three-dimensional model so that said three-dimensional model matches said scanning image; and means for measuring article dimensions of a modified three-dimensional model of modified shape, wherein a dimension between length-measuring start and end points is represented by the dimension of said three-dimensional model which matches said scanning image.

5. A scanning electron microscope according to claim 4, further comprising means, responsive to a displacement of said specimen caused by said specimen stage, for controlling the posture of the three-dimensional model such that relative matching of the posture of the scanning image to that of the three-dimensional model is accomplished.

6. A scanning electron microscope according to claim 4, wherein said three-dimensional model generating means includes:

means for storing a plurality of kinds of three-dimensional models; and means responsive to a command from the operator to selectively read a three-dimensional model from said storing means and deliver the read-out three-dimensional model.

7. A scanning electron microscope according to claim 4, wherein said three-dimensional model is any one of a column, a circular cone, a prism, and a pyramid, which are raised from or depressed into the specimen.

8. A scanning electron microscope according to claim 4, further comprising means for inputting known dimensions of an object to be observed, whereby the size of the three-dimensional model on the screen is set on the basis of inputted known dimensions of individual portions and a magnification for observation.

9. An apparatus for forming an image of a specimen, comprising:

means for irradiating a charged particle beam on said specimen, said charged particle beam having energy sufficient to produce reflection electrons reflected from within a depression in the object that penetrate through the object so as to escape from the surface of the object or that generate secondary electrons in the surface of the object while penetrating through the object;

means for detecting a first secondary electron beam caused by irradiation of said charged particle beam onto a first part of said specimen, and a second secondary electron beam caused by the irradiation of said charged particle beam onto a second part of said specimen, wherein said first and second parts are respectively exposed and not exposed to the charged particle beam when viewed in the irradiating direction of the charged particle beam; and means for discriminating the first and second parts of the specimen, and for displaying a specimen image including said discriminated first and second parts.

10. An apparatus according to claim 9, wherein said discriminating and displaying means discriminates and displays said specimen image such that brightness at said first part is different from that at said second part.

11. An apparatus according to claim 9, wherein said charged particle beam is a scanning electron beam.

12. An apparatus according to claim 11, further comprising:

means for setting an area subject to dimension measurement on said specimen image; and means for measuring a dimension of said area.

13. An apparatus according to claim 11, further comprising means for setting first and second cursor lines on said specimen image.

14. An apparatus according to claim 13, further comprising means for measuring a distance between said first and second cursor lines.

15. A method of measuring a dimension of a desired portion of a specimen, comprising the steps of:

irradiating a primary electron beam which can pass through part of said specimen and can reach a portion not directly exposed to the electron beam, said primary electron beam having energy sufficient to produce reflection electrons reflected from within a depression in the object that penetrate through the object so as to escape from the surface of the object or that generate secondary electrons in the surface of the object while penetrating through the object;

detecting a signal secondarily generated from said portion irradiated with the electron beam;

generating a scanning image of a dimension-measuring object based on said secondary signal; and performing measurement of an article dimension between dimension-measuring start and end points based on said scanning image.

16. A method according to claim 15, wherein said electron beam has an energy level capable of permitting said electron beam to reach a portion which is exposed at the surface of said specimen but is visually blocked by another portion when viewed in a direction of irradiation of said electron beam.

17. A method according to claim 15, wherein said electron beam has an energy level capable of permitting said electron beam to reach a portion which underlies another portion and is not exposed at the surface of said specimen.

18. A method of measuring a dimension of a desired portion of a specimen, comprising the steps of:

generating a three-dimensional model conforming to a predicted shape of an object to be observed;

generating a scanning image;

displaying both of said three-dimensional model and said scanning image;

modifying said three-dimensional model so that the shape of said three-dimensional model matches said scanning image; and measuring a dimension of a modified three-dimensional model of modified shape, wherein a dimension between dimension-measuring start and end points is represented by the dimension of said three-dimensional model which matches said scanning image.

19. A method according to claim 18, further comprising the step of controlling the posture of the three-dimensional model in response to a displacement of said specimen caused by a specimen stage such that relative matching of the posture of the scanning image to that of the three-dimensional model is accomplished.

20. A method according to claim 18, further comprising the step of inputting known dimensions of an object to be observed, whereby the size of the three-dimensional model on the screen is set on the basis of inputted known dimensions of individual portions and a magnification for observation.

* * * * *